(12) United States Patent
Lee et al.

(10) Patent No.: US 11,756,984 B2
(45) Date of Patent: Sep. 12, 2023

(54) LIGHT EMITTING STACKED STRUCTURE AND DISPLAY DEVICE HAVING THE SAME

(71) Applicant: SEOUL VIOSYS CO., LTD., Ansan-si (KR)

(72) Inventors: Chung Hoon Lee, Ansan-si (KR); Jong Hyeon Chae, Ansan-si (KR); Seong Gyu Jang, Ansan-si (KR); Ho Joon Lee, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 17/847,105

(22) Filed: Jun. 22, 2022

(65) Prior Publication Data

US 2022/0399399 A1 Dec. 15, 2022

Related U.S. Application Data

(63) Continuation of application No. 16/228,621, filed on Dec. 20, 2018, now Pat. No. 11,522,006.
(Continued)

(51) Int. Cl.
*H01L 27/15* (2006.01)
*G09G 3/32* (2016.01)
(Continued)

(52) U.S. Cl.
CPC ......... *H01L 27/156* (2013.01); *G09G 3/2003* (2013.01); *G09G 3/32* (2013.01);
(Continued)

(58) Field of Classification Search
CPC ..... H01L 27/156; H01L 33/30; H01L 33/405; H01L 33/504; G09G 3/2003; G09G 3/32
See application file for complete search history.

(56) References Cited

U.S. PATENT DOCUMENTS

| 5,583,349 A | 12/1996 | Norman et al. |
| 5,583,350 A | 12/1996 | Norman et al. |

(Continued)

FOREIGN PATENT DOCUMENTS

| CN | 1423345 | 6/2003 |
| CN | 102593290 | 7/2012 |

(Continued)

OTHER PUBLICATIONS

Substantive Examination Report Notice dated Dec. 23, 2022, in Saudi Arabian Patent Application No. 520412285.
(Continued)

*Primary Examiner* — Christine A Enad
(74) *Attorney, Agent, or Firm* — H.C. Park & Associates, PLC

(57) ABSTRACT

A display device including a substrate, a light emitting stacked structure disposed on the substrate and including a plurality of epitaxial sub-units disposed one over another, a first adhesive layer bonding the epitaxial sub-units to the substrate; and a line part disposed on the substrate and configured to apply a light emitting signal to each of the epitaxial sub-units, in which the light emitting stacked structure is configured to provide light having various colors by a combination of light emitted from each of the epitaxial sub-units, the first adhesive layer includes a conductive and non-transparent material, and the substrate includes a non-transparent material.

17 Claims, 37 Drawing Sheets

Related U.S. Application Data

(60) Provisional application No. 62/618,573, filed on Jan. 17, 2018, provisional application No. 62/609,186, filed on Dec. 21, 2017.

(51) Int. Cl.

| | | |
|---|---|---|
| *G09G 3/20* | (2006.01) | |
| *H01L 33/50* | (2010.01) | |
| *H01L 33/40* | (2010.01) | |
| *H01L 33/30* | (2010.01) | |
| *H01L 25/075* | (2006.01) | |
| *H01L 25/16* | (2023.01) | |

(52) U.S. Cl.
CPC .......... *H01L 25/0756* (2013.01); *H01L 33/30* (2013.01); *H01L 33/405* (2013.01); *H01L 33/504* (2013.01); *G09G 2300/0452* (2013.01); *G09G 2310/0267* (2013.01); *G09G 2310/08* (2013.01); *H01L 25/167* (2013.01)

(56) References Cited

U.S. PATENT DOCUMENTS

| | | | |
|---|---|---|---|
| 5,696,389 A | 12/1997 | Ishikawa et al. | |
| 5,703,436 A | 12/1997 | Forrest et al. | |
| 5,707,745 A | 1/1998 | Forrest et al. | |
| 5,739,552 A | 4/1998 | Kimura et al. | |
| 6,046,543 A | 4/2000 | Bulovic et al. | |
| 6,100,103 A | 8/2000 | Shim et al. | |
| 6,365,270 B2 | 4/2002 | Forrest et al. | |
| 6,717,358 B1 | 4/2004 | Liao et al. | |
| 6,888,305 B2 | 5/2005 | Weaver | |
| 6,934,309 B2 | 8/2005 | Nishikawa et al. | |
| 7,282,741 B2 | 10/2007 | Kim et al. | |
| 7,514,720 B2 | 4/2009 | Kim et al. | |
| 7,570,310 B2 | 8/2009 | Harada et al. | |
| 7,732,803 B2 | 6/2010 | Shum et al. | |
| 7,745,986 B2 | 6/2010 | Ito et al. | |
| 7,982,228 B2 | 7/2011 | Choi et al. | |
| 8,017,955 B2 | 9/2011 | Wang et al. | |
| 8,022,421 B2 | 9/2011 | Hsueh et al. | |
| 8,035,115 B2 | 10/2011 | Ogihara et al. | |
| 8,058,663 B2 | 11/2011 | Fan et al. | |
| 8,089,074 B2 | 1/2012 | Kim et al. | |
| 8,283,191 B2 | 10/2012 | Rode et al. | |
| 8,324,803 B2 | 12/2012 | Forrest et al. | |
| 8,390,020 B2 | 3/2013 | Tanaka et al. | |
| 8,436,346 B2 | 5/2013 | Ushikubo et al. | |
| 8,466,542 B2 | 6/2013 | Kriman et al. | |
| 8,546,836 B2 | 10/2013 | Kamiya et al. | |
| 8,563,144 B2 | 10/2013 | Kim et al. | |
| 8,618,551 B2 | 12/2013 | Nishikawa et al. | |
| 8,624,274 B2 | 1/2014 | Hsueh et al. | |
| 8,766,295 B2 | 7/2014 | Kim | |
| 8,835,948 B2 | 9/2014 | Chang et al. | |
| 8,884,316 B2 | 11/2014 | Weaver et al. | |
| 8,941,566 B2 | 1/2015 | Haase | |
| 9,006,752 B2 | 4/2015 | So et al. | |
| 9,018,834 B2 | 4/2015 | Ide et al. | |
| 9,052,096 B2 | 6/2015 | Nishimura et al. | |
| 9,076,929 B2 | 7/2015 | Katsuno et al. | |
| 9,099,631 B2 | 8/2015 | Yang et al. | |
| 9,136,498 B2 | 9/2015 | Skipor | |
| 9,142,748 B2 | 9/2015 | Ohmae et al. | |
| 9,153,750 B2 | 10/2015 | Seo et al. | |
| 9,202,994 B2 | 12/2015 | Hashimoto et al. | |
| 9,252,380 B2 | 2/2016 | Seo et al. | |
| 9,281,446 B2 | 3/2016 | Suh et al. | |
| 9,312,249 B2 | 4/2016 | Choi et al. | |
| 9,318,651 B2 | 4/2016 | Avramescu et al. | |
| 9,337,400 B2 | 5/2016 | Hashimoto et al. | |
| 9,362,335 B2 | 6/2016 | Von Malm | |
| 9,379,286 B2 | 6/2016 | Gaertner et al. | |
| 9,406,908 B2 | 8/2016 | Kim et al. | |
| 9,419,031 B1 | 8/2016 | Or-Bach et al. | |
| 9,443,833 B2 | 9/2016 | Oraw | |
| 9,515,278 B2 | 12/2016 | Suzuki et al. | |
| 9,559,263 B2 | 1/2017 | Matsui et al. | |
| 9,577,012 B2 | 2/2017 | Ooki et al. | |
| 9,748,313 B2 | 8/2017 | Tsuji et al. | |
| 9,786,817 B2 | 10/2017 | Kim et al. | |
| 9,786,859 B2 | 10/2017 | Yamae et al. | |
| 9,847,051 B2 | 12/2017 | Choi et al. | |
| 9,853,187 B2 | 12/2017 | Kim | |
| 9,893,233 B2 | 2/2018 | Kong et al. | |
| 9,905,725 B2 | 2/2018 | Lee | |
| 9,960,212 B2 | 5/2018 | Gee et al. | |
| 9,960,390 B2 | 5/2018 | Höfle et al. | |
| 9,966,369 B2 | 5/2018 | Kim et al. | |
| 10,056,535 B2 | 8/2018 | Chang et al. | |
| 10,069,036 B2 | 9/2018 | Atanackovic | |
| 10,079,265 B1* | 9/2018 | Wu | H01L 25/0753 |
| 10,134,813 B2 | 11/2018 | Choi | |
| 10,170,666 B2 | 1/2019 | Cha et al. | |
| 10,205,058 B2 | 2/2019 | Lee | |
| 10,304,811 B2 | 5/2019 | Zhang et al. | |
| 10,326,056 B2 | 6/2019 | Jung et al. | |
| 10,381,519 B2 | 8/2019 | Seo et al. | |
| 10,388,978 B2 | 8/2019 | Morris-Cohen et al. | |
| 10,418,577 B2 | 9/2019 | Yoo et al. | |
| 10,475,957 B2 | 11/2019 | Cha et al. | |
| 10,515,580 B2 | 12/2019 | Henry et al. | |
| 10,559,557 B2 | 2/2020 | Chang et al. | |
| 10,586,896 B2 | 3/2020 | Shioji | |
| 10,686,099 B2 | 6/2020 | Huppmann et al. | |
| 10,686,149 B2 | 6/2020 | Park et al. | |
| 10,811,475 B2 | 10/2020 | Zhang et al. | |
| 2002/0154259 A1 | 10/2002 | Freidhoff et al. | |
| 2003/0047742 A1 | 3/2003 | Hen | |
| 2003/0168989 A1 | 9/2003 | Hen | |
| 2003/0213967 A1 | 11/2003 | Forrest et al. | |
| 2004/0232433 A1 | 11/2004 | Doverspike et al. | |
| 2005/0062049 A1 | 3/2005 | Lin et al. | |
| 2005/0067627 A1 | 3/2005 | Shen et al. | |
| 2005/0140278 A1 | 6/2005 | Kato | |
| 2005/0264550 A1 | 12/2005 | Ohshima et al. | |
| 2006/0027820 A1 | 2/2006 | Cao | |
| 2006/0231852 A1 | 10/2006 | Kususe et al. | |
| 2006/0255343 A1* | 11/2006 | Ogihara | B41J 2/45 |
| | | | 257/E25.02 |
| 2006/0258026 A1 | 11/2006 | Miyachi et al. | |
| 2007/0069220 A1 | 3/2007 | Ogihara | |
| 2007/0170444 A1 | 7/2007 | Cao | |
| 2007/0222922 A1 | 9/2007 | Jin et al. | |
| 2008/0068315 A1 | 3/2008 | Kurosaki et al. | |
| 2008/0099770 A1 | 5/2008 | Mendendorp et al. | |
| 2008/0128728 A1 | 6/2008 | Nemchuk et al. | |
| 2008/0130278 A1 | 6/2008 | Ushikubo et al. | |
| 2008/0211416 A1 | 9/2008 | Negley et al. | |
| 2008/0251799 A1 | 10/2008 | Ikezawa | |
| 2008/0308819 A1 | 12/2008 | Louwsma et al. | |
| 2009/0009101 A1 | 1/2009 | Kang et al. | |
| 2009/0078955 A1 | 3/2009 | Fan et al. | |
| 2009/0114931 A1 | 5/2009 | Hsueh et al. | |
| 2009/0272989 A1 | 11/2009 | Shum et al. | |
| 2010/0032691 A1 | 2/2010 | Kim | |
| 2010/0045175 A1 | 2/2010 | Mathai et al. | |
| 2010/0051975 A1 | 3/2010 | Suzuki et al. | |
| 2010/0065867 A1 | 3/2010 | Unno | |
| 2010/0066239 A1 | 3/2010 | Spindler et al. | |
| 2010/0076527 A1 | 3/2010 | Hammond et al. | |
| 2010/0084668 A1 | 4/2010 | Choi et al. | |
| 2010/0144073 A1 | 6/2010 | Louwsma et al. | |
| 2010/0155711 A1* | 6/2010 | Hasegawa | H10K 50/852 |
| | | | 257/40 |
| 2010/0159792 A1 | 6/2010 | Visser et al. | |
| 2010/0224860 A1 | 9/2010 | Ibbetson et al. | |
| 2010/0276706 A1 | 11/2010 | Herrmann | |
| 2011/0037092 A1* | 2/2011 | Hori | H01L 33/405 |
| | | | 257/98 |
| 2011/0057211 A1 | 3/2011 | Lee et al. | |
| 2011/0086486 A1 | 4/2011 | Lee et al. | |
| 2011/0156114 A1 | 6/2011 | Park et al. | |

(56) References Cited

U.S. PATENT DOCUMENTS

| | | |
|---|---|---|
| 2011/0204376 A1 | 8/2011 | Su et al. |
| 2011/0215714 A1 | 9/2011 | Seo et al. |
| 2012/0034714 A1 | 2/2012 | Tsai et al. |
| 2012/0094414 A1 | 4/2012 | Or-Bach et al. |
| 2012/0124903 A1 | 5/2012 | Takeuchi |
| 2012/0223875 A1 | 9/2012 | Lau et al. |
| 2012/0231572 A1 | 9/2012 | Or-Bach et al. |
| 2012/0236532 A1 | 9/2012 | Koo et al. |
| 2012/0305959 A1 | 12/2012 | Yu et al. |
| 2013/0009543 A1 | 1/2013 | Kadoma et al. |
| 2013/0056717 A1 | 3/2013 | Ishihara et al. |
| 2013/0056785 A1 | 3/2013 | Hwang |
| 2013/0069191 A1 | 3/2013 | Or-Bach et al. |
| 2013/0264587 A1 | 10/2013 | Chang |
| 2013/0285076 A1 | 10/2013 | Liu et al. |
| 2013/0292711 A1 | 11/2013 | Ogihara et al. |
| 2014/0184062 A1 | 7/2014 | Kolodin |
| 2014/0191243 A1* | 7/2014 | Singh .............. H01L 33/10 257/76 |
| 2014/0252382 A1 | 9/2014 | Hashimoto et al. |
| 2014/0284633 A1 | 9/2014 | Tsay et al. |
| 2015/0001572 A1 | 1/2015 | Katsuno et al. |
| 2015/0099728 A1 | 4/2015 | Frank et al. |
| 2015/0221627 A1 | 8/2015 | Nielson et al. |
| 2015/0325555 A1 | 11/2015 | Hashimoto et al. |
| 2015/0340348 A1 | 11/2015 | Katsuno et al. |
| 2015/0362165 A1 | 12/2015 | Chu et al. |
| 2016/0005375 A1 | 1/2016 | Naijo et al. |
| 2016/0043290 A1 | 2/2016 | Sogo et al. |
| 2016/0064439 A1 | 3/2016 | Or-Bach et al. |
| 2016/0099384 A1 | 4/2016 | Kim et al. |
| 2016/0155378 A1 | 6/2016 | Hack et al. |
| 2016/0155892 A1 | 6/2016 | Li et al. |
| 2016/0163940 A1 | 6/2016 | Huang et al. |
| 2016/0172421 A1* | 6/2016 | Ando ............... H10K 59/122 438/34 |
| 2016/0315068 A1 | 10/2016 | Lee et al. |
| 2016/0322293 A1 | 11/2016 | Kimura et al. |
| 2016/0336482 A1 | 11/2016 | Lu et al. |
| 2016/0359143 A1 | 12/2016 | Osawa et al. |
| 2017/0010435 A1 | 1/2017 | Huo et al. |
| 2017/0012173 A1 | 1/2017 | Lee et al. |
| 2017/0025593 A1 | 1/2017 | Bower et al. |
| 2017/0062680 A1 | 3/2017 | Yoo et al. |
| 2017/0064785 A1 | 3/2017 | Kim et al. |
| 2017/0069612 A1 | 3/2017 | Zhang et al. |
| 2017/0084876 A1 | 3/2017 | Suzuki |
| 2017/0104035 A1 | 4/2017 | Lee et al. |
| 2017/0117259 A1 | 4/2017 | Xu |
| 2017/0133357 A1 | 5/2017 | Kuo et al. |
| 2017/0162746 A1 | 6/2017 | Cha et al. |
| 2017/0194298 A1 | 7/2017 | Negley et al. |
| 2017/0194535 A1 | 7/2017 | Park et al. |
| 2017/0213502 A1 | 7/2017 | Henry et al. |
| 2017/0236866 A1 | 8/2017 | Lee et al. |
| 2017/0250329 A1 | 8/2017 | Takeya et al. |
| 2017/0286044 A1 | 10/2017 | Kim et al. |
| 2017/0288088 A1 | 10/2017 | Won Cheol |
| 2017/0331009 A1 | 11/2017 | Shioji |
| 2017/0331021 A1 | 11/2017 | Chae et al. |
| 2017/0338275 A1 | 11/2017 | Banna et al. |
| 2017/0345801 A1 | 11/2017 | Lin et al. |
| 2018/0040665 A1 | 2/2018 | Ohmae et al. |
| 2018/0083170 A1 | 3/2018 | Shepherd |
| 2018/0151548 A1 | 5/2018 | Pfeuffer et al. |
| 2018/0156965 A1 | 6/2018 | El-Ghoroury et al. |
| 2018/0158808 A1 | 6/2018 | Zhang et al. |
| 2018/0166499 A1 | 6/2018 | Pfeuffer et al. |
| 2018/0233492 A1 | 8/2018 | Liu et al. |
| 2018/0240952 A1 | 8/2018 | Moon et al. |
| 2018/0283642 A1 | 10/2018 | Liao et al. |
| 2019/0053347 A1 | 2/2019 | Lee et al. |
| 2019/0074324 A1 | 3/2019 | Kim et al. |
| 2019/0097088 A1 | 3/2019 | Huppmann et al. |
| 2019/0148612 A1 | 5/2019 | Lee et al. |
| 2019/0165207 A1 | 5/2019 | Kim et al. |
| 2019/0181181 A1 | 6/2019 | Yeon et al. |
| 2019/0229149 A1 | 7/2019 | Yoo |
| 2019/0267436 A1 | 8/2019 | Zhang et al. |
| 2019/0333964 A1 | 10/2019 | Lee et al. |
| 2020/0063920 A1 | 2/2020 | Vampola |
| 2020/0212017 A1 | 7/2020 | Oh et al. |
| 2020/0212262 A1 | 7/2020 | Jang et al. |
| 2020/0219858 A1 | 7/2020 | Chang |

FOREIGN PATENT DOCUMENTS

| | | |
|---|---|---|
| CN | 102593303 | 7/2012 |
| CN | 105789237 | 7/2016 |
| CN | 106848043 | 6/2017 |
| CN | 107342352 | 5/2019 |
| EP | 1482566 | 12/2004 |
| EP | 3122158 | 1/2017 |
| FR | 2964498 | 3/2012 |
| JP | 01-231380 | 9/1989 |
| JP | H0613655 | 1/1994 |
| JP | 07-254732 | 10/1995 |
| JP | 08-088407 | 4/1996 |
| JP | 08-213657 | 8/1996 |
| JP | 08-274376 | 10/1996 |
| JP | 9-148628 | 6/1997 |
| JP | 2001-273979 | 10/2001 |
| JP | 2003-197968 | 7/2003 |
| JP | 2005-019874 | 1/2005 |
| JP | 2005072323 | 3/2005 |
| JP | 2006-245524 | 9/2006 |
| JP | 2006-319099 | 11/2006 |
| JP | 2006-339551 | 12/2006 |
| JP | 2006-339646 | 12/2006 |
| JP | 2007-057667 | 3/2007 |
| JP | 2008-263127 | 10/2008 |
| JP | 2009-302201 | 12/2009 |
| JP | 2010-525555 | 7/2010 |
| JP | 2011-151346 | 8/2011 |
| JP | 2011-159671 | 8/2011 |
| JP | 2012-504856 | 2/2012 |
| JP | 2012-195529 | 10/2012 |
| JP | 2012-209264 | 10/2012 |
| JP | 2012-253046 | 12/2012 |
| JP | 2013-229218 | 11/2013 |
| JP | 2014-175427 | 9/2014 |
| JP | 2014-187366 | 10/2014 |
| JP | 2015-012244 | 1/2015 |
| JP | 2015-501085 | 1/2015 |
| JP | 2016-039361 | 3/2016 |
| JP | 2017-011202 | 1/2017 |
| JP | 2017-513234 | 5/2017 |
| JP | 2017-529557 | 10/2017 |
| JP | 2017-204571 | 11/2017 |
| JP | 2019-509636 | 4/2019 |
| KR | 10-2006-0095690 | 9/2006 |
| KR | 10-2007-0089172 | 8/2007 |
| KR | 10-2008-0054626 | 6/2008 |
| KR | 10-2009-0119209 | 11/2009 |
| KR | 10-2010-0016901 | 2/2010 |
| KR | 10-2011-0118187 | 10/2011 |
| KR | 10-2012-0040011 | 4/2012 |
| KR | 10-1452801 | 10/2014 |
| KR | 10-2017-0050334 | 5/2017 |
| KR | 10-2017-0115142 | 10/2017 |
| WO | 2015073286 | 5/2015 |
| WO | 2016152321 | 9/2016 |
| WO | 2017074095 | 5/2017 |
| WO | 2017153123 | 9/2017 |

OTHER PUBLICATIONS

Non-Final Office Action dated Jan. 30, 2023, in U.S. Appl. No. 17/826,127.
Office Action dated Aug. 30, 2022 for Japanese Patent Application No. 2020-529553(with English Translation).
Office Action dated Aug. 30, 2022 for Japanese Patent Application No. 2020-534346(with English Translation).

(56) References Cited

OTHER PUBLICATIONS

Office Action dated Aug. 30, 2022 for Japanese Patent Application No. 2020-532579(with English Translation).
Substantive Examination Report Notice dated Aug. 29, 2022, in Saudi Arabian Patent Application No. 520412047.
Notice of Allowance issued in U.S. Appl. No. 16/198,850 dated Sep. 8, 2022.
Substantive Examination Report Notice dated Aug. 28, 2022, in Saudi Arabian Patent Application No. 520412187.
Takatoshi Tsujimura et al., Development of a color-tunable polychromatic organic-light-emitting-diode device for roll-to-roll manufacturing, Apr. 14, 2016, pp. 262-269, Journal of the SID.
Office Action dated Sep. 20, 2022 for Japanese Patent Application No. 2020-528905(with English Translation).
Office Action dated Sep. 20, 2022 for Japanese Patent Application No. 2020-528919(with English Translation).
Notice of Allowance issued in U.S. Appl. No. 17/164,829 dated Sep. 26, 2022.
Notice of Allowance issued in U.S. Appl. No. 16/915,384 dated Nov. 8, 2022.
Notice of Allowance issued in U.S. Appl. No. 17/366,420 dated Nov. 21, 2022.
Office Action dated Nov. 22, 2022 for Japanese Patent Application No. 2020-526484(with English Translation).
Notice of Allowance issued in U.S. Appl. No. 16/988,272 dated Nov. 25, 2022.
Substantive Examination Report Notice dated Jun. 15, 2022, in Saudi Arabian Patent Application No. 520412046.
Notice of Allowance issued in U.S. Appl. No. 16/673,184 dated Jun. 23, 2022.
Office Action dated Jul. 5, 2022 for Japanese Patent Application No. 2020-536804(with English Translation).
Office Action dated Jul. 19, 2022 for Japanese Patent Application No. 2020-528916(with English Translation).
Notice of Allowance issued in U.S. Appl. No. 16/673,114 dated Jul. 27, 2022.
Office Action dated Aug. 2, 2022 for Japanese Patent Application No. 2020-529153(with English Translation).
Office Action dated Aug. 2, 2022 for Japanese Patent Application No. 2020-527964(with English Translation).
Notice of Allowance issued in U.S. Appl. No. 16/198,873 dated Aug. 9, 2022.
Notice of Allowance issued in U.S. Appl. No. 16/228,601 dated Aug. 9, 2022.
Non-Final Office Action dated Aug. 23, 2022, in U.S. Appl. No. 16/200,036.
International Search Report dated Feb. 26, 2019, issued in International Application No. PCT/KR2018/014671.
Written Opinion of the International Searching Authority dated Feb. 26, 2019, issued in International Application No. PCT/KR2018/014671.
International Search Report dated Feb. 26, 2019, issued in International Application No. PCT/KR2018/014674.
Written Opinion of the International Searching Authority dated Feb. 26, 2019, issued in International Application No. PCT/KR2018/014674.
International Search Report dated Mar. 6, 2019, issued in International Application No. PCT/KR2018/014728.
Written Opinion of the International Searching Authority dated Mar. 6, 2019, issued in International Application No. PCT/KR2018/014728.
International Searching Report dated Mar. 6, 2019, issued in International Application No. PCT/KR2018/014734.
Written Opinion of the International Searching Authority dated Mar. 6, 2019, issued in International Application No. PCT/KR2018/014734.
International Search Report dated Mar. 6, 2019, issued in International Application No. PCT/KR2018/014672.
Written Opinion of the International Searching Authority dated Mar. 6, 2019, issued in International Application No. PCT/KR2018/014672.
International Search Report dated Apr. 3, 2019, issued in International Application No. PCT/KR2018/015268.
Written Opinion of the International Searching Authority dated Apr. 3, 2019, issued in International Application No. PCT/KR2018/015268.
Takatoshi Tsujimura et al. Development of a color-tunable polychromatic organic-light-emitting-diode device for roll-to-roll manufacturing. Journal of the Society for Information Display, vol. 24, issue 4, Apr. 14, 2016, pp. 262-269.
Jaeyi Chun et al. Vertically Stacked Color Tunable Light-Emitting Diodes Fabricated Using Wafer Bonding and Transfer Printing. ACS Applied Materials & Interfaces 2014, vol. 6, issue 22, Nov. 3, 2014, pp. 19482-19487.
International Search Report dated Apr. 3, 2019, issued in International Application No. PCT/KR2018/015888.
Written Opinion of the International Searching Authority dated Apr. 3, 2019, issued in International Application No. PCT/KR2018/015888.
International Search Report dated Apr. 3, 2019, issued in International Application No. PCT/KR2018/016482.
Written Opinion of the International Searching Authority dated Apr. 3, 2019, issued in International Application No. PCT/KR2018/016482.
International Search Report dated Apr. 4, 2019, issued in International Application No. PCT/KR2019/000014.
Written Opinion of the International Searching Authority dated Apr. 4, 2019, issued in International Application No. PCT/KR2019/000014.
International Search Report dated Apr. 18, 2019, issued in International Application No. PCT/KR2019/000062.
Written opinion of the International Searching Authority dated Apr. 18, 2019, issued in International Application No. PCT/KR2019/000062.
International Search Report dated Apr. 9, 2019, issued in International Application No. PCT/KR2018/016474.
Written opinion of the International Searching Authority dated Apr. 9, 2019, issued in International Application No. PCT/KR2018/016474.
International Search Report dated Apr. 11, 2019, issued in International Application No. PCT/KR2018/016170.
Written opinion of the International Searching Authority dated Apr. 11, 2019, issued in International Application No. PCT/KR2018/016170.
Notice of Allowance dated Nov. 7, 2019, in U.S. Appl. No. 16/207,881.
Non-Final Office Action dated Nov. 4, 2019, in U.S. Appl. No. 16/198,784.
Non-Final Office Action dated Nov. 19, 2019, in U.S. Appl. No. 16/198,792.
Ex Parte Quayle Action issued on Nov. 19, 2019, in U.S. Appl. No. 16/198,796.
Non-Final Office Action dated Oct. 31, 2019, in U.S. Appl. No. 16/198,850.
Non-Final Office Action dated Jan. 9, 2020, in U.S. Appl. No. 16/673,184.
Notice of Allowance dated Feb. 10, 2020, in U.S. Appl. No. 16/198,796.
Non-Final Office Action dated Mar. 5, 2020, in U.S. Appl. No. 16/228,601.
Notice of Allowance dated Mar. 31, 2020, in U.S. Appl. No. 16/234,541.
Notice of Allowance dated Apr. 9, 2020, in U.S. Appl. No. 16/198,792.
Non-Final Office Action dated Apr. 15, 2020, in U.S. Appl. No. 16/198,873.
Notice of Allowance dated Mar. 12, 2020, in U.S. Appl. No. 16/198,784.
Non-Final Office Action dated Mar. 23, 2020, in U.S. Appl. No. 16/219,716.
Final Office Action dated May 29, 2020, in U.S. Appl. No. 16/198,850.
Final Office Action dated Jun. 25, 2020, in U.S. Appl. No. 16/228,601.

(56) References Cited

OTHER PUBLICATIONS

Final Office Action dated Jul. 23, 2020, in U.S. Appl. No. 16/673,184.
Non-Final Office Action for U.S. Appl. No. 16/236,737 dated Jun. 24, 2020.
Notice of Allowance for U.S. Appl. No. 16/198,796 dated Aug. 26, 2020.
Notice of Allowance for U.S. Appl. No. 16/219,716 dated Sep. 3, 2020.
Non-Final Office Action for U.S. Appl. No. 16/673,114 dated Sep. 3, 2020.
Non-Final Office Action for U.S. Appl. No. 16/200,036 dated Sep. 24, 2020.
Notice of Allowance for U.S. Appl. No. 16/236,737 dated Oct. 28, 2020.
Final Office Action for U.S. Appl. No. 16/198,873 dated Oct. 15, 2020.
Non-Final Office Action for U.S. Appl. No. 16/198,784 dated Nov. 19, 2020.
Non-Final Office Action dated Feb. 19, 2021, in U.S. Appl. No. 16/198,850.
Non-Final Office Action dated Mar. 1, 2021, in U.S. Appl. No. 16/899,522.
Final Office Action dated Mar. 4, 2021, in U.S. Appl. No. 16/673,114.
Non-Final Office Action dated Mar. 18, 2021 in U.S. Appl. No. 16/228,601.
Final Office Action dated Mar. 25, 2021 in U.S. Appl. No. 16/200,036.
Non-Final Office Action dated Apr. 7, 2021, in U.S. Appl. No. 16/915,384.
Non-Final Office Action dated Apr. 15, 2021, in U.S. Appl. No. 16/673,184.
Final Office Action dated Apr. 21, 2021, in U.S. Appl. No. 16/198,784.
Non-Final Office Action dated Jun. 10, 2021, in U.S. Appl. No. 16/198,873.
Notice of Allowance dated Jul. 12, 2021, in U.S. Appl. No. 16/198,784.
Notice of Allowance dated Aug. 26, 2021, in U.S. Appl. No. 16/789,877.
Extended European Search Report dated Aug. 9, 2021, in European Patent Application No. 18890359.5.
Extended European Search Report dated Sep. 6, 2021, in European Patent Application No. 19736098.5.
Extended European Search Report dated Sep. 14, 2021, in European Patent Application No. 18881496.6.
Notice of Allowance dated Sep. 14, 2021, in U.S. Appl. No. 16/899,522.
Notice of Allowance dated Sep. 22, 2021, in U.S. Appl. No. 16/200,036.
Final Office Action dated Sep. 27, 2021, in U.S. Appl. No. 16/915,384.
Extended European Search Report dated Sep. 29, 2021, in European Patent Application No. 18891199.4.
Final Office Action dated Sep. 30, 2021, in U.S. Appl. No. 16/228,601.
Final Office Action dated Sep. 30, 2021, in U.S. Appl. No. 16/198,850.
Extended European Search Report dated Oct. 5, 2021, in European Patent Application No. 18882087.2.
Extended European Search Report dated Oct. 5, 2021, in European Patent Application No. 19736023.3.
Extended European Search Report dated Oct. 7, 2021, in European Patent Application No. 21182984.1.
Notice of Reasons for Refusal drafted on Sep. 14, 2021, in Japanese Patent Application No. 2020-532747.
Notice of Allowance dated Dec. 9, 2021, in U.S. Appl. No. 16/915,384.
Final Office Action dated Dec. 24, 2021, in U.S. Appl. No. 16/198,873.
Non-Final Office Action dated Jan. 12, 2022, in U.S. Appl. No. 16/988,272.
Non-Final Office Action dated Jan. 21, 2022, in U.S. Appl. No. 16/673,114.
Final Office Action dated Nov. 12, 2021, in U.S. Appl. No. 16/673,184.
Notice of Allowance issued in U.S. Appl. No. 16/673,184 dated Mar. 15, 2022.
Notice of Allowance issued in U.S. Appl. No. 16/198,873 dated Mar. 16, 2022.
Notice of Allowance issued in U.S. Appl. No. 16/228,601 dated Mar. 17, 2022.
Notice of Allowance issued in U.S. Appl. No. 16/198,850 dated Mar. 30, 2022.
Search Report issued in European Patent Application 21182998.1 dated Oct. 12, 2021.
Search Report issued in European Patent Application 21182996.5 dated Oct. 22, 2021.
Examination Report issued in Indian Patent Application 202037026000 dated Mar. 25, 2022.
Examination Report issued in Indian Patent Application 202037028070 dated Mar. 30, 2022.
Extended European Search Report issued in European Patent Application 18886954.9 dated Aug. 3, 2021.
Examination Report issued in Indian Patent Application 202037026094 dated Mar. 28, 2022.
Notice of Allowance issued in U.S. Appl. No. 16/915,384 dated Apr. 21, 2022.
Non-Final Office Action dated May 11, 2022, in U.S. Appl. No. 17/164,829.
Notice of Allowance issued in U.S. Appl. No. 16/988,272 dated Jun. 8, 2022.
Non-Final Office Action dated Oct. 24, 2019, in U.S. Appl. No. 16/228,621.
Final Office Action dated Apr. 20, 2020, in U.S. Appl. No. 16/228,621.
Non-Final Office Action dated Sep. 29, 2020, in U.S. Appl. No. 16/228,621.
Final Office Action dated Feb. 23, 2021, in U.S. Appl. No. 16/228,621.
Non-Final Office Action dated Jul. 8, 2021, in U.S. Appl. No. 16/228,621.
Final Office Action dated Dec. 2, 2021, in U.S. Appl. No. 16/228,621.
Notice of Allowance issued in U.S. Appl. No. 16/228,621 dated Feb. 17, 2022.
Notice of Allowance issued in U.S. Appl. No. 16/228,621 dated Jun. 15, 2022.

* cited by examiner

LIGHT EMITTING STACKED STRUCTURE AND DISPLAY DEVICE HAVING THE SAME

CROSS-REFERENCE TO RELATED APPLICATIONS

This application is a Continuation of U.S. patent application Ser. No. 16/228,621, filed on Dec. 20, 2018, which claims priority from and the benefit of the U.S. Provisional Application No. 62/609,186, filed on Dec. 21, 2017, and the U.S. Provisional Application No. 62/618,573, filed on Jan. 17, 2018, which are hereby incorporated by reference for all purposes as if fully set forth herein.

BACKGROUND

Field

Exemplary embodiments of the invention relate to a light emitting stacked structure and a display device having the same and, more specifically, to a micro light emitting device having a stacked structure and a display device having the same.

Discussion of the Background

A display device that implements an image using a light emitting diode (LED) has been recently developed. The display device employing the light emitting diode may include red, green, and blue light emitting diodes individually grown on a substrate.

As an inorganic light source, light emitting diodes have been used in various technical fields, such as displays, vehicular lamps, general lighting, and the like. With advantages of long lifespan, low power consumption, and high response speed, light emitting diodes have been rapidly replacing an existing light source.

Light emitting diodes have been mainly used as a backlight light source in a display apparatus. However, a micro-LED display has been developed as a next generation display that is capable of implementing an image directly using the light emitting diodes.

In general, a display apparatus implements various colors by using mixed colors of blue, green and red light. The display apparatus includes pixels each having subpixels that correspond to blue, green, and red colors, and a color of a certain pixel may be determined based on the colors of the sub-pixels therein, and an image can be displayed through combination of the pixels.

In a micro-LED display, micro-LEDs corresponding to each subpixel are arranged on a two-dimensional plane. Therefore, a large number of micro LEDs are required to be disposed on one substrate. However, the micro-LED has a very small size with a surface area of about 10,000 square µm or less, and thus, there are various problems due to this small size. In particular, it is difficult to mount the micro-LEDs on a display panel due to its small size, especially as over hundreds of thousands or millions are required.

In addition, there is a need for a high-resolution and full-color display device, as well as for a display device having a high level of color purity and color reproducibility that can be manufactured in a simplified method.

The above information disclosed in this Background section is only for understanding of the background of the inventive concepts, and, therefore, it may contain information that does not constitute prior art.

SUMMARY

Light emitting stacked structures constructed according to the principles and some exemplary implementations of the invention are capable of increasing a light emitting area of each subpixel without increasing the pixel area.

Light emitting diodes and display using the light emitting diodes, e.g., micro LEDs, constructed according to the principles and some exemplary implementations of the invention have a simple structure that is capable of being manufactured in streamlined steps. For example, a plurality of pixels may be formed at the wafer level by wafer bonding, thereby eliminating the need for individual mounting of light emitting diodes.

Additional features of the inventive concepts will be set forth in the description which follows, and in part will be apparent from the description, or may be learned by practice of the inventive concepts.

A light emitting stacked structure according to an exemplary embodiment includes a plurality of epitaxial sub-units disposed one over another, each of the epitaxial sub-units configured to emit different colored light, in which each epitaxial sub-unit has a light emitting area that overlaps one another, and at least one epitaxial sub-unit has an area different from the area of another epitaxial sub-unit.

The area of each epitaxial sub-unit may decrease along a first direction.

Between two adjacent epitaxial sub-units, an upper epitaxial sub-unit may completely overlap a lower epitaxial sub-unit having a larger area.

Light emitted from each epitaxial sub-unit may have different energy bands from each other, and the energy bands may increase along a first direction.

The epitaxial sub-units may be independently drivable.

Light emitted from a lower epitaxial sub-unit may be configured to be emitted to the outside of the light emitted stacked structure by passing through an upper epitaxial sub-unit disposed on the lower epitaxial sub-unit.

The upper epitaxial sub-unit may be configured to transmit at least about 80% of light emitted from the lower epitaxial sub-unit.

The epitaxial sub-units may include a first epitaxial stack configured to emit a first color light, a second epitaxial stack disposed on the first epitaxial stack and configured to emit a second color light having a wavelength band different from the first color light, and a third epitaxial stack disposed on the second epitaxial stack and configured to emit a third color light having a wavelength band different from the first and second color lights.

The first, second, and third color lights may be a red light, a green light, and a blue light, respectively.

Each of the first, second, and third epitaxial stacks may include a p-type semiconductor layer, an active layer disposed on the p-type semiconductor layer, and an n-type semiconductor layer disposed on the active layer.

The light emitting stacked structure may further include first, second, and third p-type contact electrodes connected to the p-type semiconductor layers of the first, second, and third epitaxial stacks, respectively.

The light emitting stacked structure may further include a substrate disposed under the first epitaxial stack, in which the first p-type contact electrode may be disposed between the substrate and the first epitaxial stack.

The light emitting stacked structure may further include first, second, and third n-type contact electrodes connected to the n-type semiconductor layers of the first, second, and third epitaxial stacks, respectively.

The light emitting stacked structure may further include a common line applying a common voltage to the first, second, and third p-type contact electrodes, and first, second, and third light emitting signal lines applying a light emitting signal to the first, second, and third n-type contact electrodes, respectively.

The light emitting stacked structure may further include at least one of a first wavelength pass filter disposed between the first epitaxial stack and the second epitaxial stack and a second wavelength pass filter disposed between the second epitaxial stack and the third epitaxial stack.

The light emitting diode pixel may include a micro LED having a surface area less than about 10,000 square μm.

At least one of the first, second, and third epitaxial stacks may have a concave-convex pattern formed on one surface thereof.

A display device according to an exemplary embodiment includes a plurality of pixels, at least one of the pixels including a light emitting stacked structure including a plurality of epitaxial sub-units disposed one over another, each of the epitaxial sub-units configured to emit different colored light, in which each epitaxial sub-unit has a light emitting area that overlaps one another, and at least one epitaxial sub-unit has an area different from the area of another epitaxial sub-unit.

The display device may be configured to be driven in a passive matrix manner.

The display device may be configured to be driven in an active matrix manner.

A light emitting diode pixel for a display according to an exemplary embodiment includes a first LED sub-unit, a second LED sub-unit disposed on a first portion of the first LED sub-unit, and a third LED sub-unit disposed on a second portion of the second LED sub-unit, in which each of the first, second, and third LED sub-units include a first conductivity type semiconductor layer and a second conductivity type semiconductor layer, light generated from the first LED sub-unit is configured to be emitted outside of the light emitting diode pixel through a third portion of the first LED sub-unit different from the first portion, and light generated from the second LED sub-unit is configured to be emitted outside of the light emitting diode pixel through a fourth portion of the second LED sub-unit different from the second portion.

The first LED sub-unit, the second LED sub-unit, and the third LED sub-unit may be configured to emit light having different wavelengths from each other, respectively.

The first, second, and third LED sub-units may include first LED stack, second LED stack, and third LED stack configured to emit red light, green light and blue light, respectively.

The light emitting diode pixel may further include a first reflection layer interposed between the first LED stack and the second LED stack to reflect light emitted from the first LED stack back to the first LED stack, and a second reflection layer interposed between the second LED stack and the third LED stack to reflect light emitted from the second LED stack back to the second LED stack.

The light emitting diode pixel may further include a first transparent insulation layer interposed between the first LED stack and the first reflection layer, and a second transparent insulation layer interposed between the second LED stack and the second reflection layer.

The light emitting diode pixel may further include a first bonding layer interposed between the first reflection layer and the second LED stack, and a second bonding layer interposed between the second reflection layer and the third LED stack.

Each of the first and second bonding layers may include metal.

The light emitting diode pixel may further include a first upper ohmic electrode contacting the first conductivity type semiconductor layer of the first LED sub-unit, a first lower ohmic electrode contacting the second conductivity type semiconductor layer of the first LED sub-unit, a second upper ohmic electrode contacting the first conductivity type semiconductor layer of the second LED sub-unit, a second lower ohmic electrode contacting the second conductivity type semiconductor layer of the second LED sub-unit, a third upper ohmic electrode contacting the first conductivity type semiconductor layer of the third LED sub-unit, and a third lower ohmic electrode contacting the second conductivity type semiconductor layer of the third LED sub-unit, in which the first upper ohmic electrode may contact the first conductivity type semiconductor layer of the first LED sub-unit in a portion of the first LED sub-unit different from the first portion, and the second upper ohmic electrode may contact the first conductivity type semiconductor layer of the second LED sub-unit in a portion of the second LED sub-unit different from the second portion.

The first lower ohmic electrode may include a first reflective layer disposed under the first LED sub-unit.

The first lower ohmic electrode, the second lower ohmic electrode, and the third lower ohmic electrode may be electrically connected to a common line.

Each of the second lower ohmic electrode and the third lower ohmic electrode may include a second reflective layer and a third reflective layer, respectively.

The first reflective layer may be configured to reflect light emitted from the first LED sub-unit, and the second reflective layer is configured to reflect light emitted from the second LED sub-unit.

The light emitting diode pixel may include a micro LED having a surface area less than about 10,000 square μm.

The first LED sub-unit may be configured to emit any one of red, green, and blue light, the second LED sub-unit may be configured to emit any one of red, green, and blue light different from light emitted from the first LED sub-unit, and the third LED sub-unit may be configured to emit any one of red, green, and blue light different from light emitted from the first and second LED sub-units.

The third portion of the first LED, the fourth portion of the second LED sub-unit, and the third LED sub-unit may not overlap each other.

At least one of the first, second, and third upper ohmic electrodes may include a pad portion and a projection extending therefrom.

The pad portion may have a substantially circular shape, and the projection may have a substantially elongated shape.

The projections of the first, second, and third LED stub-units may be substantially parallel to each other in a plan view.

The first LED sub-unit may surround the third LED sub-unit in a plan view.

A display apparatus may include a plurality of pixels arranged on a support substrate, at least one of the pixels including the light emitting diode pixel according to an exemplary embodiment.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
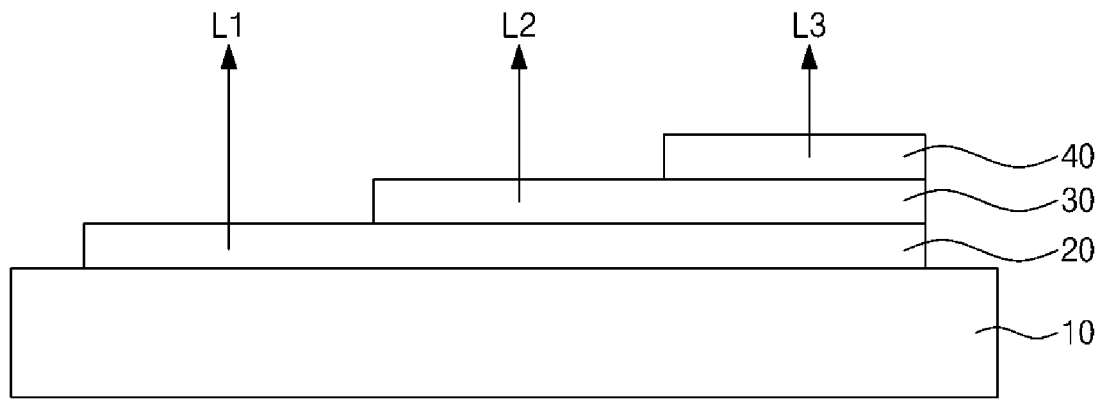
FIG. 1 is a schematic cross-sectional view of a light emitting stacked structure constructed according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the present disclosure will be explained in detail with reference to the accompanying drawings. As used herein, a light emitting stacked structure or a light emitting diode according to exemplary embodiments may include a micro LED, which has a surface area less than about 10,000 square µm as known in the art. In other exemplary embodiments, the micro LED's may have a surface area of less than about 4,000 square µm, or less than about 2,500 square µm, depending upon the particular application.

FIG. 1 is a cross-sectional view of a light emitting stacked structure according to an exemplary embodiment.

Referring to FIG. 1, the light emitting stacked structure according to an exemplary embodiment includes a plurality of epitaxial stacks stacked disposed one over another. The epitaxial stacks are disposed on a substrate 10. The substrate 10 has substantially a plate shape with a front surface and a rear surface.

The substrate 10 may have various shapes, and the epitaxial stacks may be disposed on a front surface of the substrate 10. The substrate 10 may include an insulating material, such as a glass, a quartz, a silicon, an organic polymer, or an organic-inorganic composite material. However, the inventive concepts are not limited to a particular material of the substrate 10, as long as the substrate 10 has an insulating property. In an exemplary embodiment, a line part may be further disposed on the substrate 10 to apply a light emitting signal and a common voltage to each of the epitaxial stacks. In addition, a driving device including a thin film transistor may further be disposed on the substrate 10, which may drive the epitaxial stacks in an active matrix method. In this case, the substrate 10 may be a printed circuit board or a composite substrate, which may be obtained by forming the line part and/or the driving device on the glass, quartz, silicon, organic polymer, or organic-inorganic composite material, for example.

The epitaxial stacks are sequentially stacked on the front surface of the substrate 10. In some exemplary embodiments, two or more epitaxial stacks emitting light having different wavelength bands from each other may be disposed. As such, the epitaxial stack may be provided in plural, and the epitaxial stacks may emit light having different energy bands different from each other.

Each of the epitaxial stacks may have various sizes. In an exemplary embodiment, at least one of the epitaxial stacks may have an area different from the other epitaxial stacks.

When the epitaxial stacks are sequentially stacked in an upward direction from a lower portion, the area of the epitaxial stacks may become smaller along the upward direction. Among two adjacent epitaxial stacks disposed over one another, at least a portion of the upper epitaxial stack may overlap with the lower epitaxial stack. In some exemplary embodiments, the upper epitaxial stack disposed may completely overlap with the lower epitaxial stack, and in this case, the upper epitaxial stack may be located in an area corresponding to the lower epitaxial stack.

In the illustrated exemplary embodiment, three epitaxial stacks are sequentially stacked on the substrate 10. The epitaxial stacks disposed on the substrate 10 may include first, second, and third epitaxial stacks 20, 30, and 40.

The first, second, and third epitaxial stacks 20, 30, and 40 may have different sizes from each other. More particularly, the first, second, and third epitaxial stacks 20, 30, and 40 may have different areas from each other in a plan view, and the first, second, and third epitaxial stacks 20, 30, and 40 may have different widths from each other in a cross-sectional view. In the illustrated exemplary embodiment, the area of the first, second, and third epitaxial stacks 20, 30, and 40 gradually decreases in the order of the first epitaxial stack 20, the second epitaxial stack 30, and the third epitaxial stack 40. The second epitaxial stack 30 is stacked on a portion of the first epitaxial stack 20. Accordingly, a portion of the first epitaxial stack 20 is covered by the second epitaxial stack 30, and the remaining portion of the first epitaxial stack 20 is exposed in a plan view. The third epitaxial stack 40 is stacked on a portion of the second epitaxial stack 30. Accordingly, a portion of the second epitaxial stack 30 is covered by the third epitaxial stack 40, and the remaining portion of the second epitaxial stack 30 is exposed in a plan view.

The area of the first, second, and third epitaxial stacks 20, 30, and 40 may be changed in various ways. For example, a ratio of area between the first, second, and third epitaxial stacks 20, 30, and 40 may be 3:2:1, however, the inventive concepts are not limited thereto. Each of the first, second, and third epitaxial stacks 20, 30, and 40 may have a different ratio of area in consideration of an amount of light emitted from each epitaxial stack. For example, when the amount of light emitted from the third epitaxial stack 40 is small, the area ratio of the third epitaxial stack 40 may be relatively increased.

Each of the epitaxial stacks may emit a color light in a visible light band among various wavelength bands. In an exemplary embodiment, light emitted from the lowermost epitaxial stack may have the longest wavelength with the lowest energy band, and the wavelength of the color light emitted from the epitaxial stacks may become shorter from the lowermost to the uppermost epitaxial stacks. For example, light emitted from the uppermost epitaxial stack disposed may have the shortest wavelength with the highest energy band. The first epitaxial stack 20 emits a first color light L1, the second epitaxial stack 30 emits a second color light L2, and the third epitaxial stack 40 emits a third color light L3. The first, second, and third color light L1, L2, and L3 may have different colors from each other, and the first, second, and third color light L1, L2, and L3 may have different wavelength bands from each other, which are sequentially shortened. In particular, the first, second, and third color light L1, L2, and L3 may have different wavelength bands from each other, which gradually increases from the first color light L1 to the third color light L3.

In an exemplary embodiment, the first color light L1 may be red light, the second color light L2 may be green light, and the third color light L3 may be blue light. However, the inventive concepts are not limited thereto. When the light emitting stacked structure includes a micro LED, which has a surface area less than about 10,000 square μm as known in the art, or less than about 4,000 square μm or 2,500 square μm in other exemplary embodiments, the first epitaxial stack 20 may emit any one of red, green, and blue light, and the second and third epitaxial stacks 30 and 40 may emit a different one of red, green, and blue light, without adversely affecting operation, due to the small form factor of a micro LED.

Each epitaxial stack emits light in a direction away from the substrate 10 faces. In this case, light from one epitaxial stack may be emitted directly to the outside in a direction away from the substrate 10, or emitted through an upper epitaxial stack disposed in an optical path. The direction away from the substrate 10 may indicate a direction in which the first, second, and third epitaxial stacks 20, 30, and 40 are stacked. Hereinafter, the direction away from the substrate will be referred to as a "front surface direction" or an "upward direction", and a direction towards the substrate 10 faces will be referred to as a "rear surface direction" or a "downward direction". However, terms "upward" and "downward" are relative terms, which may vary depending on an arrangement or a stacked direction of the light emitting stacked structure.

Each epitaxial stack emits light towards the upward direction. Light emitted from each epitaxial stack may directly travel in the upward direction or through another epitaxial stack disposed thereabove. In an exemplary embodiment, a first portion of light emitted from the first epitaxial stack 20 directly travels in the upward direction through the exposed upper surface thereof, a second portion of light emitted from the first epitaxial stack 20 travels in the upward direction after passing through the second epitaxial stack 30, and a third portion of the light emitted from the first epitaxial stack 20 travels in the upward direction after passing through the second and third epitaxial stacks 30 and 40. A portion of light emitted from the second epitaxial stack 30 directly travels in the upward direction through the exposed upper surface thereof, and the other portion of the light emitted from the second epitaxial stack 30 travels in the upward direction after passing through the third epitaxial stack 40. Light emitted from the third epitaxial stack 40 directly travels in the upward direction.

Each epitaxial stack may transmit most of light emitted from the epitaxial stack disposed thereunder. In particular, the portion of light emitted from the first epitaxial stack 20 travels in the front surface direction after passing through the second epitaxial stack 30 and the third epitaxial stack 40, and the portion of light emitted from the second epitaxial stack 30 travels in the front surface direction after passing through the third epitaxial stack 40. As such, at least a portion or an entire portion of other epitaxial stacks except for the lowermost epitaxial stack may be formed of a light transmitting material. As used herein, the term "light transmitting material" may refer to a material transmitting an entire light or a material transmitting a predetermined wavelength or a portion of light having a predetermined wavelength. In an exemplary embodiment, each epitaxial stack may transmit about 60% or more of light emitted from the epitaxial stack disposed thereunder. According to another exemplary embodiment, each epitaxial stack may transmit about 80% or more of light from the epitaxial stack disposed thereunder, and according to another exemplary embodiment, each epitaxial stack may transmit about 90% or more of light from the epitaxial stack disposed thereunder.

According to an exemplary embodiment, the epitaxial stacks may be independently driven as signal lines that respectively apply light emitting signals to the epitaxial stacks are independently connected to the epitaxial stacks, and thus, may display various colors depending on whether light is emitted from each epitaxial stack. In addition, since the epitaxial stacks emitting light having difference wavelengths are formed to be overlapped with each other, the light emitting stacked structure may be formed in a narrow area.

Figure 2:
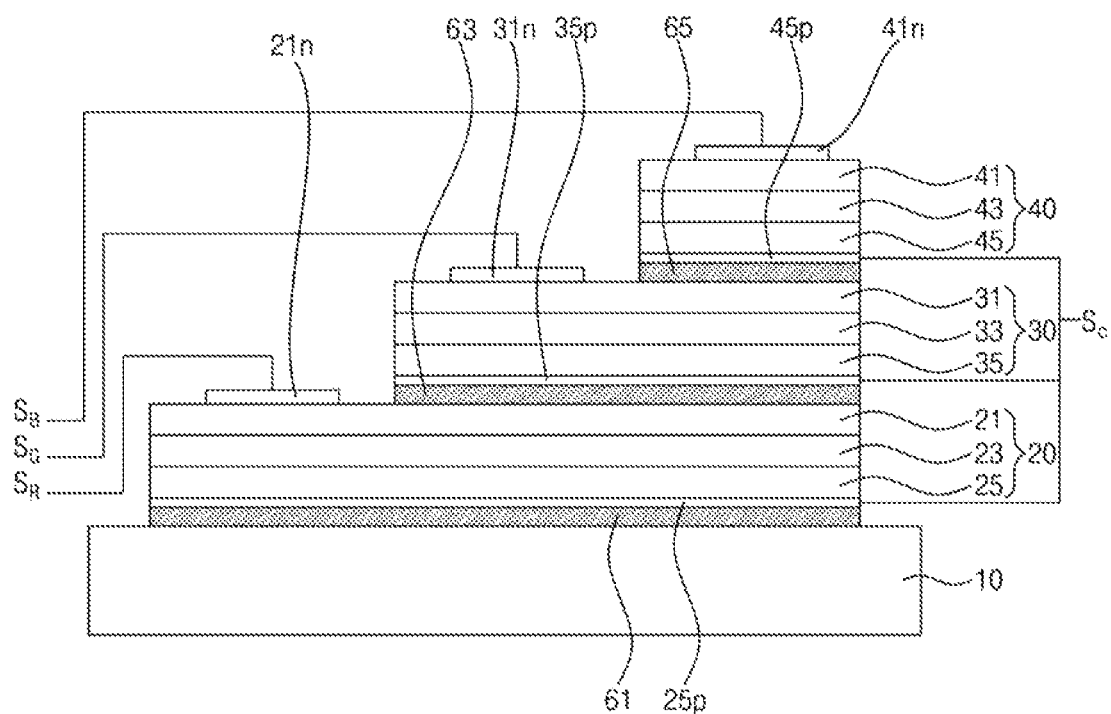
FIG. 2 is a cross-sectional view of a light emitting stacked structure according to an exemplary embodiment.

FIG. 2 is a cross-sectional view of a light emitting stacked structure an exemplary embodiment.

Referring to FIG. 2, the light emitting stacked structure according to an exemplary embodiment includes the first, second, and third epitaxial stacks 20, 30, and 40 disposed on the substrate 10, with first, second, and third adhesive layers 61, 63, and 65 therebetween. The first adhesive layer 61 may include a conductive or non-conductive material. In some exemplary embodiments, the first adhesive layer 61 may have a conductivity at portions thereof to be electrically connected to the substrate 10 disposed thereunder. The first adhesive layer 61 may include a transparent or non-transparent material. When the substrate 10 includes the non-transparent material and the line part is formed on the substrate 10, the first adhesive layer 61 may include the non-transparent material, for example, a light absorbing material, such as an epoxy-based polymer adhesive.

The second and third adhesive layers 63 and 65 may include a non-conductive material and may include a light transmitting material. For example, the second and third adhesive layers 63 and 65 may include an optically clear adhesive (OCA). However, the inventive concepts are not limited to a particular material of the second and third adhesive layers 63 and 65, as long as the second and third adhesive layers 63 and 65 are optically clear and stably attach each epitaxial stack. For example, the second and third adhesive layers 63 and 65 may include an organic material, such as an epoxy-based polymer like SU-8, various resists, parylene, poly(methyl methacrylate) (PMMA), benzocyclobutene (BCB), and spin on glass (SOG), and an inorganic material, such as silicon oxide and aluminum oxide. In some exemplary embodiments, a conductive oxide may be used as the adhesive layer, and in this case, the conductive oxide may be insulated from other components. When the organic material is used as the adhesive layer, the first, second, and third epitaxial stacks 20, 30, and 40 and the substrate 10 may be attached to each other by coating the material on an adhesive side of the first, second, and third epitaxial stacks 20, 30, and 40 and the substrate 10, and applying a high temperature and a high pressure to the material under a high vacuum state. When the inorganic material is used as the adhesive layer, the first, second, and third epitaxial stacks 20, 30, and 40 and the substrate 10 may be attached to each other by depositing the material on the adhesive side of the first, second, and third epitaxial stacks 20, 30, and 40 and the substrate 10, planarizing the material using a chemical-mechanical planarization (CMP), performing a plasma treatment on a surface of the material, and attaching under the high vacuum state, for example. Each of the first, second, and third epitaxial stacks 20, 30, and 40 includes a p-type semiconductor layer 25, 35, and 45, an active layer 23, 33, and 43, and an n-type semiconductor layer 21, 31, and 41, which are sequentially stacked.

The p-type semiconductor layer 25, the active layer 23, and the n-type semiconductor layer 21 of the first epitaxial stack 20 may include a semiconductor material that emits red light, such as aluminum gallium arsenide (AlGaAs), gallium arsenide phosphide (GaAsP), aluminum gallium indium phosphide (AlGaInP), and gallium phosphide (GaP), etc., without being limited thereto.

A first p-type contact electrode layer 25p may be disposed under the p-type semiconductor layer 25 of the first epitaxial stack 20. The first p-type contact electrode layer 25p of the first epitaxial stack 20 may have a single-layer structure or a multi-layer structure and may include metal. For example, the first p-type contact electrode layer 25p may include metal, such as Al, Ti, Cr, Ni, Au, Ag, Sn, W, Cu, or an alloy thereof. The first p-type contact electrode layer 25p may include metal having high reflectance to improve light emission efficiency in the upward direction by the reflecting light emitted from the first epitaxial stack 20.

A first n-type contact electrode 21n may be disposed on the n-type semiconductor layer of the first epitaxial stack 20. The first n-type contact electrode 21n of the first epitaxial stack 20 may have a single-layer structure or a multi-layer structure and may include metal. For example, the first n-type contact electrode 21n may include metal, such as Al, Ti, Cr, Ni, Au, Ag, Sn, W, Cu, or an alloy thereof. However, the inventive concepts are not limited thereto, and other conductive materials may be used.

The second epitaxial stack 30 includes the p-type semiconductor layer 35, the active layer 33, and the n-type semiconductor layer 31, which are sequentially stacked. The p-type semiconductor layer 35, the active layer 33, and the n-type semiconductor layer 31 may include a semiconductor material that may emit green light, such as indium gallium nitride (InGaN), gallium nitride (GaN), gallium phosphide (GaP), aluminum gallium indium phosphide (AlGaInP), and aluminum gallium phosphide (AlGaP), for example, without being limited thereto.

A second p-type contact electrode layer 35p is disposed under the p-type semiconductor layer 35 of the second epitaxial stack 30. The second p-type contact electrode layer 35p is disposed between the first epitaxial stack 20 and the second epitaxial stack 30, in detail, between the second adhesive layer 63 and the second epitaxial stack 30.

A second n-type contact electrode 31n may be disposed on the n-type semiconductor layer of the second epitaxial stack 30. The second n-type contact electrode 31n of the second epitaxial stack 30 may have a single-layer structure or a multi-layer structure, and may include metal. For example, the second n-type contact electrode 31n may include metal, such as Al, Ti, Cr, Ni, Au, Ag, Sn, W, Cu, or an alloy thereof. However, the inventive concepts are not limited thereto, and other conductive materials may be used.

The third epitaxial stack 40 includes the p-type semiconductor layer 45, the active layer 43, and the n-type semiconductor layer 41, which are sequentially stacked. The p-type semiconductor layer 45, the active layer 43, and the n-type semiconductor layer 41 may include a semiconductor material that may emit blue light, such as gallium nitride (GaN), indium gallium nitride (InGaN), and zinc selenide (ZnSe), for example, without being limited thereto.

A third p-type contact electrode layer 45p is disposed under the p-type semiconductor layer 45 of the third epitaxial stack 40. The third p-type contact electrode layer 45p is disposed between the second epitaxial stack 30 and the third epitaxial stack 40, in detail, between the third adhesive layer 65 and the third epitaxial stack 40.

A third n-type contact electrode 41n may be disposed on the n-type semiconductor layer of the third epitaxial stack 40. The third n-type contact electrode 41n of the third epitaxial stack 40 may have a single-layer structure or a multi-layer structure, and may include metal. For example, the third n-type contact electrode 41n may include metal, such as Al, Ti, Cr, Ni, Au, Ag, Sn, W, Cu, or an alloy thereof. However, the inventive concepts are not limited thereto, and other conductive materials may be used.

FIG. 2 shows that each of the n-type semiconductor layers 21, 31, and 41 and each of the p-type semiconductor layer 25, 35, and 45 of the first, second, and third epitaxial stacks 20, 30, and 40 has the single-layer structure, however, in some exemplary embodiments, these layers may have a multi-layer structure and may include a superlattice layer. The active layers 23, 33, and 43 of the first, second, and third epitaxial stacks 20, 30, and 40 may have a single quantum well structure or a multiple quantum well structure.

The second p-type contact electrode layer 35p may have an area that substantially covers the second epitaxial stack 30. In addition, the third p-type contact electrode layer 45p may have an area that substantially covers the third epitaxial stack 40. In this case, the second and third p-type contact electrode layers 35p and 45p may include a transparent conductive material to transmit light emitted from the epitaxial stack disposed thereunder. For example, each of the second and third p-type contact electrode layers 35p and 45p may include the transparent conductive oxide (TCO), which may include tin oxide (SnO), indium oxide (InO$_2$), zinc oxide (ZnO), indium tin oxide (ITO), and indium tin zinc oxide (ITZO). The transparent conductive compound may be deposited by a chemical vapor deposition (CVD) or a physical vapor deposition (PVD) using an evaporator or a sputter, for example. The second and third p-type contact electrode layers 35*p* and 45*p* may have a thickness, e.g., from about 2000 angstroms to about 2 micrometers, so as to function as an etch stopper in the following manufacturing process while having a predetermined light transmittance.

In an exemplary embodiment, the first, second, and third p-type contact electrode layers 25*p*, 35*p*, and 45*p* may be connected to a common line. The common line is a line to which the common voltage is applied. In addition, light emitting signal lines may be respectively connected to the first, second, and third n-type contact electrodes 21*n*, 31*n*, and 41*n*. In an exemplary embodiment, the common voltage Sc is applied to the first p-type contact electrode layer 25*p*, the second p-type contact electrode layer 35*p*, and the third p-type contact electrode layer 45*p* through the common line, and the light emitting signal is applied to the first, second, and third n-type contact electrodes 21*n*, 31*n*, and 41*n* through the light emitting signal lines. Accordingly, the first, second, and third epitaxial stacks 20, 30, and 40 may be independently controlled. The light emitting signal includes first, second, and third light emitting signals SR, SG, and SB respectively corresponding to the first, second, and third epitaxial stacks 20, 30, and 40. In an exemplary embodiment, the first, second, and third light emitting signals SR, SG, and SB are signals respectively corresponding to light emissions of red light, green light, and blue light.

In the illustrated exemplary embodiment, the common voltage is applied to the p-type semiconductor layers 25, 35, and 45 of the first, second, and third epitaxial stacks 20, 30, and 40, and the light emitting signal is applied to the n-type semiconductor layers 21, 31, and 41 of the first, second, and third epitaxial stacks 20, 30, and 40, however, the inventive concepts are not limited thereto. For example, in some exemplary embodiments, the common voltage may be applied to the n-type semiconductor layers 21, 31, and 41 of the first, second, and third epitaxial stacks 20, 30, and 40, and the light emitting signal may be applied to the p-type semiconductor layers 25, 35, and 45 of the first, second, and third epitaxial stacks 20, 30, and 40.

The first, second, and third epitaxial stacks 20, 30, and 40 may be driven in response to the light emitting signal applied thereto. More particularly, the first epitaxial stack 20 is driven in response to the first light emitting signal SR, the second epitaxial stack 30 is driven in response to the second light emitting signal SG, and the third epitaxial stack 40 is driven in response to the third light emitting signal SB. In this case, the first, second and third light emitting signals SR, SG, and SB are independently applied to the first, second, and third epitaxial stacks 20, 30, and 40, and thus, the first, second, and third epitaxial stacks 20, 30, and 40 are independently driven. The light emitting stacked structure may provide light having various colors by a combination of the first, second, and third color light emitted from the first, second, and third epitaxial stacks 20, 30, and 40 to the upward direction.

The light emitting stacked structure having the above-described structure according to exemplary embodiments may have an improved light extraction efficiency as compared to a structure having the epitaxial stacks completely overlap with each other. In particular, the amount of light emitted from the first, second, and third epitaxial stacks 20, 30, and 40 in the upper direction without passing through other epitaxial stacks may be increased, which may improve the light extraction efficiency.

In addition, the light emitting stacked structure according to exemplary embodiments may display various colors by a combination of different colors of light emitted from overlapping epitaxial stacks, rather than providing different color lights through different areas spaced apart from each other on a plane, and thus, a light emitting element according to exemplary embodiments may have a reduced size with increased integration. A conventional light emitting elements that emit different colors of light, e.g., red, green, and blue lights, are spaced apart from each other on a plane to implement a full color display. Accordingly, an area occupied by the conventional light emitting elements is relatively large since the light emitting elements are spaced apart from each other on the plane. However, light emitting elements according to exemplary embodiments that emit the different colors of light are disposed in the same area while being overlapped with each other to form the light emitting stacked structure, and thus, the full color display may be implemented through a significantly smaller area than that of the conventional art. Therefore, a high-resolution display device may be manufactured in a small area.

Further, even when a conventional light emitting device is manufactured in a stacked manner, the conventional light emitting device is manufactured by individually forming a contact part in each light emitting element, e.g., by forming light emitting elements individually and separately and connecting the light emitting elements to each other using a wiring, which may increase the structural complexity and manufacturing complexity. However, the light emitting stacked structure according to the exemplary embodiments may be manufactured by sequentially stacking plural epitaxial stacks on one substrate, forming the contact part in the epitaxial stacks through a simplified process, and connecting the line part to the epitaxial stacks. In addition, since one light emitting stacked structure is mounted according to exemplary embodiments, the manufacturing method of the display device may be significantly simplified compared with the conventional display device manufacturing method, which may separately manufacture the light emitting elements of individual colors and individually mounting the light emitting elements.

The light emitting stacked structure according the exemplary embodiments may further include various components to provide high purity color light and high efficiency. For example, the light emitting stacked structure may include a wavelength pass filter to prevent light having a relatively shorter wavelength from traveling towards the epitaxial stack emitting light having a relatively longer wavelength.

Hereinafter, different features and elements from those described above will be mainly described in order to avoid redundancy. As such, detailed descriptions of the substantially the same elements will be omitted to avoid redundancy.

Figure 3:
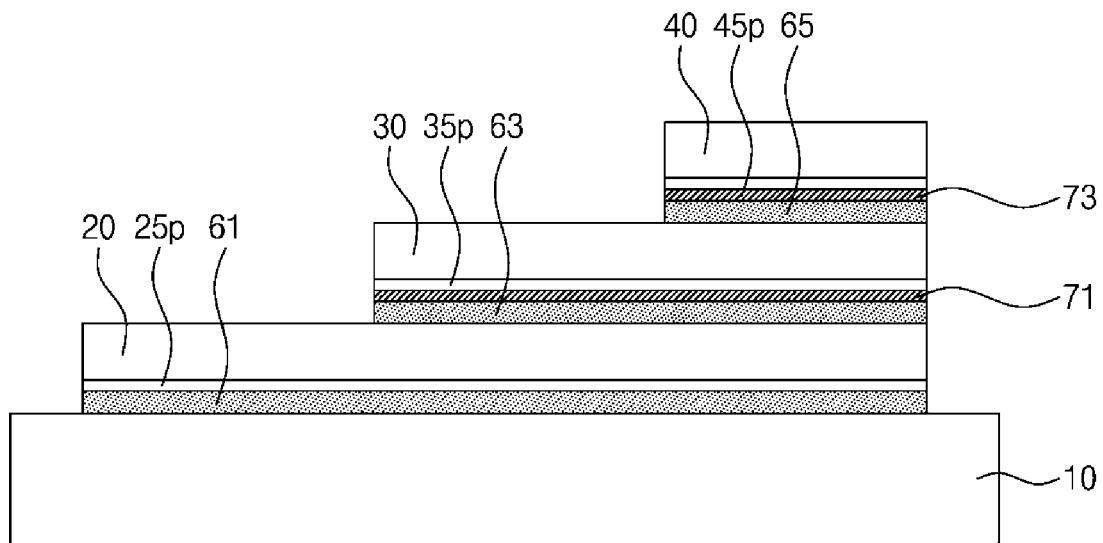
FIG. 3 is a schematic cross-sectional view of a light emitting stacked structure according to an exemplary embodiment.

FIG. 3 is a cross-sectional of a light emitting stacked structure according to an exemplary embodiment.

Referring to FIG. 3, the light emitting stacked structure may include a first wavelength pass filter 71 disposed between the first epitaxial stack 20 and the second epitaxial stack 30.

The first wavelength pass filter 71 may selectively transmit light having a predetermined wavelength. The first wavelength pass filter 71 may transmit the first color light emitted from the first epitaxial stack 20 and may block or reflect light except for the first color light. Accordingly, the first color light emitted from the first epitaxial stack 20 may travel in the upward direction, but the second and third color light respectively emitted from the second and third epitaxial stacks 30 and 40 may not travel toward the first epitaxial stack 20 and may be reflected or blocked by the first wavelength pass filter 71.

The second and third color light may have relatively shorter wavelength and relatively higher energy than the first color light. When the second and third color lights are incident into the first epitaxial stack 20, a secondary light emission may be induced in the first epitaxial stack 20. According to an exemplary embodiment, however, the second and third color lights may be prevented from being incident into the first epitaxial stack 20 by the first wavelength pass filter 71.

In an exemplary embodiment, a second wavelength pass filter 73 may be disposed between the second epitaxial stack 30 and the third epitaxial stack 40. The second wavelength pass filter 73 may transmit the first and second color lights respectively emitted from the first and second epitaxial stacks 20 and 30, and may block or reflect light except for the first and second color lights. Accordingly, the first and second color lights respectively emitted from the first and second epitaxial stacks 20 and 30 may travel in the upward direction, but the third color light emitted from the third epitaxial stack 40 may not travel toward the first and second epitaxial stacks 20 and 30, and may be reflected or blocked by the second wavelength pass filter 73.

The third color light has relatively shorter wavelength and relatively higher energy than the first and second color lights. When the third color light is incident into the first and second epitaxial stacks 20 and 30, a secondary light emission may be induced in the first and second epitaxial stacks 20 and 30. According to an exemplary embodiment, however, the third color light may be prevented from being incident into the first and second epitaxial stacks 20 and 30 by the second wavelength pass filter 73.

The first and second wavelength pass filters 71 and 73 may be formed in various ways. For example, the first and second wavelength pass filters 71 and 73 may be formed by alternately stacking insulating layers having different refractive indices from each other. For example, silicon dioxide ($SiO_2$) and titanium dioxide ($TiO_2$) may be alternately stacked on each other, and a wavelength of light may be determined by adjusting a thickness and/or the number of stacked layers of each of the silicon dioxide ($SiO_2$) and the titanium dioxide ($TiO_2$). In some exemplary embodiments, $SiO_2$, $TiO_2$, $HfO_2$, $Nb_2O_5$, $ZrO_2$, and $Ta_2O_5$ may be used as the insulating layers having different refractive indices.

The light emitting stacked structure according to an exemplary embodiment may further include various components to provide high efficiency uniform light. For example, various concave-convex portions may be formed on a light emitting surface. In some exemplary embodiments, the concave-convex portions may formed on the n-type semiconductor layer of at least one of the first, second, and third epitaxial stacks 20, 30, and 40, which may be a light emitting surface.

The concave-convex portion may improve a light emitting efficiency. The concavo-convex portion may be provided in various shapes, such as a polygonal pyramid, a hemisphere, or a surface having a roughness, on which concavo-convex portions are randomly arranged. The concave-convex portion may be textured through various etching processes or may be formed using a patterned sapphire substrate.

The first, second, and third color lights emitted from the first, second, and third epitaxial stacks 20, 30, and 40 may have difference intensities, and the intensity difference may cause a difference in visibility. In an exemplary embodiment, the light emitting efficiency may be improved by forming the concave-convex portion selectively on the light emitting surfaces of the first, second, and third epitaxial stacks 20, 30, and 40, to reduce the difference in visibility between the first, second, and third color lights. Since the color light corresponding to the red and/or blue colors has lower visibility than color light corresponding to green color, the difference in visibility may be reduced by texturing the first epitaxial stack 20 and/or the third epitaxial stack 40. In particular, the red color light has a relatively smaller intensity as the red color light may be provided from the lowermost portion of the light emitting stacked structure. In this case, when the concave-convex portion is formed on the first epitaxial stack 20 to improve light efficiency thereof.

The light emitting stacked structure having the above-described structure may correspond to a light emitting element capable of displaying various colors, and may be employed in a display device as a pixel. Hereinafter, a display device including the light emitting stacked structure according to exemplary embodiments will be described in more detail.

Figure 4:
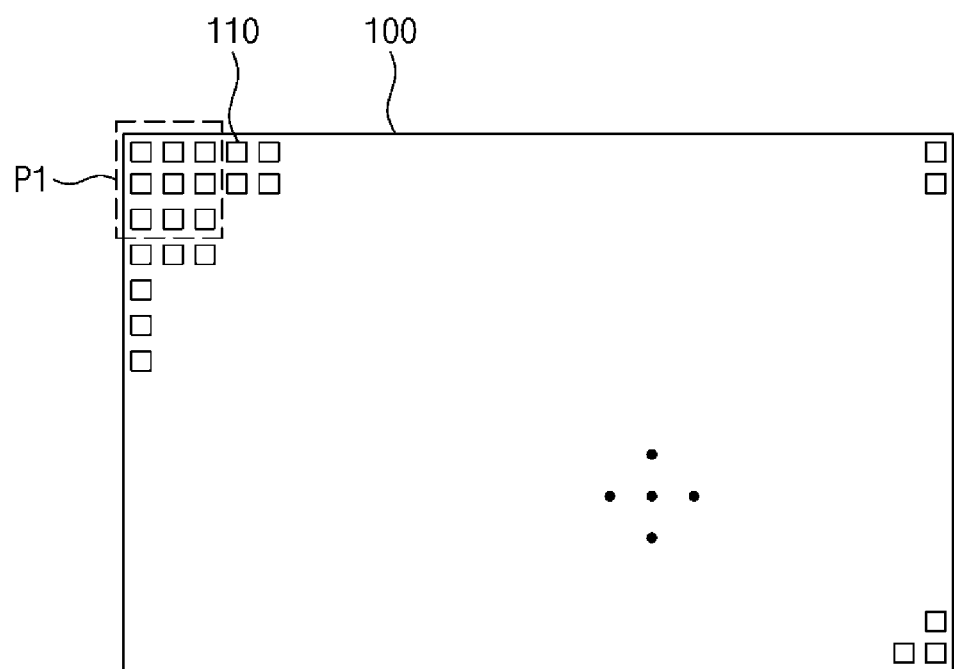
FIG. 4 is a plan view of a display device according to an exemplary embodiment.
Figure 5:
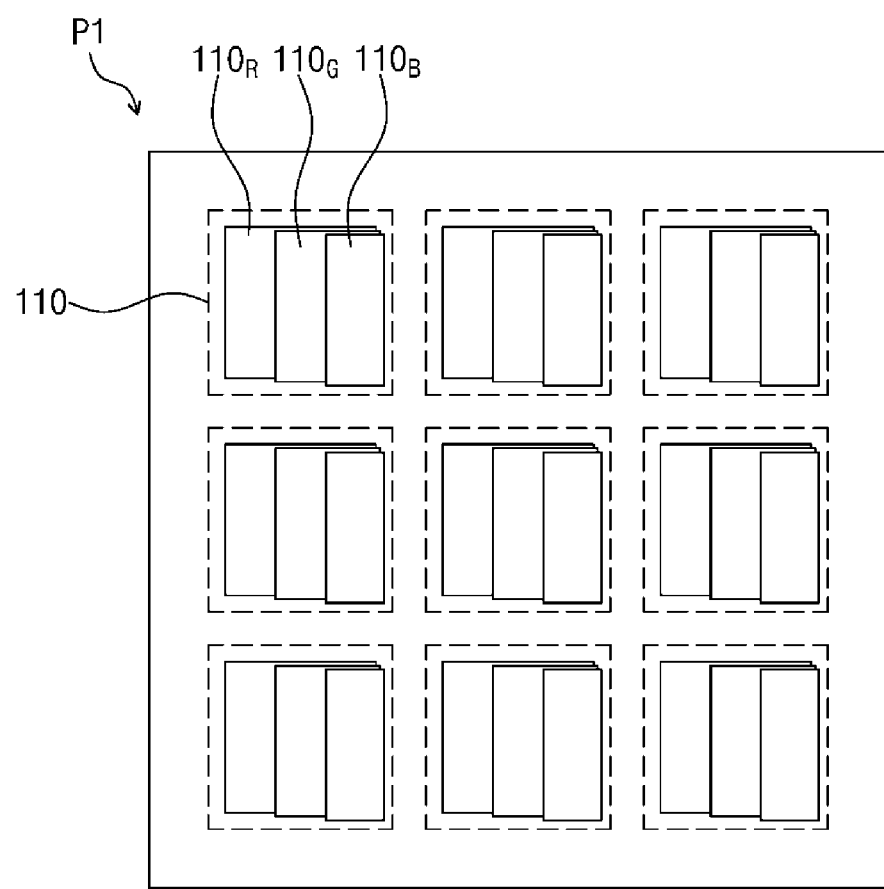
FIG. 5 is an enlarged plan view of portion P1 of FIG. 4.

FIG. 4 is a plan view of a display device according to an exemplary embodiment, and FIG. 5 is an enlarged plan view of portion P1 of FIG. 4.

Referring to FIGS. 4 and 5, the display device 100 according to an exemplary embodiment may display any visual information, such as a text, a video, a photograph, and a 2D or 3D image.

The display device 100 may have various shapes, such as a closed polygonal shape with straight sides, a circular or oval shape with a curved side, and a semi-circular or semi-oval shape with a straight side and a curved side. In the illustrated exemplary embodiment, the display device 100 will be described as having substantially a rectangular shape.

The display device 100 includes a plurality of pixels 110 that display an image. Each pixel 110 may be a minimum unit that displays the image. Each pixel 110 may include the light emitting stacked structure according to an exemplary embodiment and may emit a white light and/or a color light.

Each pixel 110 according to an exemplary embodiment includes a first pixel $110_R$ emitting red color light, a second pixel $110_G$ emitting green color light, and a third pixel $110_B$ emitting blue color light. The first, second, and third pixels $110_R$, $110_G$, and $110_B$ may respectively correspond to the first, second, and third epitaxial stacks 20, 30, and 40 of the light emitting stacked structure described above.

The pixels 110 are arranged in a matrix form. As used herein, the pixels 110 being arranged in the matrix form may refer to that the pixels 110 are arranged exactly in line along rows or columns, as well as the pixels 110 being arranged substantially along the rows or columns, while detailed locations of the pixels 110 may be varied, e.g., a zigzag form.

Figure 6:
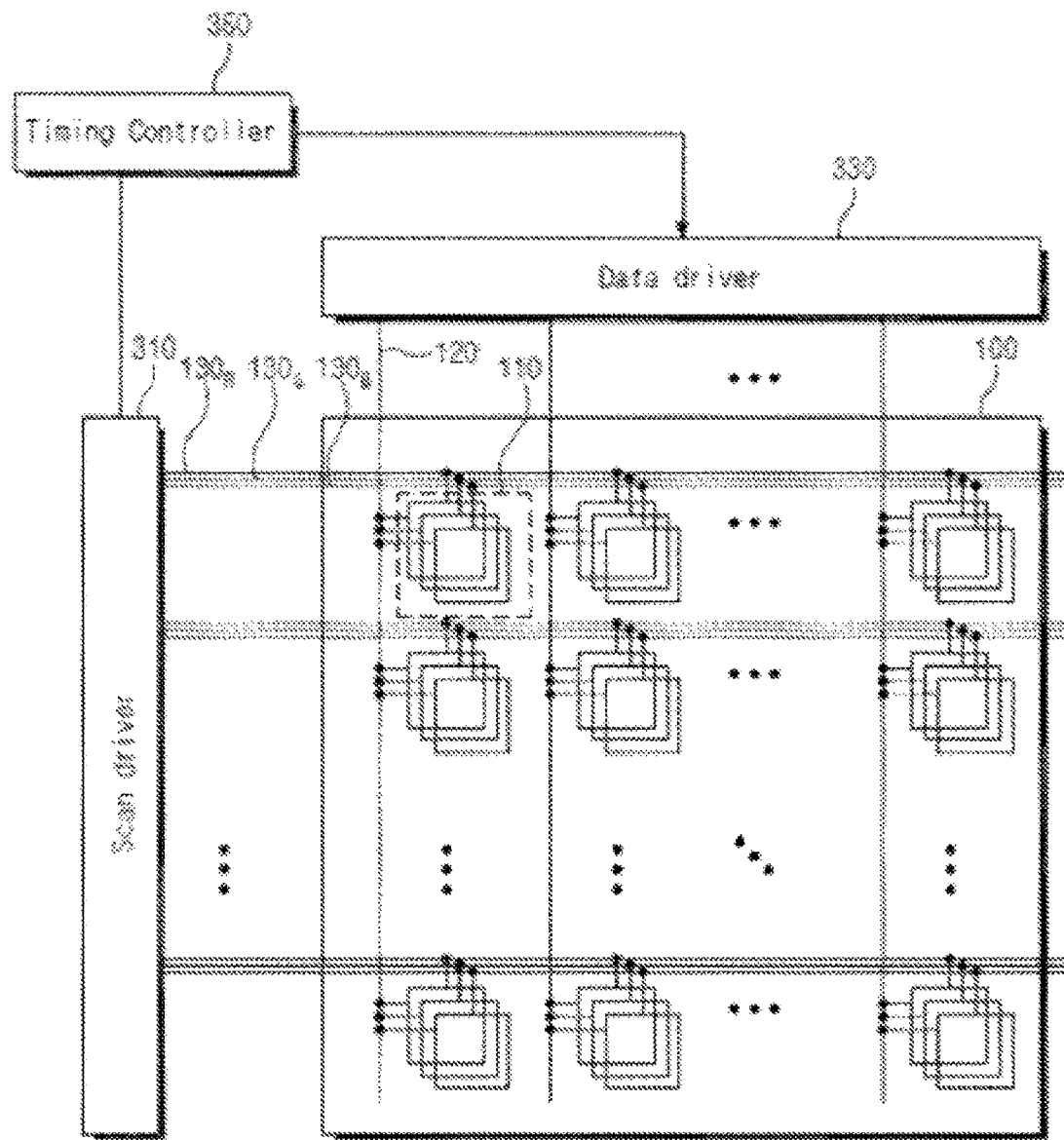
FIG. 6 is a block diagram of a display device according to an exemplary embodiment.

FIG. 6 is a block diagram of a display device according to an exemplary embodiment.

Referring to FIG. 6, the display device 100 according to an exemplary embodiment includes a timing controller 350, a scan driver 310, a data driver 330, a line part, and the pixels. Each of the pixels is individually connected to the scan driver 310 and the data driver 330 through the line part.

The timing controller 350 receives various control signals and image data, which may be used to drive the display device 100, from an external source (e.g., an external system that transmits the image data). The timing controller 350 may rearrange the received image data and apply the rearranged image data to the data driver 330. In addition, the timing controller 350 may generate scan control signals and data control signals, which may be used to drive the scan driver 310 and the data driver 330, and apply the generated scan control signals and the data control signals to the scan driver 310 and the data driver 330, respectively.

The scan driver 310 may receive the scan control signals from the timing controller 350 and generate scan signals in response to the scan control signals.

The data driver 330 may receive the data control signals and the image data from the timing controller 350 and generate data signals in response to the data control signals.

The line part includes a plurality of signal lines. In particular, the line part includes scan lines $130_R$, $130_G$, and $130_B$ (hereinafter, collectively indicated as "130") that connect the scan driver 310 to the pixels, and data lines 120 that connect the data driver 330 to the pixels. The scan lines 130 may be connected to the pixels, respectively, and the scan lines respectively connected to the pixels are shown in first, second and third scan lines $130_R$, $130_G$, and $130_B$.

In addition, the line part may further include lines that connect the timing controller 350 and the scan driver 310, the timing controller 350 and the data driver 330, or other components to each other to transmit signals.

The scan lines 130 apply the scan signals generated by the scan driver 310 to the pixels. The data signals generated by the data driver 330 are applied to the data lines 120.

The pixels are connected to the scan lines 130 and the data lines 120. The pixels may selectively emit light in response to the data signals provided from the data lines 120 when the scan signals from the scan lines 103 are applied thereto. For example, each of the pixels may emit light having the brightness that corresponds to the data signal applied thereto during each frame period. The pixels, to which the data signals corresponding to a black brightness are applied, may not emit light during corresponding frame period, and thus, displaying a black color.

In an exemplary embodiment, the pixels may be driven in a passive or an active matrix manner. When the display device is driven in the active matrix manner, the display device 100 may be further supplied with first and second pixel power sources, in addition to the scan signals and the data signals.

Figure 7:
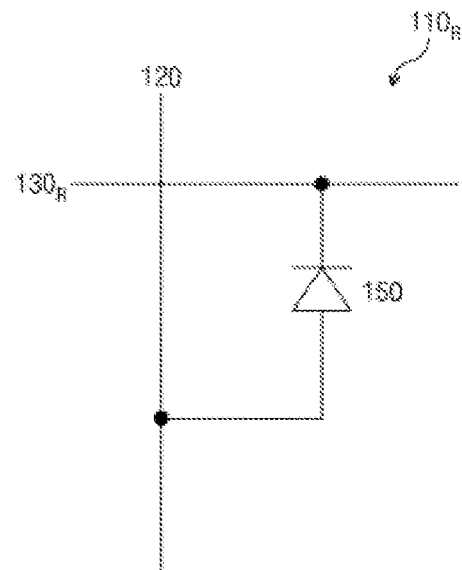
FIG. 7 is a circuit diagram of one pixel for a passive matrix type display device according to an exemplary embodiment.

FIG. 7 is a circuit diagram of one pixel for a passive matrix type display device according to an exemplary embodiment. The pixel may be one of the pixels, e.g., the red pixel, the green pixel, and the blue pixel, and the pixel will be described with reference to the first pixel $110_R$. The second and third pixels may be driven in substantially the same manner as the first pixel, and thus, detailed descriptions of circuit diagrams of the second and third pixels will be omitted to avoid redundancy.

Referring to FIG. 7, the first pixel $110_R$ includes a light emitting element 150 connected between the first scan line $130_R$ and the data line 120. The light emitting element 150 may correspond to the first epitaxial stack 20. When a voltage equal to or greater than a threshold voltage is applied to between the p-type semiconductor layer and the n-type semiconductor layer, the first epitaxial stack 20 emits light having the brightness that corresponds to a level of the voltage applied thereto. As such, the light emission of the first pixel $110_R$ may be controlled by controlling a voltage of the scan signal applied to the first scan line $130_R$ and/or a voltage of the data signal applied to the data line 120.

Figure 8:
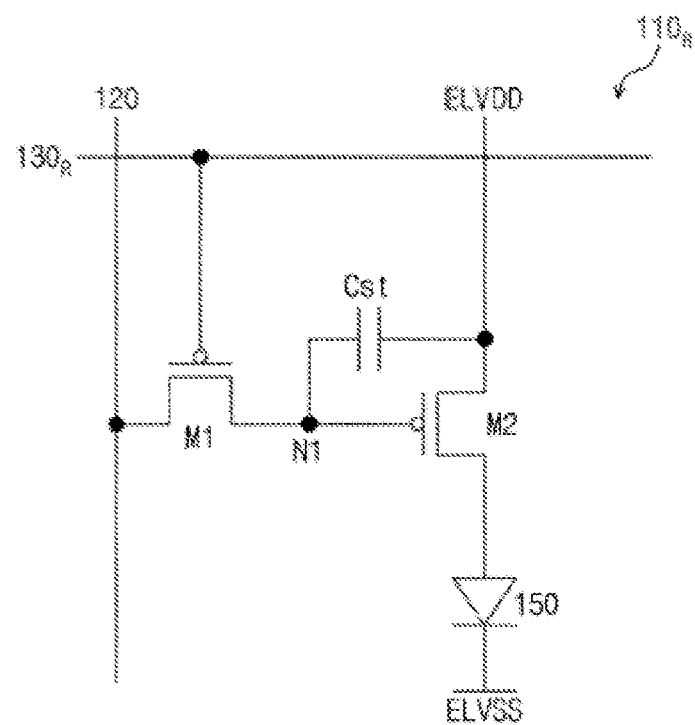
FIG. 8 is a circuit diagram of one pixel for an active matrix type display device according to an exemplary embodiment.

FIG. 8 is a circuit diagram of one pixel for an active matrix type display device according to an exemplary embodiment.

When the display device is the active matrix type display device, the first pixel $110_R$ may be further supplied with first and second pixel power sources ELVDD and ELVSS, in addition to the scan signals and the data signals.

Referring to FIG. 8, the first pixel $110_R$ includes one or more light emitting elements 150 and a transistor part connected to the light emitting element 150.

The light emitting element 150 may correspond to the first epitaxial stack 20, the p-type semiconductor layer of the light emitting element 150 may be connected to the first pixel power source ELVDD via the transistor part, and the n-type semiconductor layer of the light emitting element 150 may be connected to the second pixel power source ELVSS. The first pixel power source ELVDD and the second pixel power source ELVSS may have different electric potentials from each other. For example, the second pixel power source ELVSS may have an electric potential lower than an electric potential of the first pixel power source ELVDD by at least the threshold voltage of the light emitting element. Each of the light emitting elements may emit light having a brightness that corresponds to a driving current controlled by the transistor part.

The transistor part according to an exemplary embodiment includes first and second transistors M1 and M2 and a storage capacitor Cst. However, a configuration of the transistor part may be variously modified.

The first transistor M1 (switching transistor) includes a source electrode connected to the data line 120, a drain electrode connected to a first node N1, and a gate electrode connected to the first scan line $130_R$. The first transistor M1 is turned on to electrically connect the data line 120 and the first node N1 when the scan signal having the voltage sufficient to turn on the first transistor M1 is provided through the first scan line $130_R$. In this case, the data signal of the corresponding frame is applied to the data line 120, and thus, the data signal is applied to the first node N1. The storage capacitor Cst is charged with the data signal applied to the first node N1.

The second transistor M2 (driving transistor) includes a source electrode connected to the first pixel power source ELVDD, a drain electrode connected to the n-type semiconductor layer of the light emitting element 150, and a gate electrode connected to the first node N1. The second transistor M2 controls an amount of the driving current supplied to the light emitting element 150 in response to the voltage of the first node N1.

One electrode of the storage capacitor Cst is connected to the first pixel power source ELVDD, and the other electrode of the storage capacitor Cst is connected to the first node N1. The storage capacitor Cst is charged with the voltage corresponding to the data signal applied to the first node N1 and maintains the charged voltage until a data signal of a next frame is provided.

In the illustrated exemplary embodiment, the transistor part is described as including two transistors as shown in FIG. 8. However, the inventive concepts are not limited to a particular number of the transistors included in the transistor part, and the configuration of the transistor part may be changed in various ways. For example, the transistor part may include more transistors and more capacitors. In addition, the configurations of the first and second transistors, the storage capacitor, and the lines are well known in the art, and thus, detailed descriptions thereof will be omitted. In some exemplary embodiments, the configurations of the first and second transistors, the storage capacitor, and the lines may be changed in various ways. Hereinafter, the pixel will be described with reference to a passive matrix-type pixel.

Figure 9:
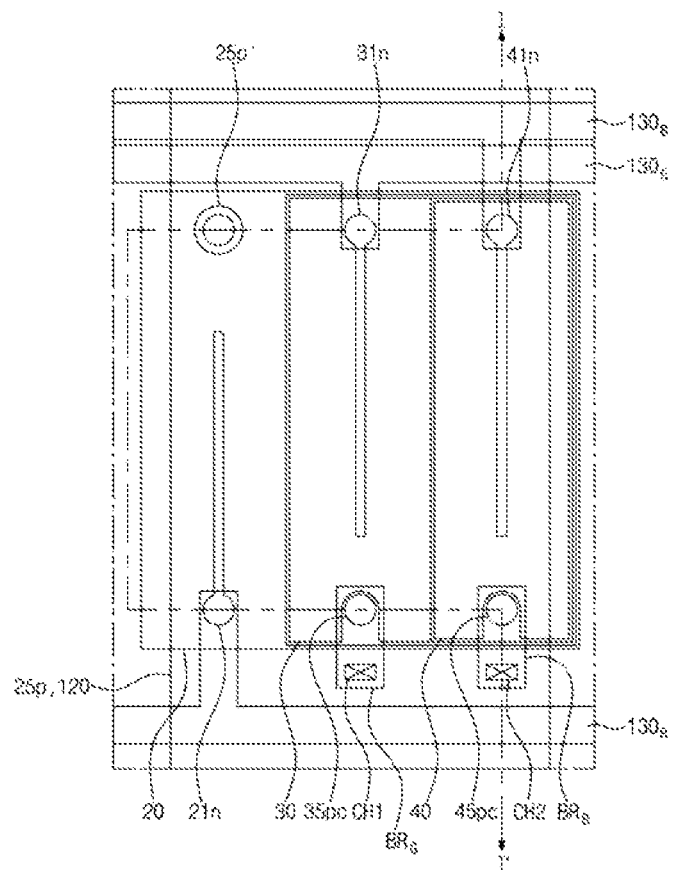
FIG. 9 is a plan view of a pixel according to an exemplary embodiment.
Figure 10:
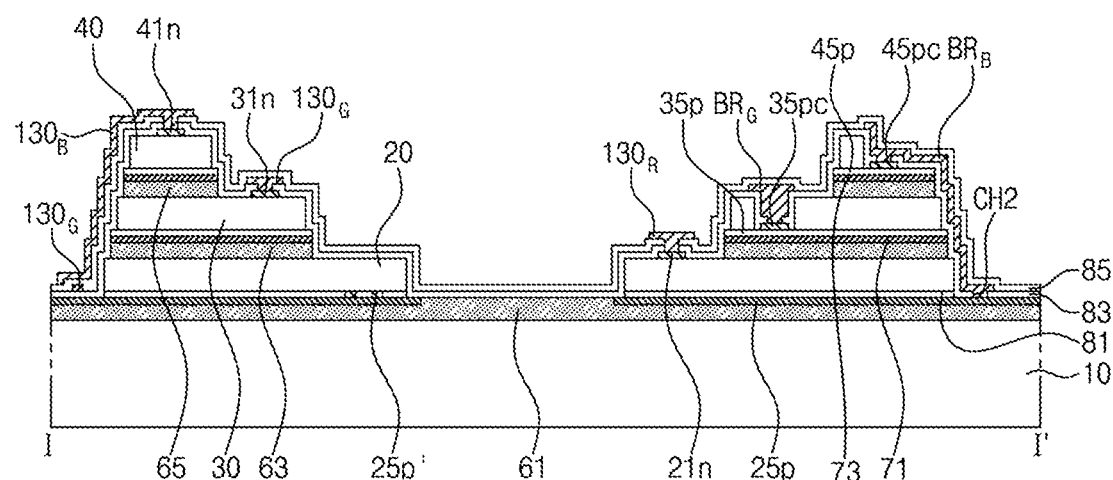
FIG. 10 is a cross-sectional view taken along line I-I' of FIG. 9.

FIG. 9 is a plan view of a pixel according to an exemplary embodiment, and FIG. 10 is a cross-sectional view taken along line I-I' of FIG. 9.

Referring to FIGS. 9 and 10, the pixel according to an exemplary embodiment includes a plurality of epitaxial stacks stacked one above another, and the epitaxial stacks include the first, second, and third epitaxial stacks 20, 30, and 40.

The first epitaxial stack 20 may have the largest area among the epitaxial stacks. The second epitaxial stack 30 has an area smaller than that of the first epitaxial stack 20 and is disposed on a portion of the first epitaxial stack 20. The third epitaxial stack 40 has an area smaller than that of the second epitaxial stack 30 and is disposed on a portion of the second epitaxial stack 30. In the illustrated exemplary embodiment, the first, second, and third epitaxial stacks 20, 30, and 40 are arranged such that upper surfaces of the first, second, and third epitaxial stacks 20, 30, and 40 are sequentially exposed.

The contact part is disposed in the pixel to connect the line part to the first, second, and third epitaxial stacks 20, 30, and 40. In some exemplary embodiments, the stacked structure of a pixel may be changed depending on to which polarity type semiconductor layers of the first, second, and third epitaxial stacks 20, 30, and 40 the common voltage is applied. Hereinafter, the common voltage will be described as being applied to the p-type semiconductor layer of the first, second, and third epitaxial stacks 20, 30, and 40, as an example.

The first, second, and third light emitting signal lines that respectively apply the light emitting signals to the first, second, and third epitaxial stacks 20, 30, and 40, and the common line that applies the common voltage to each of the first, second, and third epitaxial stacks 20, 30, and 40 are connected to the first, second, and third epitaxial stacks 20, 30, and 40. The first, second, and third light emitting signal lines may respectively correspond to the first, second, and third scan lines $130_R$, $130_G$, and $130_B$, and the common line may correspond to the data line 120, and thus, the first, second, and third scan lines $130_R$, $130_G$, and $130_B$ and the data line 120 are connected to the first, second, and third epitaxial stacks 20, 30, and 40.

The first, second, and third scan lines $130_R$, $130_G$, and $130_B$ according to an exemplary embodiment may extend in a first direction, e.g., a horizontal direction of FIG. 9. The data line 120 may extend in a second direction, e.g., a vertical direction of FIG. 9, that crosses the first, second, and third scan lines $130_R$, $130_G$, and $130_B$. However, the directions in which the first, second, and third scan lines $130_R$, $130_G$, and $130_B$ and the data line 120 extend are not limited thereto, and may be changed in various ways depending on the arrangement of the pixels.

Since the data line 120 and the first p-type contact electrode layer 25p are elongated in the second direction crossing the first direction, and substantially simultaneously apply the common voltage to the p-type semiconductor layer of the first epitaxial stack 20, the data line 120 and the first p-type contact electrode layer 25p may be substantially the same component. As such, hereinafter, the first p-type contact electrode layer 25p will be referred to as the data line 120, or vice versa.

An ohmic electrodes 25p' is disposed in the light emitting area, in which the first p-type contact electrode layer 25p is disposed, for the ohmic contact between the first p-type contact electrode layer 25p and the first epitaxial stack 20. The ohmic electrode 25p' may have various shapes and may be provided in plural. In the illustrated exemplary embodiment, the ohmic electrode 25p' is disposed in an area through which the lower surface of the first epitaxial stack 20 is exposed, however, the inventive concepts are not limited thereto, and the ohmic electrode 25p' may be disposed at another position. The ohmic electrode 25p' for the ohmic contact may include various materials. In an exemplary embodiment, the ohmic electrode 25p' corresponding to a p-type ohmic electrode 25p' may include an Au—Zn alloy or an Au—Be alloy. In this case, since the material for the ohmic electrode 25p' has a reflectivity lower than that of Ag, Al, and Au, an additional reflection electrode may be further disposed, which may include Ag or Au, for example. In this case, a layer including Ti, Ni, Cr, or Ta may be disposed as an adhesive layer for adhesion to adjacent components. For example, the adhesive layer may be deposited thinly on upper and lower surfaces of the reflection electrode including Ag or Au.

The first n-type contact electrode 21n is disposed on the first epitaxial stack 20. The first scan line $130_B$ is connected to the first n-type contact electrode 21n. The second n-type contact electrode 31n is disposed on the second epitaxial stack 30. The second scan line $130_G$ is connected to the second n-type contact electrode 31n. The third n-type contact electrode 41n is disposed on the third epitaxial stack 40. The third scan line $130_B$ is connected to the third n-type contact electrode 41n.

A portion of one side of the second epitaxial stack 30 is removed. A second p-type contact electrode 35pc is disposed on the portion from which the portion of the second epitaxial stack 30 is removed. The second p-type contact electrode 35pc is connected to a first bridge electrode $BR_G$, and the first bridge electrode $BR_G$ is connected to the data line 120 through a first contact hole CH1. A third p-type contact electrode 45pc is connected to a second bridge electrode $BR_B$, and the second bridge electrode $BR_B$ is connected to the data line 120 through a second contact hole CH2. Accordingly, the common voltage is applied to the second and third p-type contact electrodes 35pc and 45pc through the data line 120.

In an exemplary embodiment, the first, second, and third n-type contact electrodes 21n, 31n, and 41n may include a pad part having a relatively wide area to be easily connected to the first, second, and third scan lines $130_R$, $130_G$, and $130_B$, respectively, and an extension part extending in one direction from the pad part. The pad part may have various shapes, such as substantially a circular shape, for example. The extension part may assist in providing a uniform current to the n-type semiconductor layer of the first epitaxial stack 20, and may extend in one direction from the pad part. The extension part may have various shapes, such as a substantially elongated shape, for example.

The adhesive layer, the p-type contact electrode layer, and the wavelength pass filter are disposed between the substrate 10 and each of the first epitaxial stack 20, the second epitaxial stack 30, and the third epitaxial stack 40. Hereinafter, the pixel according to an exemplary embodiment will be described according to the stacking order.

The first epitaxial stack 20 is disposed on the substrate 10 with the first adhesive layer 61 interposed therebetween. The first epitaxial stack 20 includes the p-type semiconductor layer, the active layer, and the n-type semiconductor layer, which are sequentially stacked in the upward direction from the lower portion.

A first insulating layer 81 is disposed on a lower surface, e.g., a surface facing the substrate 10, of the first epitaxial stack 20. The first insulating layer 81 has at least one contact hole. The ohmic electrode 25p' is disposed in the contact hole and makes contact with the p-type semiconductor layer of the first epitaxial stack 20. The ohmic electrode 25p' may include various materials.

The ohmic electrode 25p' makes contact with the first p-type contact electrode layer 25p (e.g., the data line 120). The first p-type contact electrode layer 25p is disposed between the first insulating layer 81 and the first adhesive layer 61.

The first p-type contact electrode layer 25p may overlap with the first epitaxial stack 20, more particularly, the light emitting area of the first epitaxial stack 20, and may cover substantial or all of the light emitting area of the first epitaxial stack 20 in a plan view. The first p-type contact electrode layer 25p may include a reflective material that reflects light generated in the first epitaxial stack 20. In addition, the first insulating layer 81 may have reflectivity to enhance the reflection of light in the first epitaxial stack 20. For example, the first insulating layer 81 may have an omni-directional reflector (ODR) structure.

More particularly, the first p-type contact electrode layer 25p may include metal having high reflectivity with respect to light emitted from the first epitaxial stack 20. For example, when the first epitaxial stack 20 emits red light, the first p-type contact electrode layer 25p may include metal, such as Au, Al, or Ag, which has high reflectivity with respect to red light. In particular, since Au has low reflectivity with respect to the green light and the blue light, which may be emitted from the second and third epitaxial stacks 30 and 40, and thus, a color mixture from light emitted by the second and third epitaxial stacks 30 and 40 may be prevented.

The first n-type contact electrode 21n is disposed on the upper surface of the first epitaxial stack 20. The first n-type contact electrode 21n may include a conductive material. In an exemplary embodiment, the first n-type contact electrode 21n may include various metal and alloys thereof, for example, an Au—Te alloy or an Au—Ge alloy.

The second adhesive layer 63 is disposed on the first epitaxial stack 20, and the first wavelength pass filter 71, the second p-type contact electrode layer 35p, and the second epitaxial stack 30 are sequentially disposed on the second adhesive layer 63.

The first wavelength pass filter 71 covers a portion of the light emitting area of the first epitaxial stack 20, and is disposed on a portion of the upper surface of the first epitaxial stack 20 to overlap the area in which the second epitaxial stack 30 is disposed.

The second epitaxial stack 30 includes the p-type semiconductor layer, the active layer, and the n-type semiconductor layer, which are sequentially stacked in the upward direction.

The second epitaxial stack 30 is partially removed, and thus a portion of the second p-type contact electrode layer 35p is exposed. The second p-type contact electrode 35pc is disposed on the exposed portion of the second p-type contact electrode layer 35p. The second n-type contact electrode 31n is disposed on the second epitaxial stack 30.

The third adhesive layer 65 is disposed on the second epitaxial stack 30, and the second wavelength pass filter 73, the third p-type contact electrode layer 45p, and the third epitaxial stack 40 are sequentially disposed on the third adhesive layer 65.

The second wavelength pass filter 73 covers a portion of the light emitting area of the second epitaxial stack 30, and is disposed on a portion of the upper surface of the second epitaxial stack 30 to overlap the area in which the third epitaxial stack 40 is disposed.

The third epitaxial stack 40 includes the p-type semiconductor layer, the active layer, and the n-type semiconductor layer, which are sequentially stacked in the upward direction.

The third epitaxial stack 40 is partially removed, and a portion of the third p-type contact electrode layer 45p is exposed. The third p-type contact electrode 45pc is disposed on the exposed portion of the third p-type contact electrode layer 45p. The third n-type contact electrode 41n is disposed on the third epitaxial stack 40.

Second and third insulating layers 83 and 85 are sequentially disposed on the substrate 10 above the third epitaxial stack 40. The second and third insulating layers 83 and 85 may include various organic/inorganic insulating materials, without being limited thereto. For example, the second and/or third insulating layers 83 and 85 may include the inorganic insulating material including silicon nitride or silicon oxide, or the organic insulating material including polyimide.

The first insulating layer 81 and/or the second insulating layer 83 is provided with contact holes to expose the upper surfaces of the first p-type contact electrode layer 25p, the second and third p-type contact electrodes 35pc and 45pc, and the first, second, and third n-type contact electrodes 21n, 31n, and 41n. The first, second, and third scan lines $130_R$, $130_G$, and $130_B$ are respectively connected to the first, second, and third n-type contact electrodes 21n, 31n, and 41n. The first and second bridge electrodes $BR_G$ and $BR_B$ are connected to the first p-type contact electrode layer 25p and the second and third p-type contact electrodes 35pc and 45pc through the contact holes. In an exemplary embodiment, the second scan line $130_G$, the first bridge electrode $BR_G$, and the second bridge electrode $BR_B$ may be disposed on the first insulating layer 81, and the first and third scan lines $130_R$ and $130_B$ may be disposed on the second insulating layer 83.

In some exemplary embodiments, a concave-convex portion may be selectively disposed on the upper surfaces of the first, second, and third epitaxial stacks 20, 30, and 40. The concave-convex portion may be disposed only in an area corresponding to the light emitting area or on the entire upper surface of each semiconductor layer.

In addition, in some exemplary embodiments, a non-light transmitting layer may be further disposed on a side portion of the second and/or third insulating layers 83 and 85 corresponding to the side surface of the pixel. The non-light transmitting layer may function as a light blocking layer to prevent light from the first, second, and third epitaxial stacks 20, 30, and 40 from exiting through the side surface of the pixel, and may include a material that absorbs or reflects light.

The non-light transmitting layer may have a single or multi-layer metal. For example, the non-light transmitting layer may include various materials including a metal of Al, Ti, Cr, Ni, Au, Ag, Sn, W, and Cu or an alloy thereof.

In some exemplary embodiments, the non-light transmitting layer may be disposed on the side surface of the second and/or third insulating layers 83 and 85 using the metal or the metal alloy as a separate layer.

In some exemplary embodiments, the non-light transmitting layer may be provided by extending at least one of the first, second, and third scan lines $130_R$, $130_G$, and $130_B$ and the first and second bridge electrodes $BR_G$ and $BR_B$ toward the side portion. In this case, the non-light transmitting layer extending from at least one of the first, second, and third scan lines $130_R$, $130_G$, and $130_B$ and the first and second bridge electrodes $BR_G$ and $BR_B$ may be insulated from other conductive components.

In some exemplary embodiments, the non-light transmitting layer may be formed in the same process, includes the same material, and may be disposed on the same layer as at least one of the first, second, and third scan lines $130_R$, $130_G$, and $130_B$ and the first and second bridge electrodes $BR_G$ and $BR_B$, or may be provided separately from the first, second, and third scan lines $130_R$, $130_G$, and $130_B$ and the first and second bridge electrodes $BR_G$ and $BR_B$.

According to another exemplary embodiment, when the non-light transmitting layer is not provided separately, the second and third insulating layers 83 and 85 may function as the non-light transmitting layer. In this case, the second and third insulating layers 83 and 85 may not be disposed on an upper portion (e.g., the front surface direction) of the first, second, and third epitaxial stacks 20, 30, and 40, such that light emitted from the first, second, and third epitaxial stacks 20, 30, and 40 may travel in the front surface direction.

The non-light transmitting layer according to exemplary embodiments are not particularly limited as long as the non-light transmitting layer absorbs or reflects light to block the transmission of light. For example, the non-light transmitting layer may be a distributed Bragg reflector (DBR) dielectric mirror, a metal reflection layer formed on an insulating layer, or a black-colored organic polymer layer. When the metal reflection layer is used as the non-light transmitting layer, the metal reflection layer may be in a floating state such that the metal reflection layer is electrically insulated from components of other pixels.

In this manner, when the non-light transmitting layer is disposed on the side surface of the pixel, light may be prevented from exiting through a side surface thereof, such that one pixel may not influence a pixel adjacent thereto and mixing of light between adjacent pixels may be prevented.

The pixel according to the exemplary embodiments may be manufactured by sequentially stacking the first, second, and third epitaxial stacks 20, 30, and 40 on the substrate 10, which will be described hereinafter.

FIGS. 11, 13, 15, 17, 19, 21, 23, 25, 27, 29, 31, and 33 are plan views of a substrate on which first, second, and third epitaxial stacks are sequentially stacked. FIGS. 12, 14, 16, 18, 20, 22, 24, 26, 28, 30, 32, and 34 are cross-sectional views taken along line I-I' of FIGS. 11, 13, 15, 17, 19, 21, 23, 25, 27, 29, 31, and 33, respectively.

Figure 11:
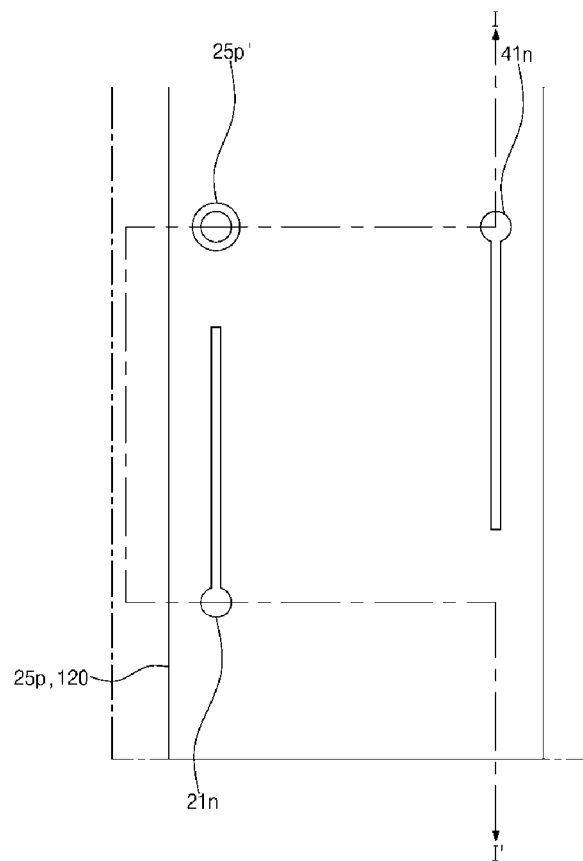
FIGS. 11, 13, 15, 17, 19, 21, 23, 25, 27, 29, 31, and 33 are plan views illustrating a method of forming first, second, and third epitaxial stacks according to an exemplary embodiment.
Figure 12:
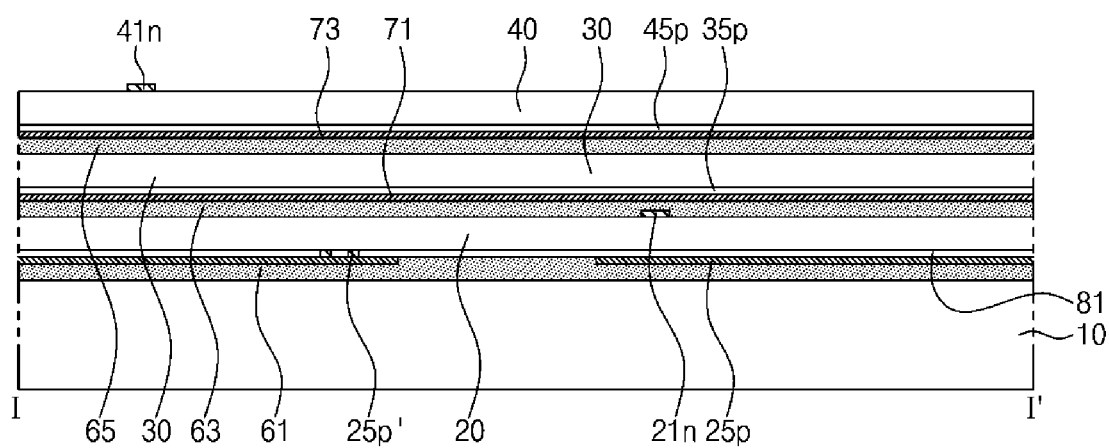
FIGS. 12, 14, 16, 18, 20, 22, 24, 26, 28, 30, 32, and 34 are cross-sectional views taken along line I-I' of FIGS. 11, 13, 15, 17, 19, 21, 23, 25, 27, 29, 31, and 33, respectively.

Referring to FIGS. 11 and 12, the first, second, and third epitaxial stacks 20, 30, and 40 are sequentially formed on the substrate 10.

In particular, the first epitaxial stack 20 and the ohmic electrode 25p' are formed on a first temporary substrate. The first temporary substrate may be a semiconductor substrate, e.g., a gallium arsenide (GaAs) substrate, on which the first epitaxial stack 20 may be grown. The first epitaxial stack 20 is manufactured by forming the n-type semiconductor layer, the active layer, and the p-type semiconductor layer on the first temporary substrate. The first insulating layer 81 including a contact hole is formed on the first temporary substrate, and the ohmic electrode 25p' is formed in the contact hole of the first insulating layer 81.

The ohmic electrode 25p' may be formed by forming the first insulating layer 81 on the first temporary substrate, coating a photoresist, patterning the photoresist, depositing a material for the ohmic electrode 25p' on the patterned photoresist, and lifting off the photoresist pattern, for example. In some exemplary embodiments, the ohmic electrode 25p' may be formed by forming the first insulating layer 81, patterning the first insulating layer 81 using a photolithography process, forming a layer for the ohmic electrode 25p' using the material for the ohmic electrode 25p', and patterning the layer for the ohmic electrode 25p' using a photolithography process.

The first p-type contact electrode layer 25p, e.g., the data line 120, is formed on the first temporary substrate on which the ohmic electrode 25p' is formed. The first p-type contact electrode layer 25p may include a reflective material. The first p-type contact electrode layer 25p may be formed by depositing a metal material on the first temporary substrate and patterning the deposited metal material using a photolithography process.

The first epitaxial stack 20 formed on the first temporary substrate is inversely attached to the substrate 10 with the first adhesive layer 61 interposed therebetween.

The first temporary substrate is removed after the first epitaxial stack 20 is attached to the substrate 10. The first temporary substrate may be removed by various methods, such as a wet etch process, a dry etch process, a physical removal process, or a laser lift-off process.

After the first temporary substrate is removed, the first n-type contact electrode 21n is formed on the first epitaxial stack 20. The first n-type contact electrode 21n may be formed by forming a conductive material and patterning the conductive material using a photolithography process or the like.

In some exemplary embodiments, a concave-convex portion may be formed on the upper surface (n-type semiconductor layer) of the first epitaxial stack 20 after the first temporary substrate is removed. The concave-convex portion may be textured through various etching processes. For example, the concave-convex portion may be formed through various processes, such as a dry etch process using a microphotography, a wet etch process using crystal properties, a texturing process using a physical method such as a sandblast, an ion beam etch process, or a texturing process using an etching rate difference of block copolymer.

The second epitaxial stack 30, the second p-type contact electrode layer 35p, and the first wavelength pass filter 71 are formed on a second temporary substrate.

The second temporary substrate may be a sapphire substrate. The second epitaxial stack 30 may be manufactured by forming the n-type semiconductor layer, the active layer, and the p-type semiconductor layer on the second temporary substrate.

The second epitaxial stack 30 formed on the second temporary substrate is inversely attached to the first epitaxial stack 20 with the second adhesive layer 63 interposed therebetween. The second temporary substrate is removed after the second epitaxial stack 30 is attached to the first epitaxial stack 20. The second temporary substrate may be removed by various methods, such as a wet etch process, a dry etch process, a physical removal process, or a laser lift-off process. In some exemplary embodiments, a concave-convex portion may be formed on the upper surface (n-type semiconductor layer) of the second epitaxial stack 30 after the second temporary substrate is removed. The concave-convex portion may be textured through various etching processes or may be formed using the patterned sapphire substrate as the second temporary substrate.

The third epitaxial stack 40, the third p-type contact electrode layer 45p, and the second wavelength pass filter 73 are formed on a third temporary substrate.

The third temporary substrate may be a sapphire substrate. The third epitaxial stack 40 may be manufactured by forming the n-type semiconductor layer, the active layer, and the p-type semiconductor layer on the third temporary substrate.

The third epitaxial stack 40 formed on the third temporary substrate is inversely attached to the second epitaxial stack 30 with the third adhesive layer 65 interposed therebetween. The third temporary substrate is removed after the third epitaxial stack 40 is attached to the second epitaxial stack 30. The third temporary substrate may be removed by various methods, such as a wet etch process, a dry etch process, a physical removal process, or a laser lift-off process. In some exemplary embodiments, a concave-convex portion may be formed on the upper surface (n-type semiconductor layer) of the third epitaxial stack 40 after the third temporary substrate is removed. The concave-convex portion may be textured through various etching processes or may be formed using the patterned sapphire substrate as the second temporary substrate.

The third n-type contact electrode 41*n* is formed on the upper surface of the third epitaxial stack 40. The third n-type contact electrode 41*n* may be formed by forming a conductive material layer on the upper surface of the third epitaxial stack 40 and patterning the conductive material layer using a photolithography process, for example.

Figure 13:
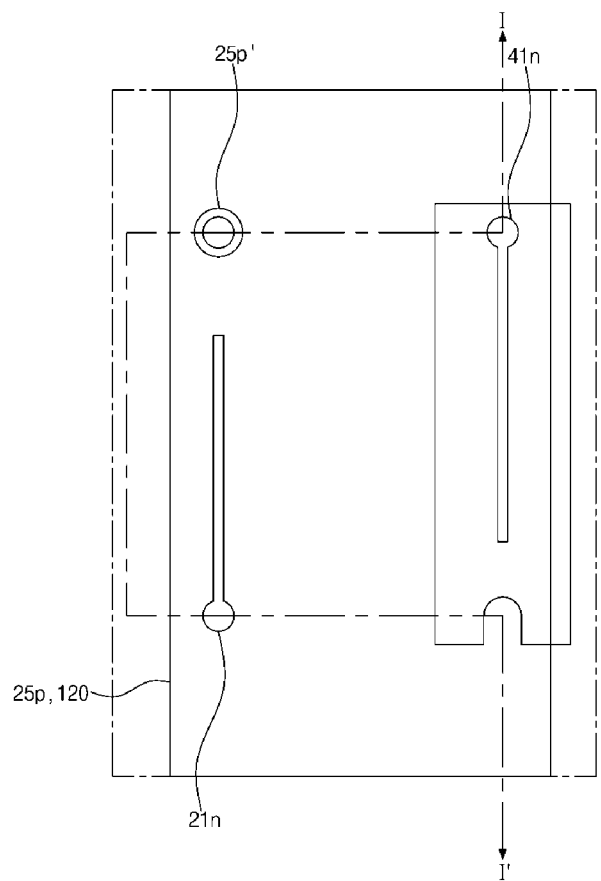
Figure 14:
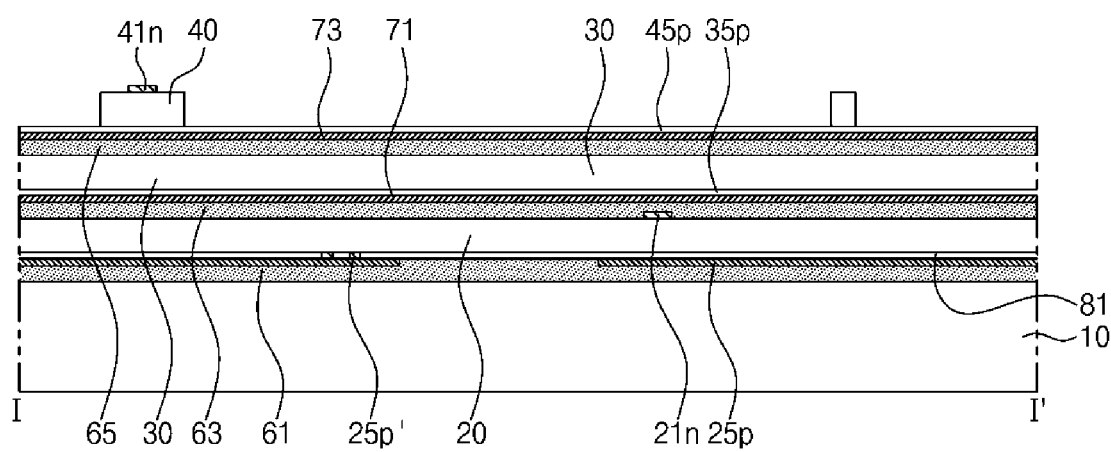

Referring to FIGS. 13 and 14, the third epitaxial stack 40 is patterned. A portion of the third epitaxial stack 40 is removed from a predetermined area of the pixel such that the third epitaxial stack 40 has the area smaller than the first and second epitaxial stacks 20 and 30 to be formed later. In addition, the third epitaxial stack 40 is also removed from an area in which the third p-type contact electrode 45*pc* is to be formed. The third epitaxial stack 40 may be removed by various methods, such as the wet etch process or the dry etch process, using the photolithography process, and in this case, the third p-type contact electrode layer 45*p* acts as an etch stopper.

Figure 15:
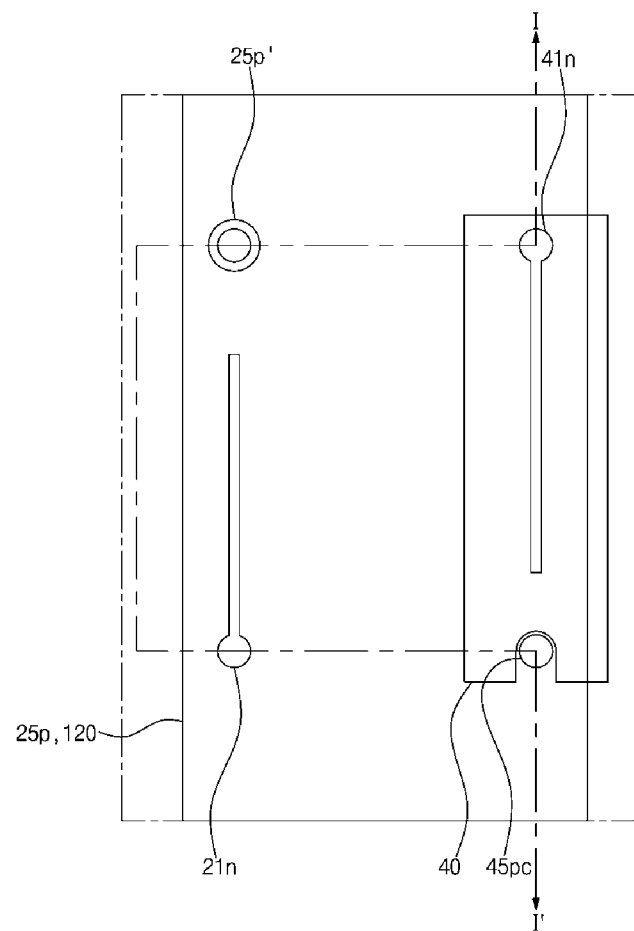
Figure 16:
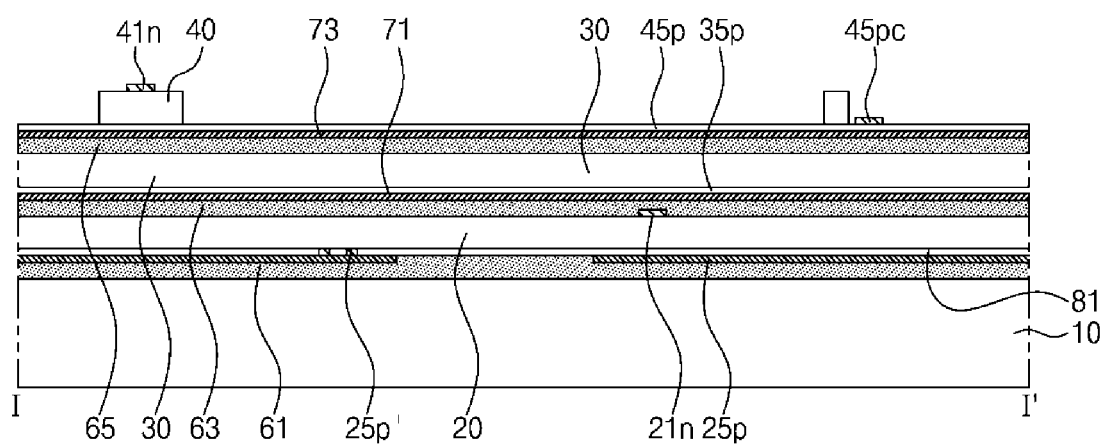

Referring to FIGS. 15 and 16, the third p-type contact electrode 45*pc* is formed on a portion of the third p-type contact electrode layer 45*p* exposed from removing the third epitaxial stack 40. The third p-type contact electrode 45*pc* may be formed by forming a conductive material layer on the upper surface of the substrate 10, on which the third p-type contact electrode layer 45*p* is formed, and patterning the conductive material layer using a photolithography process.

Figure 17:
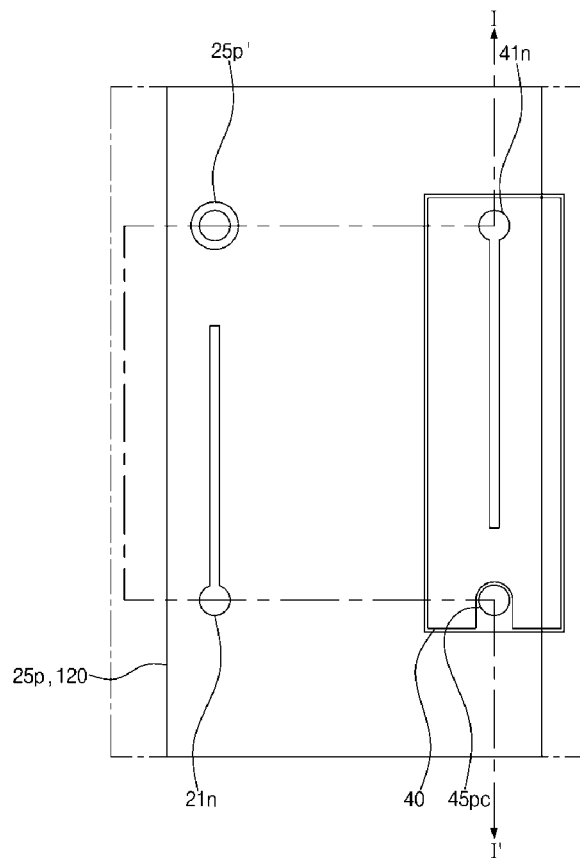
Figure 18:
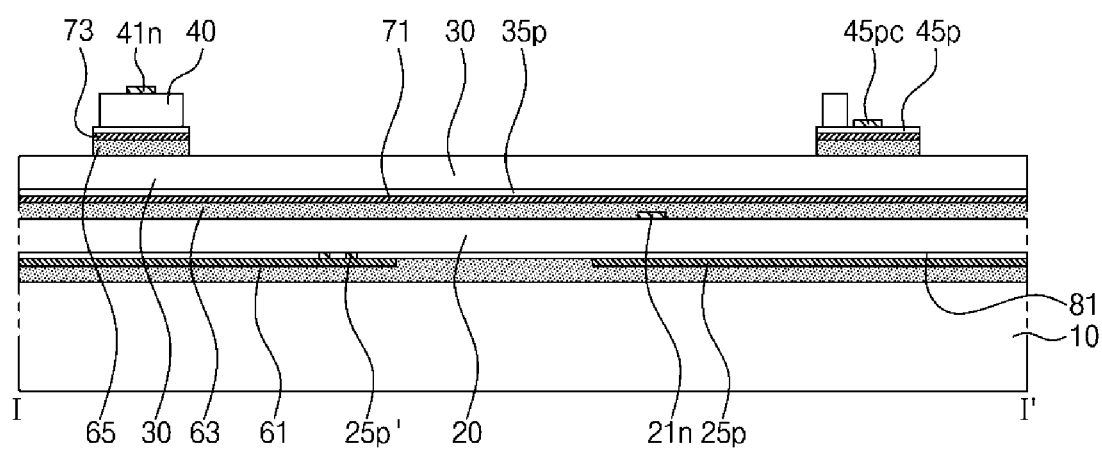

Referring to FIGS. 17 and 18, portions of the third p-type contact electrode layer 45*p*, the second wavelength pass filter 73, and the third adhesive layer 65 are removed from an area except where the third epitaxial stack 40 is formed. Accordingly, the upper surface of the second epitaxial stack 30 is exposed.

The third p-type contact electrode layer 45*p*, the second wavelength pass filter 73, and the third adhesive layer 65 may be removed by various methods, such as the wet etch process or the dry etch process, using the photolithography process.

Figure 19:
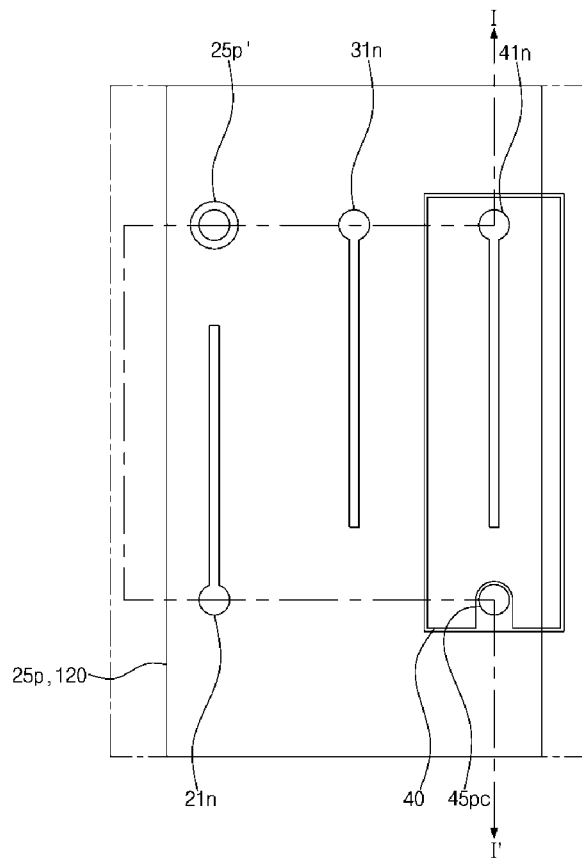
Figure 20:
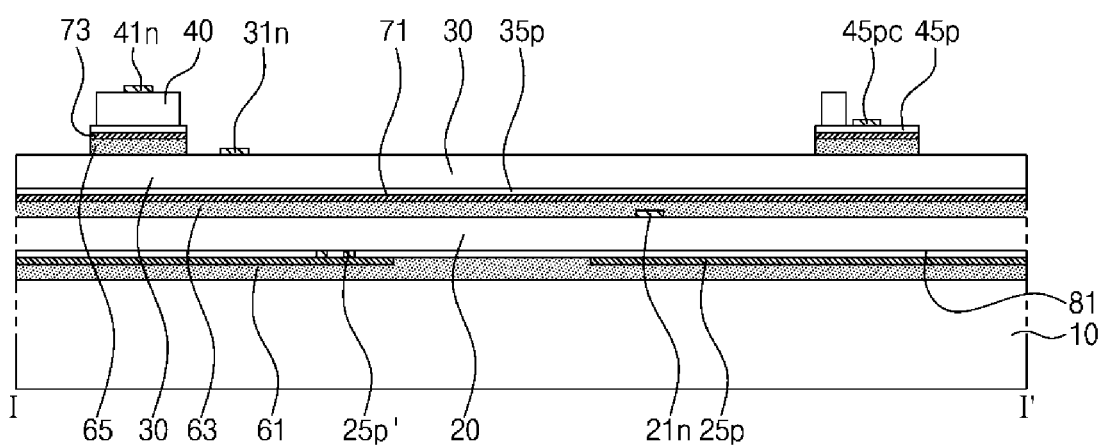

Referring to FIGS. 19 and 20, the second n-type contact electrode 31*n* is formed on the exposed upper surface of the second epitaxial stack 30. The second n-type contact electrode 31*n* may be formed by forming a conductive material layer on the upper surface of the second epitaxial stack 30 and patterning the conductive material layer using a photolithography process, for example.

Figure 21:
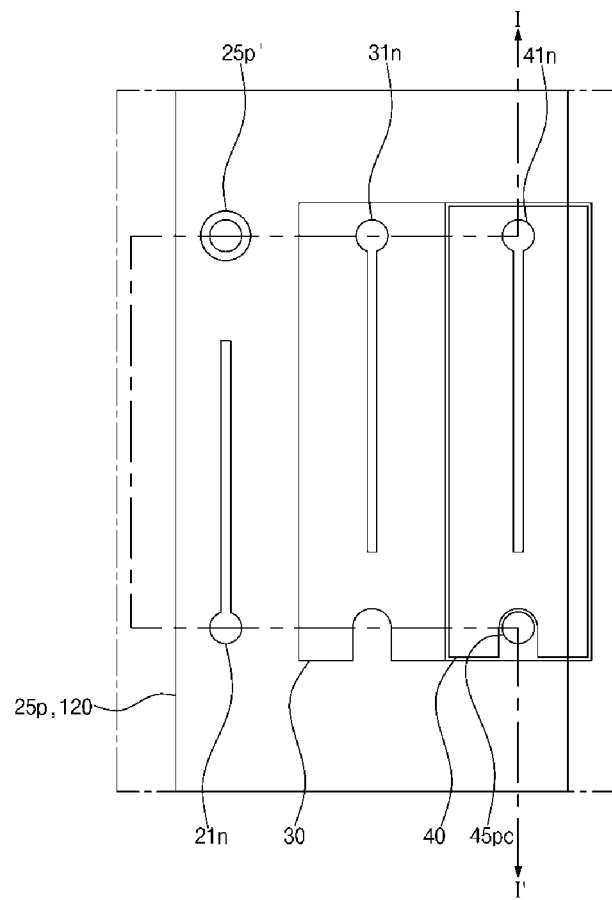
Figure 22:
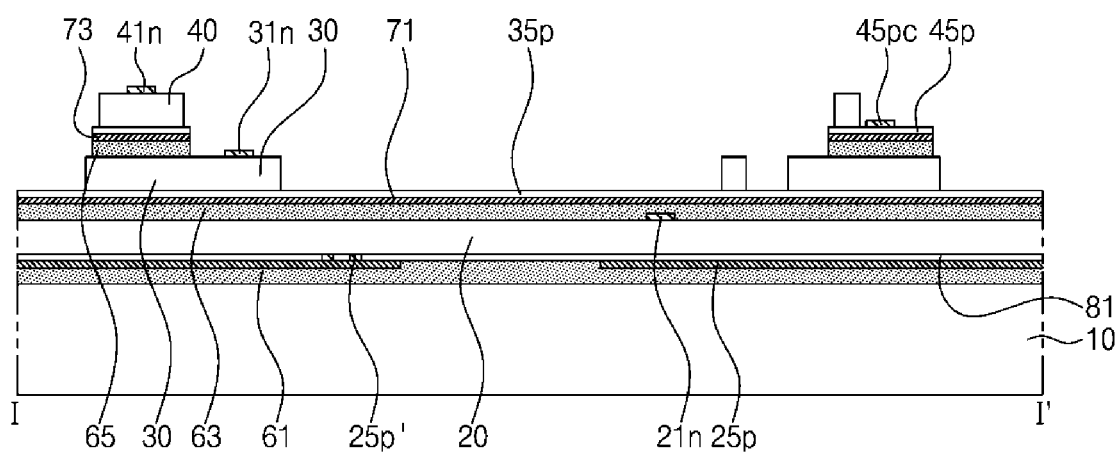

Referring to FIGS. 21 and 22, the second epitaxial stack 30 is patterned. Portions of the second epitaxial stack 30 is removed except for a predetermined area of the pixel, such that the second epitaxial stack 30 has the area smaller than the first epitaxial stack 20 which is to be formed later. In addition, the second epitaxial stack 30 is also removed from an area in which the second p-type contact electrode 35*pc* is formed. The second epitaxial stack 30 may be removed by various methods, such as the wet etch process or the dry etch process, using the photolithography process, and in this case, the second p-type contact electrode layer 35*p* acts as an etch stopper.

Figure 23:
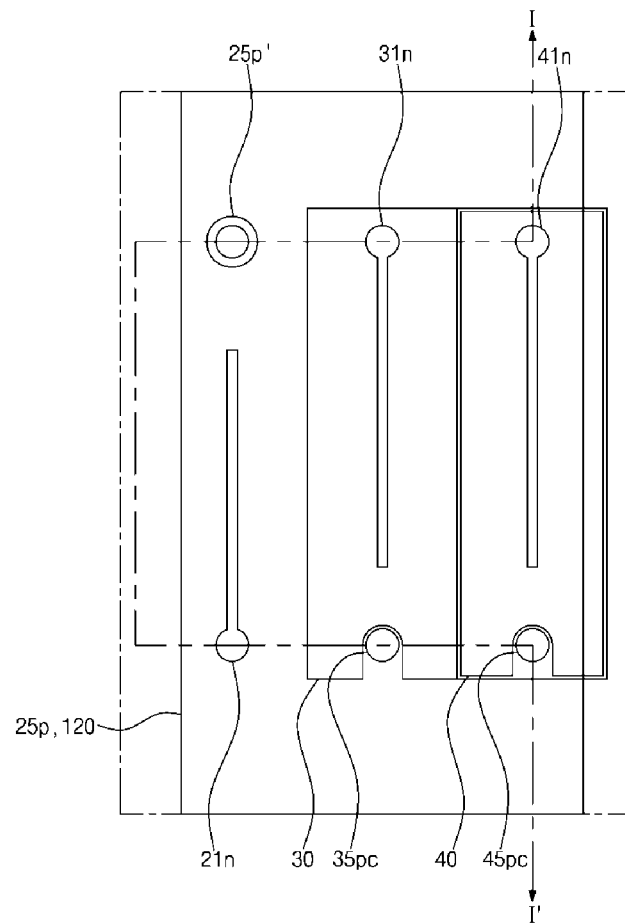
Figure 24:
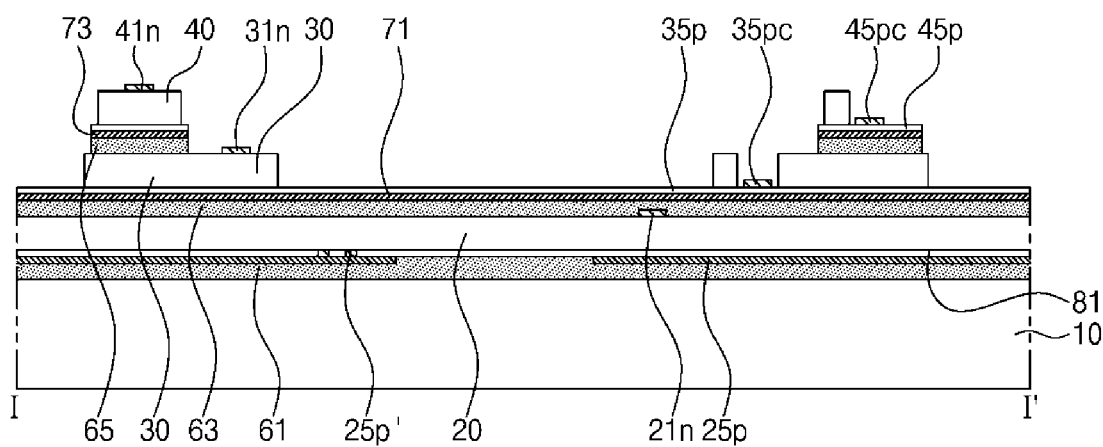

Referring to FIGS. 23 and 24, the second p-type contact electrode 35*pc* is formed on the second p-type contact electrode layer 35*p* from which the portion of the second epitaxial stack 30 is removed. The second p-type contact electrode 35*pc* may be formed by forming a conductive material layer on the upper surface of the substrate 10, on which the second p-type contact electrode layer 35*p* is formed, and patterning the conductive material layer using a photolithography process, for example.

The third n-type contact electrode 41*n*, the third p-type contact electrode 45*pc*, the second n-type contact electrode 31*n*, and the second p-type contact electrode 35*pc* may be respectively formed through separate mask processes as described above, however, the inventive concepts are not limited thereto. More particularly, the third n-type contact electrode 41*n* is formed before the third epitaxial stack 40 is patterned, the third p-type contact electrode 45*pc* is formed after the third epitaxial stack 40 is patterned, the second n-type contact electrode 31*n* is formed before the second epitaxial stack 30 is patterned, and the second p-type contact electrode 35*pc* is formed after the second epitaxial stack 30 is patterned, however the method for forming the contact electrodes may be variously modified.

For example, in some exemplary embodiments, the third n-type contact electrode 41*n*, the third p-type contact electrode 45*pc*, the second n-type contact electrode 31*n*, and the second p-type contact electrode 35*pc* may be substantially simultaneously formed through a single mask process after the third epitaxial stack 40 and the second epitaxial stack 30 are sequentially patterned. When the third n-type contact electrode 41*n* and the second n-type contact electrode 31*n* are formed of a different material from the third p-type contact electrode 45*pc* and the second p-type contact electrode 35*pc*, two types of contact electrodes may be formed using different masks from each other. In particular, after the third epitaxial stack 40 and the second epitaxial stack 30 are sequentially patterned, the third n-type contact electrode 41*n* and the second n-type contact electrode 31*n* may be substantially simultaneously formed through a single mask process, and the third p-type contact electrode 45*pc* and the second p-type contact electrode 35*pc* may be substantially simultaneously formed through another single mask process.

Figure 25:
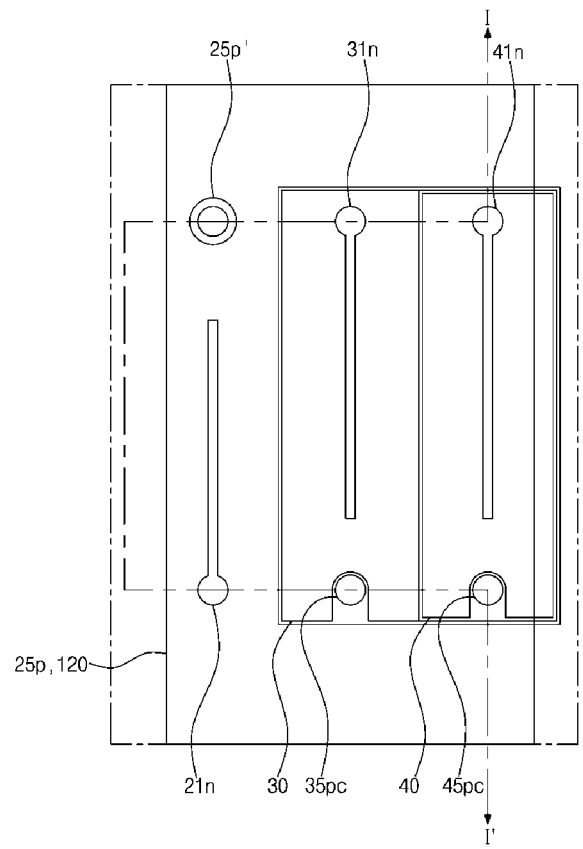
Figure 26:
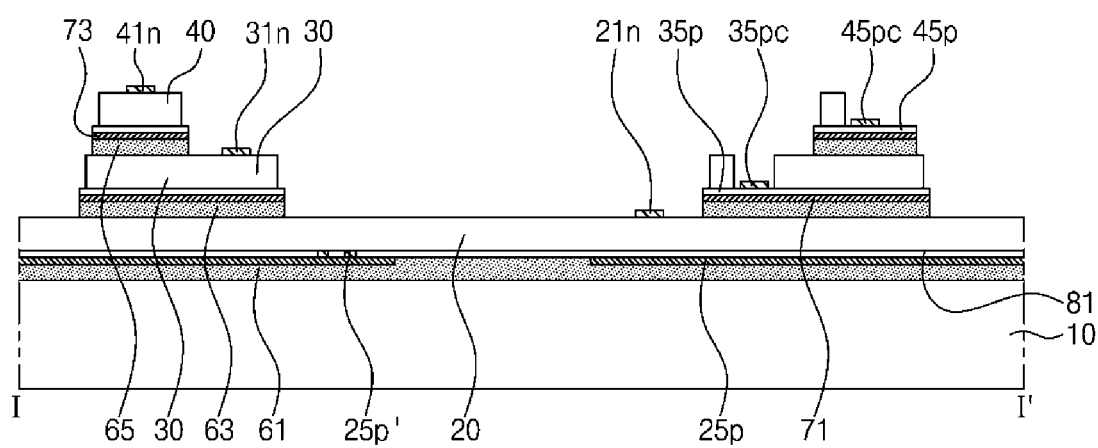

Referring to FIGS. 25 and 26, portions of the second p-type contact electrode layer 35*p*, the first wavelength pass filter 71, and the second adhesive layer 63 are removed from areas except for the area in which the second epitaxial stack 30 is disposed. Accordingly, the upper surface of the first epitaxial stack 20 is exposed. The second p-type contact electrode layer 35*p*, the first wavelength pass filter 71, and the second adhesive layer 63 may be removed by various methods, such as the wet etch process or the dry etch process, using the photolithography process. Through the etch process, the first n-type contact electrode 21*n* disposed on the upper surface of the first epitaxial stack 20 is exposed.

Figure 27:
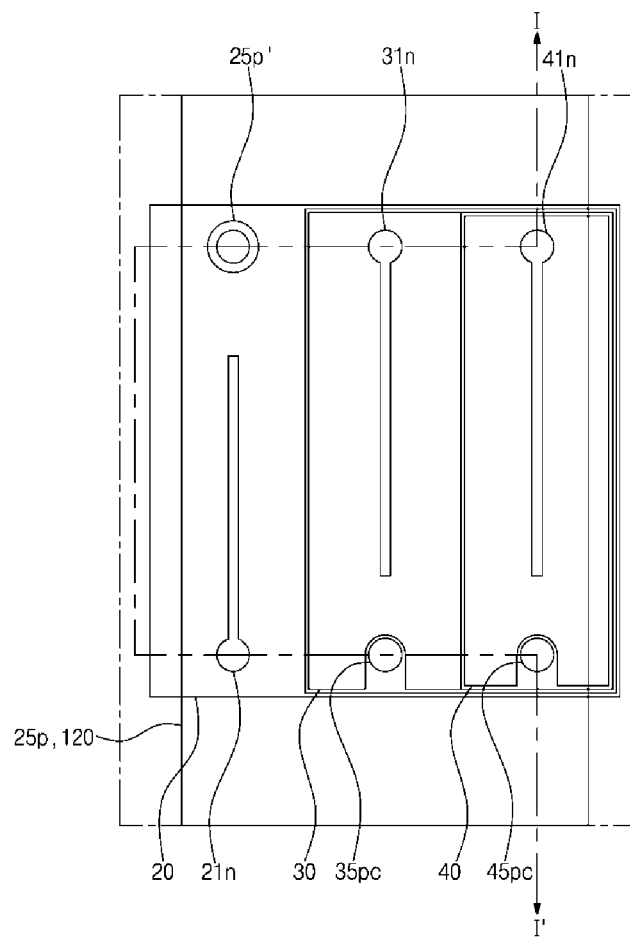
Figure 28:
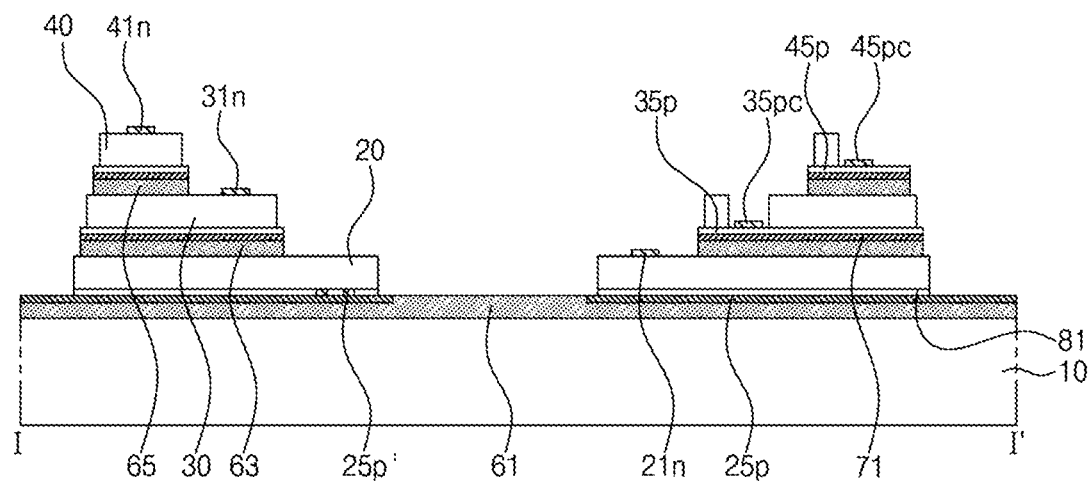

Referring to FIGS. 27 and 28, the first epitaxial stack 20 is patterned. The first epitaxial stack 20 has the largest area among the epitaxial stacks. The first epitaxial stack 20 may be removed by various methods, such as the wet etch process or the dry etch process, using the photolithography process.

In this case, the first insulating layer 81 may be substantially simultaneously or additionally removed, and the upper surface of the first p-type contact electrode 25p, e.g., the data line, is exposed.

Figure 29:
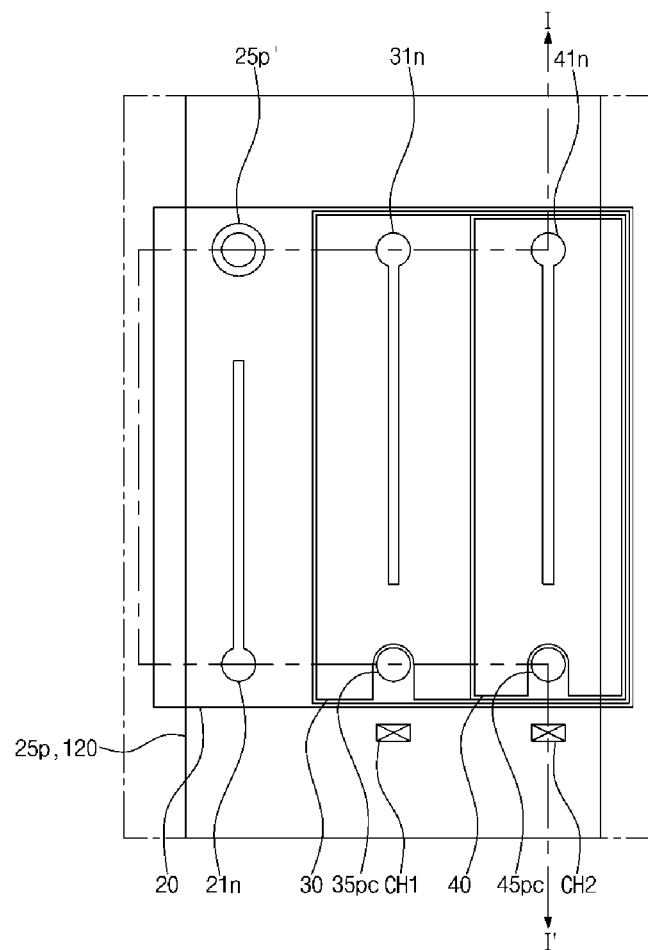
Figure 30:
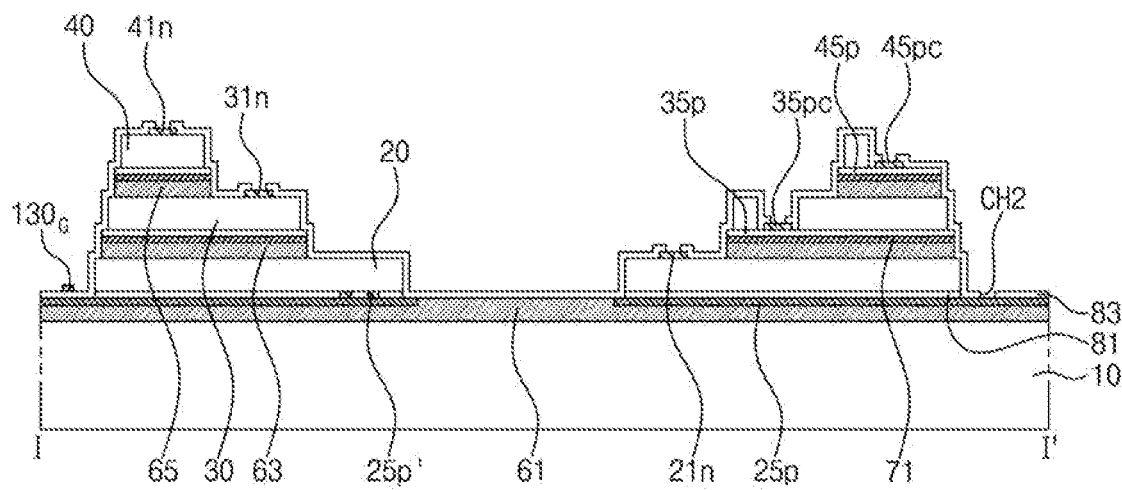

Referring to FIGS. 29 and 30, the second insulating layer 83 having the contact holes are formed on the patterned first, second, and third epitaxial stacks 20, 30, and 40.

The contact holes are formed at positions corresponding to the first, second, and third n-type contact electrodes 21n, 31n, and 41n and the first to third p-type contact electrodes 25pc, 35pc, and 45pc to expose portions of the first, second, and third n-type contact electrodes 21n, 31n, and 41n and the first to third p-type contact electrodes 25pc, 35pc, and 45pc. The second insulating layer 83 having the contact holes may be formed by a photolithography process, for example.

Figure 31:
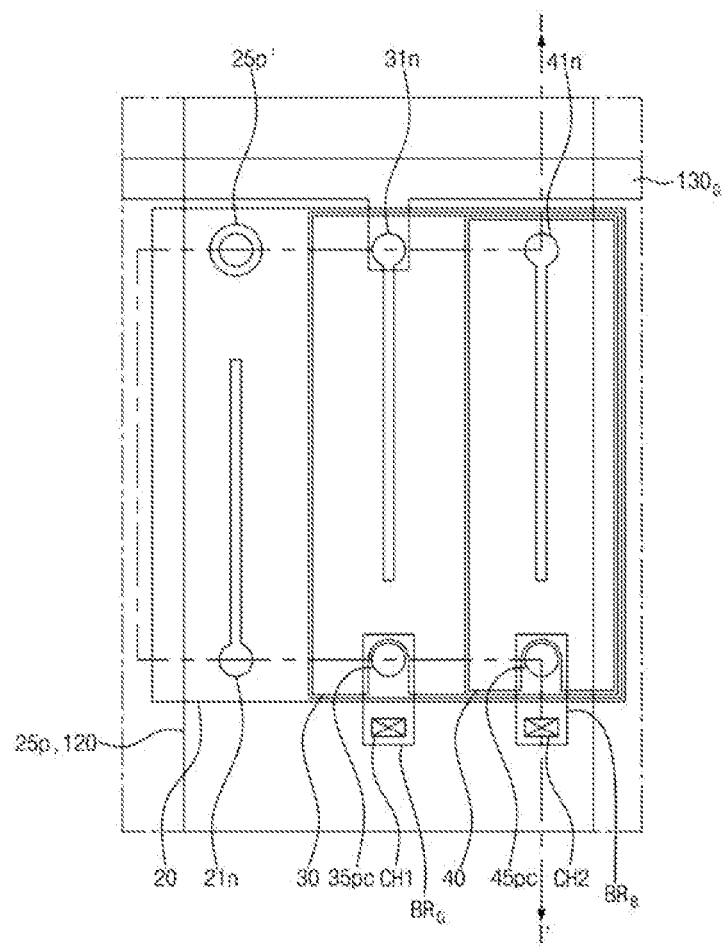
Figure 32:
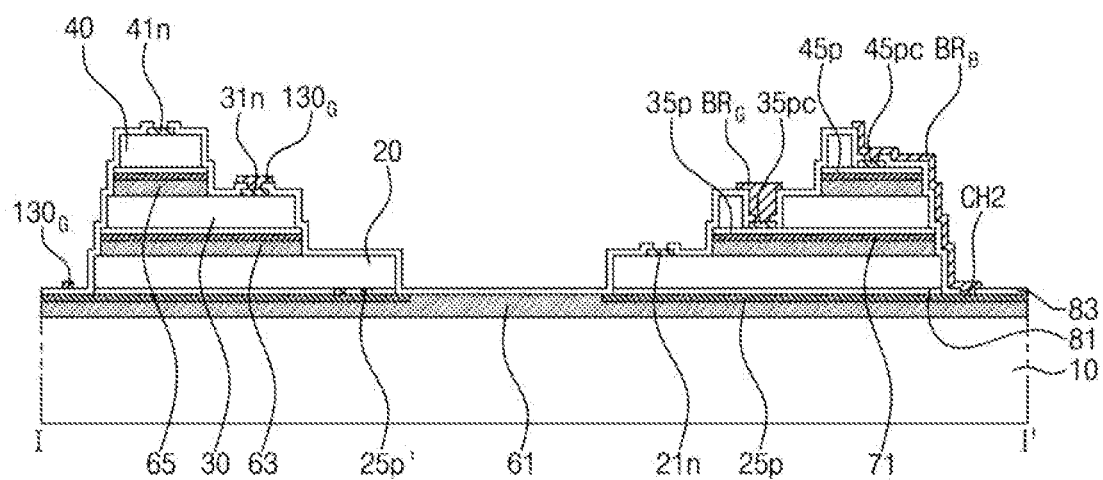

Referring to FIGS. 31 and 32, the second scan line $130_G$, the first bridge electrode $BR_G$, and the second bridge electrode $BR_B$ are formed on the second insulating layer 83. The second scan line $130_G$ is connected to the second n-type contact electrode 31n through the contact hole defined corresponding to the second n-type contact electrode 31n. One end of the first bridge electrode $BR_G$ is connected to the second p-type contact electrode 35pc through the contact hole defined corresponding to the second p-type contact electrode 35pc, and the other end of the first bridge electrode $BR_G$ is connected to the first p-type contact electrode layer 25p (e.g., the data line 120) through the first contact hole CH1 defined above the first p-type contact electrode layer 25p. One end of the second bridge electrode $BR_B$ is connected to the third p-type contact electrode 45pc through the contact hole defined corresponding to the third p-type contact electrode 45pc, and the other end of the second bridge electrode $BR_B$ is connected to the first p-type contact electrode layer 25p (e.g., the data line 120) through the second contact hole CH2 defined above the first p-type contact electrode layer 25p.

Figure 33:
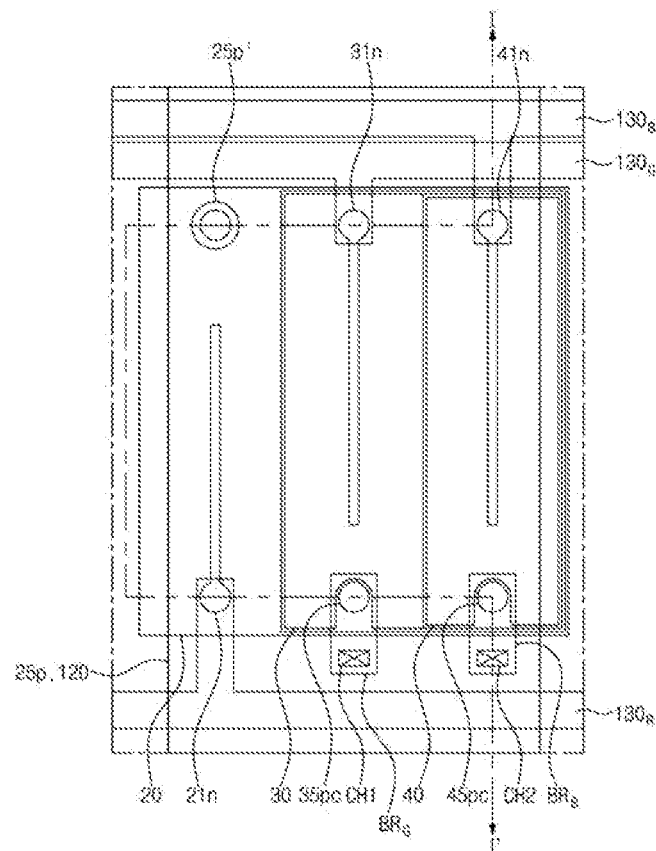
Figure 34:
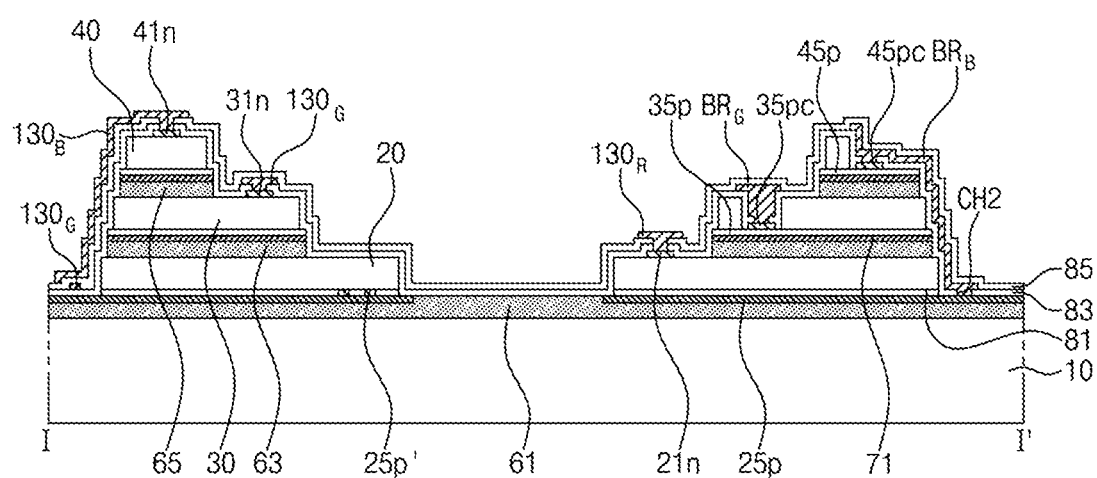

Referring to FIGS. 33 and 34, the third insulating layer 85 having the contact holes are formed on the second insulating layer 83.

The contact holes are formed at positions corresponding to the first and third n-type contact electrodes 21n and 41n to expose portions of the first and third n-type contact electrodes 21n and 41n. The third insulating layer 85 having the contact holes may be formed by a photolithography process, for example.

The first and third scan lines $130_R$ and $130_B$ are formed on the third insulating layer 85. The first scan lines $130_R$ is connected to the first n-type contact electrode 21n through the contact hole defined corresponding to the first n-type contact electrode 21n. The third scan lines $130_B$ is connected to the third n-type contact electrode 41n through the contact hole defined corresponding to the third n-type contact electrode 41n.

In some exemplary embodiments, the sequence of forming the first, second, and third scan lines $130_R$, $130_G$, and $130_B$ and the first and second bridge electrodes $BR_G$ and $BR_B$ may be variously modified. More particularly, while the second scan line $130_G$ and the first and second bridge electrodes $BR_G$ and $BR_B$ are described as being formed through the same process, and then the first and third scan lines 13 OR and $130_B$ are formed, however, in some exemplary embodiments, the third scan line $130_B$ may be formed after the first and second scan lines $130_R$ and $130_G$ are formed through the same process. As another example, the second scan line $130_G$ may be formed after the first and third scan lines $130_R$ and $130_B$ are formed through the same process. In addition, the first and/or second bridge electrodes $BR_G$ and $BR_B$ may be formed together with any of the operations of forming the first, second, and third scan lines $130_R$, $130_G$, and $130_B$.

Further, the contact part of each of the epitaxial stacks 20, 30, and 40 may be formed on different positions, and thus, the positions of the first, second, and third scan lines $130_R$, $130_G$, and $130_B$ and the first and second bridge electrodes $BR_G$ and $BR_B$ may be changed.

In some exemplary embodiments, a non-light transmitting layer may be further disposed on the second insulating layer 83 or the third insulating layer 85 in the area corresponding to the side surface of the pixel. The non-light transmitting layer may be formed by the distributed Bragg reflector (DBR) dielectric mirror, the metal reflection layer formed on the insulating layer, or the organic polymer layer. When the metal reflection layer is used as the non-light transmitting layer, the metal reflection layer may be in the floating state so as to be electrically insulated from components of other pixels. The non-light transmitting layer may be formed by depositing two or more insulating layers having different refractive indices from each other. For example, the non-light transmitting layer may be formed by sequentially stacking a material having a relatively low refractive index and a material having a relatively high refractive index or by alternately stacking insulating layers having different refractive indices from each other. The materials having different refractive indices from each other may include, for example, $SiO_2$ and $SiN_x$.

As described above, in the display device according to the exemplary embodiments, the epitaxial stacks may be sequentially stacked, and then the contact with the line part may be substantially simultaneously formed in the epitaxial stacks.

In exemplary embodiments, the first scan line and the third scan line may be formed through the same process, the second scan line and the third scan line may be formed through the same process, or the first, second, and third scan lines may be formed through different processes, respectively.

Figure 35:
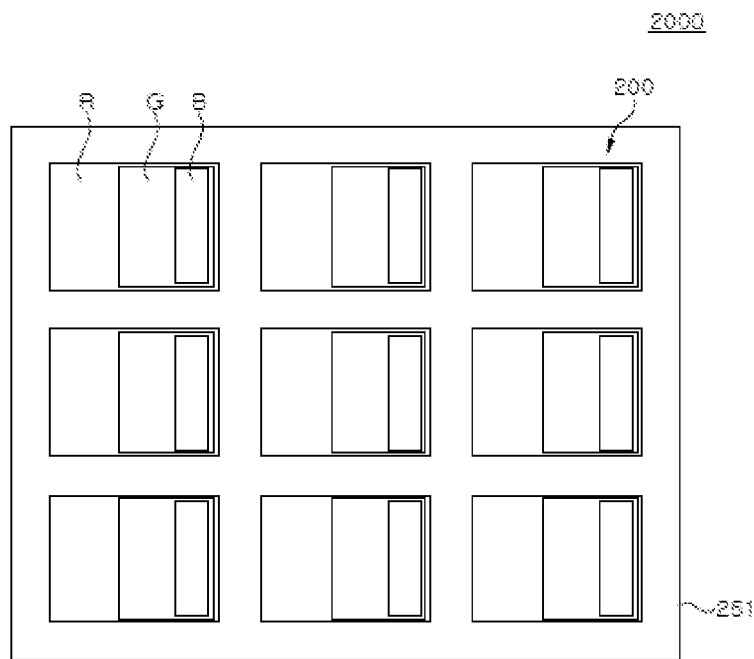
FIG. 35 is a schematic plan view of a display apparatus according to an exemplary embodiment.
Figure 36:
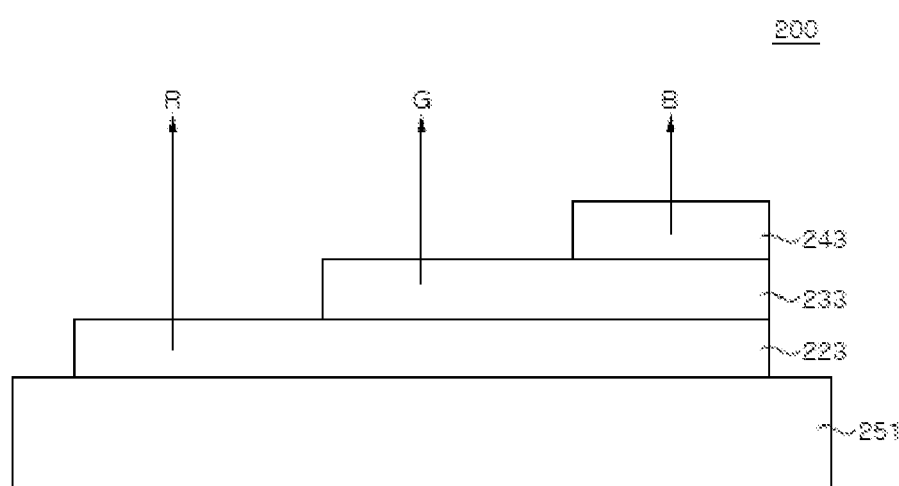
FIG. 36 is a schematic cross-sectional view of a light emitting diode pixel for a display according to an exemplary embodiment.

FIG. 35 is a schematic plan view of a display apparatus according to an exemplary embodiment, and FIG. 36 is a schematic cross-sectional view of a light emitting diode pixel for a display according to an exemplary embodiment.

Referring to FIG. 35, the display apparatus 2000 includes a support substrate 251 and a plurality of pixels 200 arranged on the support substrate 251. Each of the pixels 200 includes first to third subpixels R, G, B.

Referring to FIG. 36, the support substrate 251 supports LED stacks 223, 233, 243. The support substrate 251 may include a circuit on a surface thereof or therein, but is not limited thereto. The support substrate 251 may include, for example, a Si substrate or a Ge substrate.

The first subpixel R includes a first LED stack 223, the second subpixel G includes a second LED stack 233, and the third subpixel B includes a third LED stack 243. The first subpixel R emits light through the first LED stack 223, the second subpixel G emits light through the second LED stack 233, and the third subpixel B emits light through the third LED stack 243. The first to third LED stacks 223, 233, 243 can be independently driven.

The first LED stack 223, the second LED stack 233 and the third LED stack 243 are stacked one above another in the vertical direction so as to overlap each other. In particular, the second LED stack 233 is disposed in some region on the first LED stack 223. As shown in the drawings, the second LED stack 233 may be disposed towards one side on the first LED stack 223. In addition, the third LED stack 243 is disposed in some region on the second LED stack 233. As shown in the drawings, the third LED stack 243 may be disposed towards one side on the second LED stack 233. Although the second and third LED stacks 233 and 243 are shown as being disposed (biased) towards the right side in the drawings, the inventive concepts are not limited thereto, and at least one of the second and third LED stacks 233 and 243 may be disposed towards to the left side.

Light R generated from the first LED stack 223 may be emitted through a region of the first LED stack 223 not covered by the second LED stack 233, and light G generated from the second LED stack 233 may be emitted through a region of the second LED stack 233 not covered by the third LED stack 243. More particularly, light generated from the first LED stack 223 may be emitted outside without passing through the second LED stack 233 and the third LED stack 243, and light generated from the second LED stack 233 may be emitted outside without passing through the third LED stack 243.

In addition, an area of a region of the first LED stack 223 through which light R is emitted, an area of a region of the second LED stack 233 through which light G is emitted, and an area of the third LED stack may be different from one another, and the luminous intensity of light emitted from each of the LED stacks 223, 233, 243 may be adjusted through adjustment of the light emitting areas.

Figure 37:
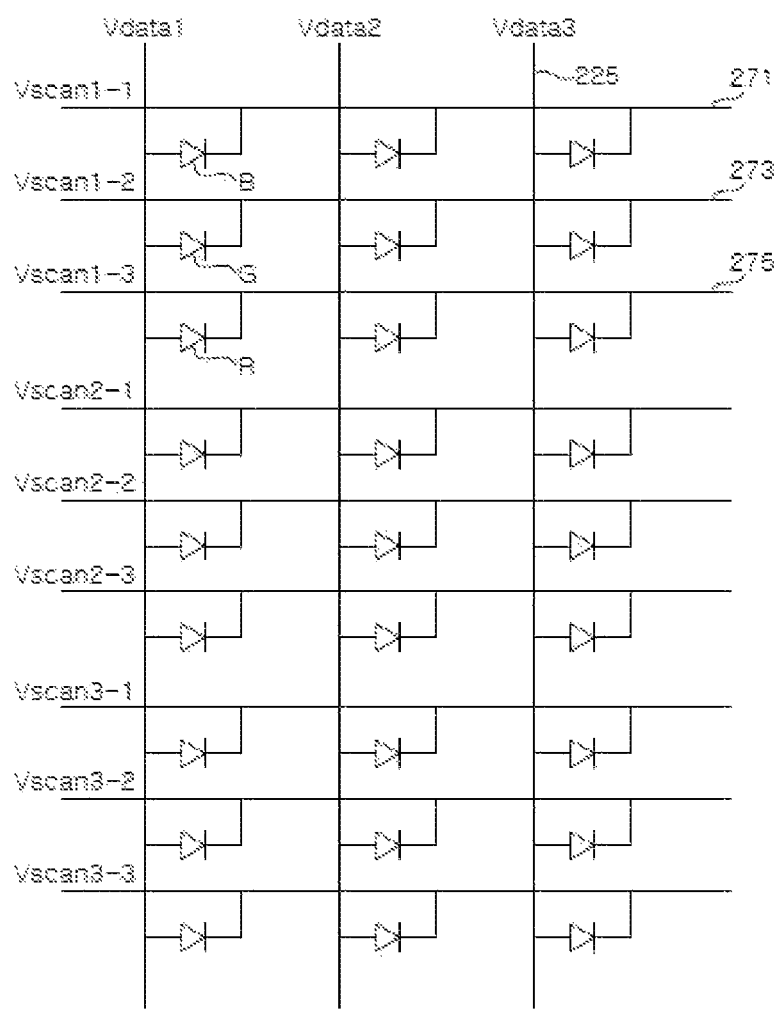
FIG. 37 is a schematic circuit diagram of a display apparatus according to an exemplary embodiment.

Each of the first LED stack 223, the second LED stack 233 and the third LED stack 243 includes an n-type semiconductor layer, a p-type semiconductor layer, and an active layer interposed therebetween. The active layer may have a multi-quantum well layer structure. The first to third LED stacks 223, 233, 243 may include different active layers to emit light having different wavelengths. For example, the first LED stack 223 may be an inorganic light emitting diode emitting red light, the second LED stack 233 may be an inorganic light emitting diode emitting green light, and the third LED stack 243 may be an inorganic light emitting diode emitting blue light. In this case, the first LED stack 223 may include a GaInP-based well layer, and the second LED stack 233 and the third LED stack 243 may include GaInN-based well layers. However, the inventive concepts are not limited thereto. When the pixel includes a micro LED, which has a surface area less than about 10,000 square μm as known in the art, or less than about 4,000 square μm or 2,500 square μm in other exemplary embodiments, the first LED stack 223 may emit any one of red, green, and blue light, and the second and third LED stacks 233 and 243 may emit a different one of red, green, and blue light, without adversely affecting operation, due to the small form factor of a micro LED. FIG. 37 is a schematic circuit diagram of a display apparatus according to an exemplary embodiment.

Referring to FIG. 37, the display apparatus according to an exemplary embodiment may be driven in a passive matrix manner. As described with reference to FIG. 35 and FIG. 36, one pixel includes first to third subpixels R, G, B. The first LED stack 223 of the first subpixel R emits light having a first wavelength, the second LED stack 233 of the second subpixel G emits light having a second wavelength, and the third LED stack 243 of the third subpixel B emits light having a third wavelength. Anodes of the first to third subpixels R, G, B may be connected to a common line, for example, a data line Vdata 225, and cathodes thereof may be connected to different lines, for example, scan lines Vscan 271, 273, 275.

For example, in the first pixel, the anodes of the first to third subpixels R, G, B are commonly connected to the data line Vdata1 and the cathodes thereof are connected to scan lines Vscan1-1, Vscan1-2, Vscan1-3, respectively. Accordingly, the subpixels R, G, B in the same pixel can be individually driven.

In addition, each of the LED stacks 223, 233, 243 may be driven by pulse width modulation or by changing the magnitude of electric current, thereby enabling regulation of brightness of each subpixel. Alternatively, brightness may be adjusted through adjustment of the areas of the first to third LED stacks 223, 233, 243, and the areas of the region of the first to third LED stacks 223, 233, 243 through which light is emitted. For example, an LED stack emitting light having low visibility, for example, the first LED stack 223, may be formed to have a larger area than the second LED stack 233 or the third LED stack 243 to emit light having higher luminous intensity under the same current density. In addition, since the area of the second LED stack 233 is larger than the third LED stack 243, the second LED stack 233 can emit light having higher luminous intensity than the third LED stack 243 under the same current density. In this manner, the luminous intensity of light emitted from the first to third LED stacks 223, 233, 243 may be adjusted depending upon visibility thereof by adjusting the areas of the second LED stack 233 and the third LED stack 243.

Figure 38:
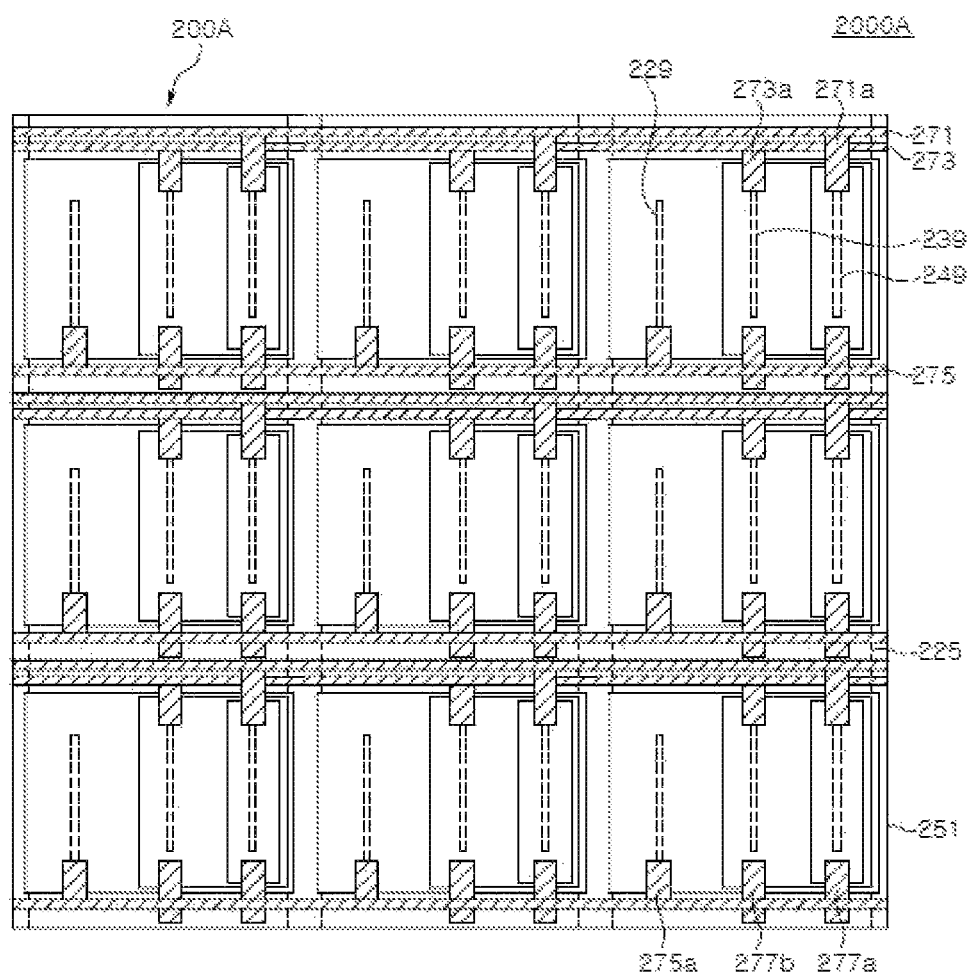
FIG. 38 is a schematic plan view of a display apparatus according to an exemplary embodiment.
Figure 39:
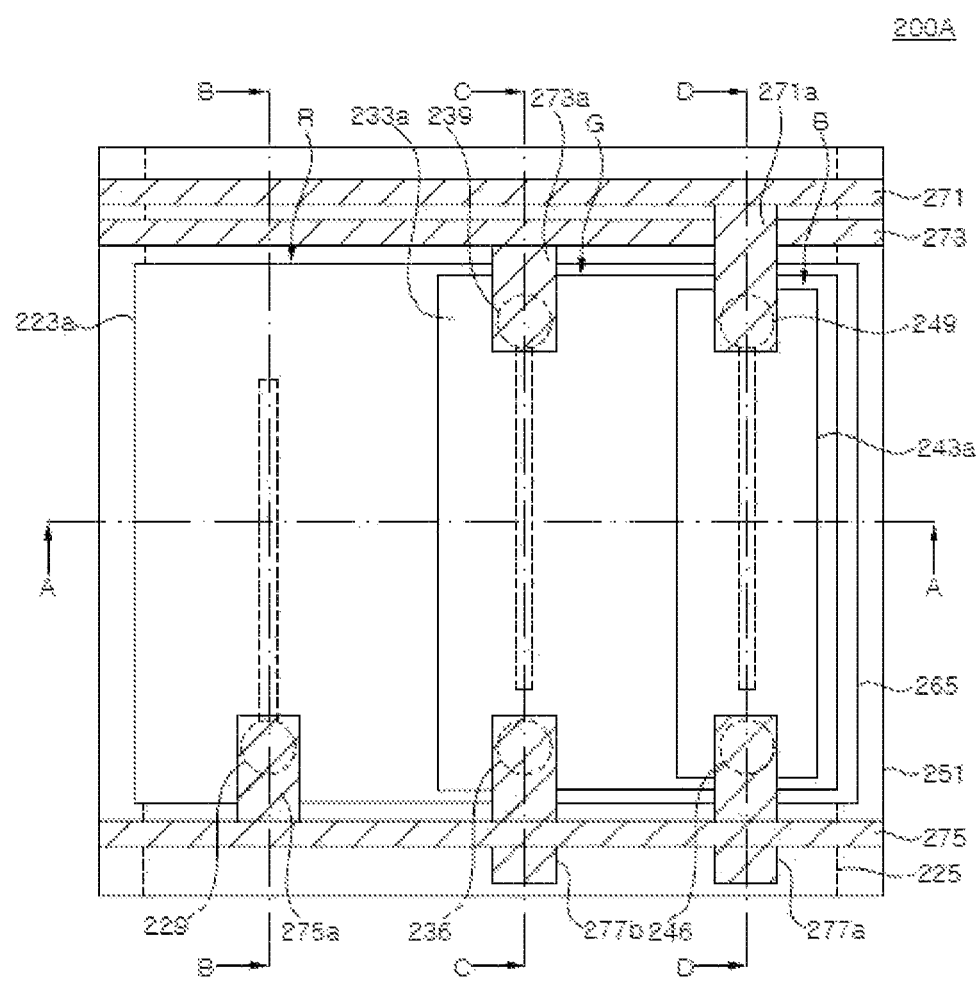
FIG. 39 is an enlarged plan view of one pixel of the display apparatus of FIG. 38.

FIG. 38 is a schematic plan view of a display apparatus according to an exemplary embodiment. FIG. 39 is an enlarged plan view of one pixel of the display apparatus shown in FIG. 38, and FIG. 40A, FIG. 40B, FIG. 40C and FIG. 40D are schematic cross-sectional views taken along lines A-A, B-B, C-C and D-D of FIG. 39, respectively.

Referring to FIG. 38, FIG. 39, FIG. 40A, FIG. 40B, FIG. 40C and FIG. 40D, the display apparatus 2000A according to an exemplary embodiment may include a support substrate 251, a plurality of pixels 200A, first to third subpixels R, G, B, a first LED stack 223, a second LED stack 233, a third LED stack 243, a reflective electrode (first-2 ohmic electrode) 225, a first-1 ohmic electrode 229, a second-1 ohmic electrode 239, a second-2 ohmic electrode 235, a third-1 ohmic electrode 249, a third-2 ohmic electrode 245, electrode pads 236, 246, a first bonding layer 253, a second bonding layer 237, a third bonding layer 247, a first transparent insulation layer 261, a first reflection layer 263, a second transparent insulation layer 265, a second reflection layer 267, a lower insulation layer 268, an upper insulation layer 269, interconnection lines 271, 273, 275, and connecting portions 271a, 273a, 275a, 277a, 277b.

Each of the subpixels R, G, B is connected to the reflective electrode 225 and the interconnection lines 271, 273, 275. As shown in FIG. 37, the reflective electrode 225 may be used as a data line Vdata and the interconnection lines 271, 273, 275 may be used as scan lines Vscan.

As shown in FIG. 38, the pixels may be arranged in a matrix, in which anodes of the subpixels R, G, B in each pixel are commonly connected to the reflective electrode 225 and cathodes thereof are connected to the interconnection lines 271, 273, 275 separated from each other. The connecting portions 271a, 273a, 275a may connect the interconnection lines 271, 273, 275 to the subpixels R, G, B.

The support substrate 251 supports the LED stacks 223, 233, 243. The support substrate 251 may include a circuit on a surface thereof or therein, but is not limited thereto. The support substrate 251 may include, for example, a glass substrate, a sapphire substrate, a Si substrate, or a Ge substrate.

The first LED stack 223 includes a first conductivity type semiconductor layer 223a and a second conductivity type semiconductor layer 223b, the second LED stack 233 includes a first conductivity type semiconductor layer 233a and a second conductivity type semiconductor layer 233b, and the third LED stack 243 includes a first conductivity type semiconductor layer 243a and a second conductivity type semiconductor layer 243b. In addition, active layers may be interposed between the first conductivity type semiconductor layers 223a, 233a, 243a and the second conductivity type semiconductor layers 223b, 233b, 243b, respectively.

In an exemplary embodiment, each of the first conductivity type semiconductor layers 223a, 233a, 243a may be an n-type semiconductor layer and each of the second conductivity type semiconductor layers 223b, 233b, 243b may be a p-type semiconductor layer. A roughened surface may be formed on a surface of at least one of the first conductivity type semiconductor layers 223a, 233a, 243a by surface texturing. In some exemplary embodiments, the semiconductor types in each of the LED stacks may be variously modified.

The first LED stack 223 is disposed near the support substrate 251. The second LED stack 233 is disposed above the first LED stack 223, and the third LED stack 243 is disposed above the second LED stack 233. In addition, the second LED stack 233 is disposed in some region on the first LED stack 223 such that the first LED stack 223 partially overlaps the second LED stack 233. In addition, the third LED stack 243 is disposed in some region on the second LED stack 233 such that second LED stack 233 partially overlaps the third LED stack 243. Accordingly, light generated from the first LED stack 223 may be emitted outside without passing through the second and third LED stacks 233, 243. In addition, light generated from the second LED stack 233 may be emitted outside without passing through the third LED stack 243.

Details of materials forming the first LED stack 223, the second LED stack 233 and the third LED stack 243 are substantially the same as those described with reference to FIG. 36, and thus, detailed descriptions thereof will be omitted to avoid redundancy.

The reflective electrode 225 forms ohmic contact with a lower surface of the first LED stack 223, in particular, the second conductivity type semiconductor layer 223b thereof. The reflective electrode 225 includes a reflection layer to reflect light emitted from the first LED stack 223. As shown in the drawings, the reflective electrode 225 may cover substantially the entire lower surface of the first LED stack. Furthermore, the reflective electrode 225 may be commonly connected to the plurality of pixels 200a and may be used as the data line Vdata.

The reflective electrode 225 may be formed of, for example, a material layer forming ohmic contact with the second conductivity type semiconductor layer 223b of the first LED stack 223 and may include a reflection layer that may reflect light generated from the first LED stack 223, for example, red light.

The reflective electrode 225 may include an ohmic reflection layer and may be formed of, for example, an Au—Zn alloy or an Au—Be alloy. These alloys have high reflectance with respect to light in the red range and form ohmic contact with the second conductivity type semiconductor layer 223b.

Figure 40A:
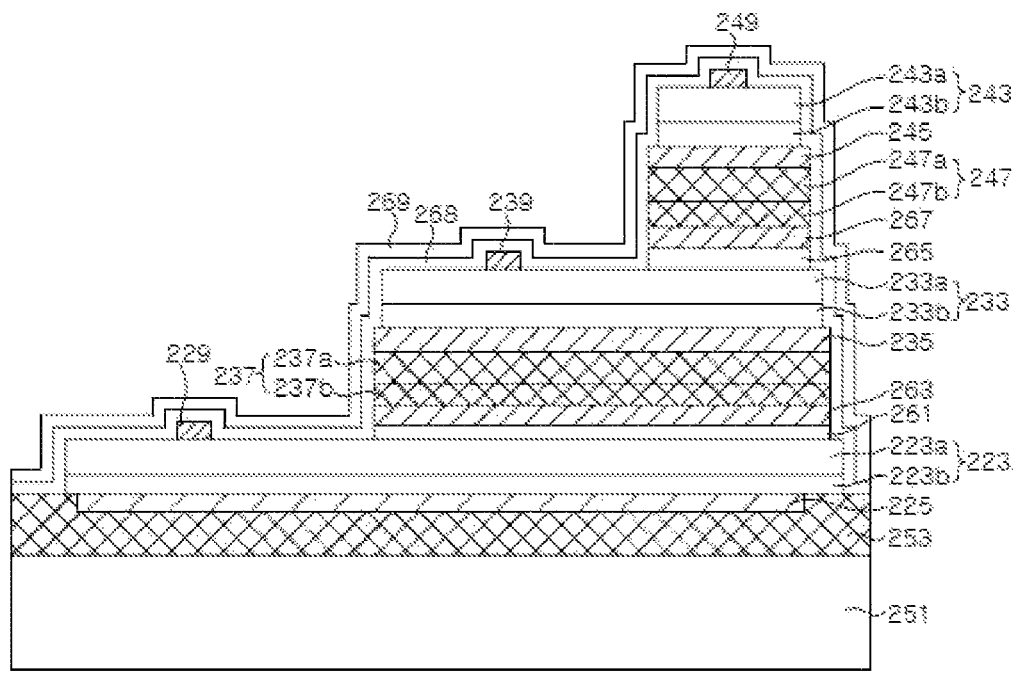
FIG. 40A is a schematic cross-sectional view taken along line A-A of FIG. 39.
Figure 40B:
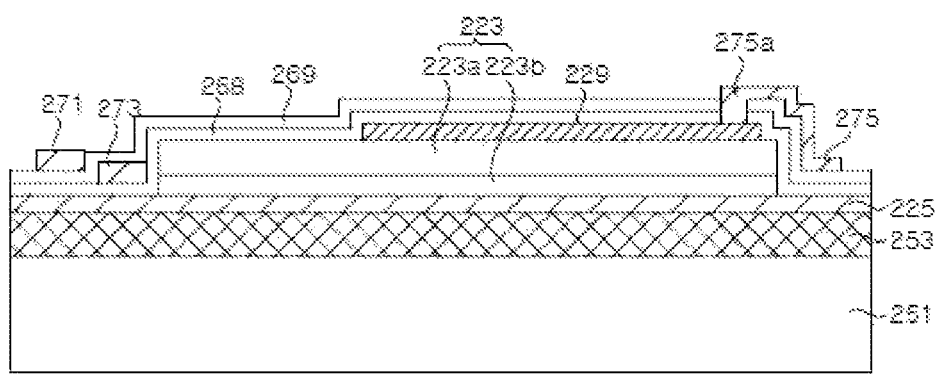
FIG. 40B is a schematic cross-sectional view taken along line B-B of FIG. 39.

The first-1 ohmic electrode 229 forms ohmic contact with the first conductivity type semiconductor layer 223a of the first subpixel R. The first-1 ohmic electrode 229 may include a pad region and an extended portion, and the connecting portion 275a may be connected to the pad region of the first-1 ohmic electrode 229, as shown in FIG. 40B. The first-1 ohmic electrode 229 may be spaced apart from the region where the second LED stack 233 is disposed.

Figure 40C:
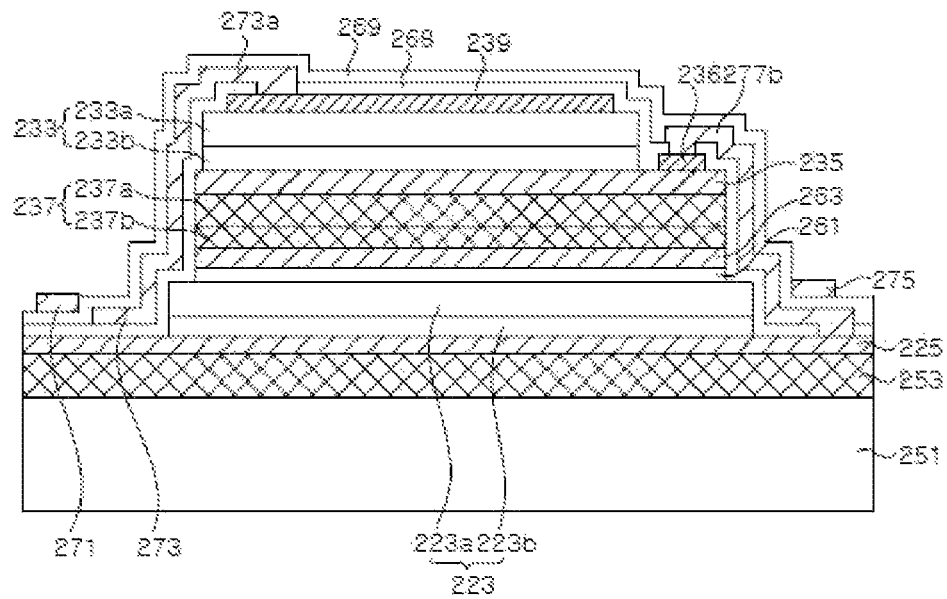
FIG. 40C is a schematic cross-sectional view taken along line C-C of FIG. 39.

The second-1 ohmic electrode 239 forms ohmic contact with the first conductivity type semiconductor layer 233a of the second LED stack 233. The second-1 ohmic electrode 239 may also include a pad region and an extended portion, and the connecting portion 273a may be connected to the pad region of the second-1 ohmic electrode 239, as shown in FIG. 40C. The second-1 ohmic electrode 239 may be spaced apart from the region in which the third LED stack 243 is disposed.

The second-2 ohmic electrode 235 forms ohmic contact with the second conductivity type semiconductor layer 233b of the second LED stack 233. The second-2 ohmic electrode 235 may include a reflection layer reflecting light generated from the second LED stack 233. For example, the second-2 ohmic electrode 235 may include a metal reflection layer.

The electrode pad 236 may be formed on the second-2 ohmic electrode 235. The electrode pad 236 is restrictively disposed on a portion of the second-2 ohmic electrode 235, and the connecting portion 277b may be connected to the electrode pad 236.

Figure 40D:
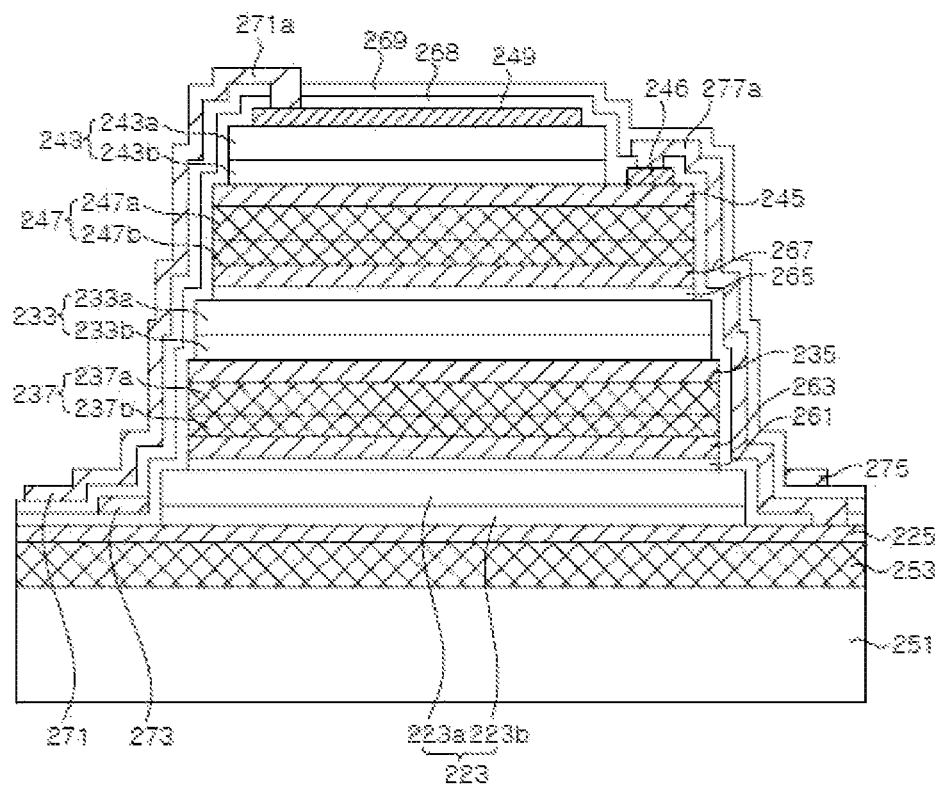
FIG. 40D is a schematic cross-sectional view taken along line D-D of FIG. 39.

The third-1 ohmic electrode 249 forms ohmic contact with the first conductivity type semiconductor layer 243a of the third LED stack 243. The third-1 ohmic electrode 249 may also include a pad region and an extended portion, and the connecting portion 271a may be connected to the pad region of the third-1 ohmic electrode 249, as shown in FIG. 40D.

The third-2 ohmic electrode 245 forms ohmic contact with the second conductivity type semiconductor layer 243b of the third LED stack 243. The third-2 ohmic electrode 245 may include a reflection layer reflecting light generated from the third LED stack 233. For example, the third-2 ohmic electrode 245 may include a metal layer.

The electrode pad 246 may be formed on the third-2 ohmic electrode 245. The electrode pad 246 is restrictively disposed on a portion of the third-2 ohmic electrode 245, and the connecting portion 277a may be connected to the electrode pad 246.

The reflective electrode 225, the second-2 ohmic electrode 235, and the third-2 ohmic electrode 245 may assist in current spreading through ohmic contact with the p-type semiconductor layer of each LED stack. The first-1 ohmic electrode 229, the second-1 ohmic electrode 239 and the third-1 ohmic electrode 249 may assist in current spreading through ohmic contact with the n-type semiconductor layer of each LED stack.

The first bonding layer 253 couples the first LED stack 223 to the support substrate 251. As shown in the drawings, the reflective electrode 225 may adjoin the first bonding layer 253. The first bonding layer 253 may be a light transmissive or opaque layer. The first bonding layer 253 may be formed of organic or inorganic materials. Examples of the organic materials may include SUB, poly(methyl methacrylate) (PMMA), polyimide, Parylene, benzocyclobutene (BCB), or others, and examples of the inorganic materials may include $Al_2O_3$, $SiO_2$, $SiN_x$, or others. The organic material layers may be bonded under high vacuum and high pressure conditions, and the inorganic material layers may be bonded under high vacuum after changing surface energy using plasma through, for example, chemical mechanical polishing, to flatten the surfaces of the inorganic material layers. In particular, a bonding layer formed of a black epoxy resin capable of absorbing light may be used as the first bonding layer 253, thereby improving contrast of a display apparatus. The first bonding layer 253 may be formed of spin-on-glass, for example.

The first reflection layer 263 is interposed between the first LED stack 223 and the second LED stack 233. The first reflection layer 263 reflects light generated from the first LED stack 223 and traveling towards the second LED stack 233 back to the first LED stack 223. The light reflected back to the first LED stack 223 may be emitted outside through a region not covered by the second LED stack 233. In this manner, the first reflection layer 263 prevents light generated from the first LED stack 223 from entering and being absorbed by the second LED stack 233, thereby improving light extraction efficiency of the first LED stack 223. The first reflection layer 263 may include a metal layer having high reflectance with respect to light generated from the first LED stack 223, and may include, for example, an Au layer, an Al layer, or an Ag layer.

The second reflection layer 267 is interposed between the second LED stack 233 and the third LED stack 243. The second reflection layer 267 reflects light generated from the second LED stack 233 and traveling towards the third LED stack 243 back to the second LED stack 233. The light reflected back to the second LED stack 233 may be emitted outside through a region not covered by the third LED stack 243. In this manner, the second reflection layer 267 prevents light generated from the second LED stack 233 from entering and being absorbed by the third LED stack 243, thereby improving light extraction efficiency of the second LED stack 233. The second reflection layer 267 may include a metal layer having high reflectance with respect to light generated from the second LED stack 233, and may include, for example, an Au layer, an Al layer, or an Ag layer.

The first transparent insulation layer 261 is interposed between the first reflection layer 263 and the first LED stack 223. The first transparent insulation layer 261 insulates the first reflection layer 263 from the first LED stack 223. In addition, the first transparent insulation layer 261 may include a dielectric layer, such as $SiO_2$, which have a lower index of refraction than the first LED stack 223. Accordingly, the first LED stack 223 having a high index of refraction, the first transparent insulation layer 261 having a low index of refraction, and the first reflection layer 263 are sequentially stacked one above another, thereby forming an omnidirectional reflector (ODR).

The second transparent insulation layer 265 is interposed between the second reflection layer 267 and the second LED stack 233. The second transparent insulation layer 265 insulates the second reflection layer 267 from the second LED stack 233. In addition, the second transparent insulation layer 265 may include a dielectric layer, such as $SiO_2$, which has a lower index of refraction than the second LED stack 233. Accordingly, the second LED stack 233 having a high index of refraction, the second transparent insulation layer 265 having a low index of refraction, and the second reflection layer 267 are sequentially stacked one above another, thereby forming an omnidirectional reflector (ODR).

The second bonding layer 237 couples the first LED stack 223 to the second LED stack 233. The second bonding layer 237 may be interposed between the first reflection layer 263 and the second-2 ohmic electrode 235 to bond the first reflection layer 263 to the second-2 ohmic electrode 235. The second bonding layer 237 may include a metal bonding layer, such as AuSn, without being limited thereto. Alternatively, the second bonding layer 237 may be formed of substantially the same bonding material as the first bonding layer 253.

The third bonding layer 247 couples the second LED stack 233 to the third LED stack 243. The third bonding layer 247 may be interposed between the second reflection layer 267 and the third-2 ohmic electrode 245 to bond second reflection layer 267 to the third-2 ohmic electrode 245. The third bonding layer 247 may also include a metal bonding layer, such as AuSn, without being limited thereto. Alternatively, the third bonding layer 247 may be formed of substantially the same bonding material as the first bonding layer 253.

The lower insulation layer 268 may cover the first to third LED stacks 223, 233, 243. The lower insulation layer 268 covers the reflective electrode 225 exposed around the first LED stack 223. In particular, the lower insulation layer 268 may have openings to provide electrical connection passages.

The upper insulation layer 269 covers the lower insulation layer 268. The upper insulation layer 269 may have openings to provide electrical connection passages.

The lower insulation layer 268 and the upper insulation layer 269 may be formed of any insulation materials, for example, silicon oxide or silicon nitride, without being limited thereto.

As shown in FIG. 38 and FIG. 39, the interconnection lines 271, 273, 275 may be disposed to be orthogonal to the reflective electrode 225. The interconnection lines 271, 275 are disposed on the upper insulation layer 269 and may be connected to the third-1 ohmic electrode 249 and the first-1 ohmic electrode 229 through the connecting portions 271a, 275a, respectively. In an exemplary embodiment, the upper insulation layer 269 and the lower insulation layer 268 may have openings that expose the third-1 ohmic electrode 249 and the first-1 ohmic electrode 229.

The interconnection line 273 is disposed on the lower insulation layer 268 and is insulated from the reflective electrode 225. The interconnection line 273 may be disposed between the lower insulation layer 268 and the upper insulation layer 269 and may be connected to the second-1 ohmic electrode 239 through the connecting portion 273a. In an exemplary embodiment, the lower insulation layer 268 has an opening that exposes the second-1 ohmic electrode 239.

The connecting portions 277a, 277b are disposed between the lower insulation layer 268 and the upper insulation layer 269 and electrically connect the electrode pads 246, 236 to the reflective electrode 225. In an exemplary embodiment, the lower insulation layer 268 may have openings that expose the electrode pads 236, 246 and the reflective electrode 225.

The interconnection line 271 and the interconnection line 273 are insulated from each other by the upper insulation layer 269 and may be disposed to overlap in the vertical direction.

The electrodes of each pixel are connected to the data line and the scan lines. In particular, the interconnection lines 271, 275 are formed on the lower insulation layer 268 and the interconnection line 273 is disposed between the lower insulation layer 268 and the upper insulation layer 269. However, the inventive concepts are not limited thereto. For example, all of the interconnection lines 271, 273, 275 may be formed on the lower insulation layer 268 and may be covered by the upper insulation layer 81, and the connecting portions 271a, 275a may be formed on the upper insulation layer 269.

Next, a method of manufacturing the display apparatus 2000A according to an exemplary embodiment will be described.

FIG. 41 to FIG. 53 are schematic cross-sectional views illustrating a method of manufacturing a display apparatus according to an exemplary embodiment. Each of the cross-sectional views is taken along line A-A of the corresponding plan view.

Figure 41A:
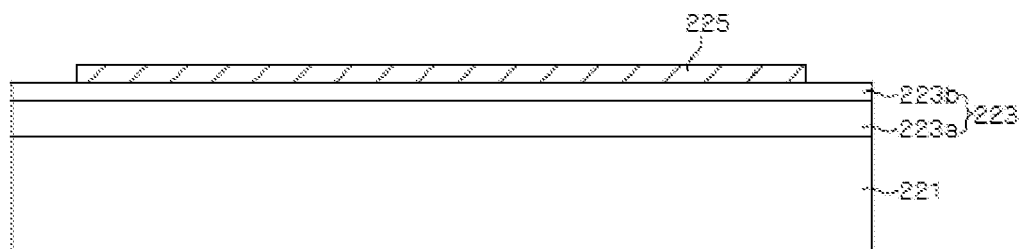
FIGS. 41A, 41B, 41C, 42A, 42B, 43A, 43B, 44A, 44B, 45A, 45B, 46A, 46B, 47A, 47B, 48A, 48B, 49A, 49B, 50A, 50B, 51, 52A, 52B, and 53 are schematic plan view and cross-sectional views illustrating a method of manufacturing a display apparatus according to an exemplary embodiment.

First, referring to FIG. 41A, a first LED stack 223 is grown on a first substrate 221. The first substrate 221 may be, for example, a GaAs substrate. In addition, the first LED stack 223 may be formed of AlGaInP-based semiconductor layers, and includes a first conductivity type semiconductor layer 223a, an active layer, and a second conductivity type semiconductor layer 223b.

Then, a reflective electrode 225 is formed on the first LED stack 223. The reflective electrode 225 may be formed of, for example, an Au—Zn alloy or an Au—Be alloy.

The reflective electrode 225 may be formed by a lift-off process and may be subjected to patterning to have a particular shape. For example, the reflective electrode 225 may be patterned to extend along a plurality of pixels. However, the inventive concepts are not limited thereto. Alternatively, the reflective electrode 225 may be formed over the entire upper surface of the first LED stack 223 without patterning, or may be subjected to patterning after formation thereon.

The reflective electrode 225 may form ohmic contact with the second conductivity type semiconductor layer 223b of the first LED stack 223, for example, a p-type semiconductor layer.

Figure 41B:
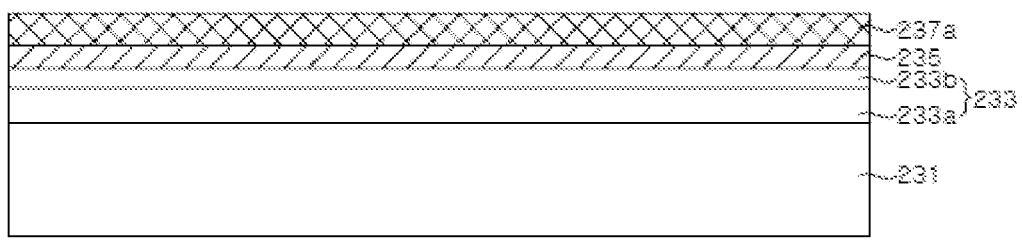

Referring to FIG. 41B, a second LED stack 233 is grown on a second substrate 231 and a second-2 ohmic electrode 235 is formed on the second LED stack 233. The second LED stack 233 may be formed of GaN-based semiconductor layers, and may include a first conductivity type semiconductor layer 233a, a GaInN well layer, and a second conductivity type semiconductor layer 233b. The second substrate 231 is a substrate capable of growing the GaN-based semiconductor layers thereon and may be different from the first substrate 221. The GaInN composition of the second LED stack 233 may be determined such that the second LED stack 233 can emit green light, for example. The second-2 ohmic electrode 235 forms ohmic contact with the second conductivity type semiconductor layer 233b of the second LED stack 233, for example, a p-type semiconductor layer. The second-2 ohmic electrode 235 may include a reflection layer to reflect light generated from the second LED stack 233.

A bonding material layer 237a may be formed on the second-2 ohmic electrode 235. The bonding material layer 237a may include a metal layer, such as AuSn, without being limited thereto.

Figure 41C:
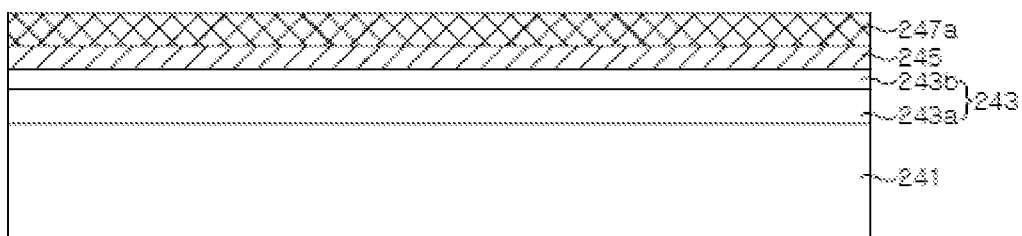

Referring to FIG. 41C, a third LED stack 243 is grown on a third substrate 41 and a third-2 ohmic electrode 245 is formed on the third LED stack 243. The third LED stack 243 may be formed of GaN-based semiconductor layers, and may include a first conductivity type semiconductor layer 243a, a GaInN well layer, and a second conductivity type semiconductor layer 243b. The third substrate 41 is a substrate capable of growing the GaN-based semiconductor layers thereon and may be different from the first substrate 221. The GaInN composition of the third LED stack 243 may be determined such that the third LED stack 243 can emit blue light, for example. The third-2 ohmic electrode 245 forms ohmic contact with the second conductivity type semiconductor layer 243b of the third LED stack 243, for example, a p-type semiconductor layer. The third-2 ohmic electrode 245 may include a reflection layer to reflect light generated from the third LED stack 243.

A bonding material layer 247a may be formed on the third-2 ohmic electrode 245. The bonding material layer 247a may include a metal layer, such as AuSn, without being limited thereto.

The first LED stack 223, the second LED stack 233, and the third LED stack 243 are grown on different substrates, respectively, and the sequence of forming the first to third LED stacks 223, 233, and 243 is not particularly limited.

Figure 42A:
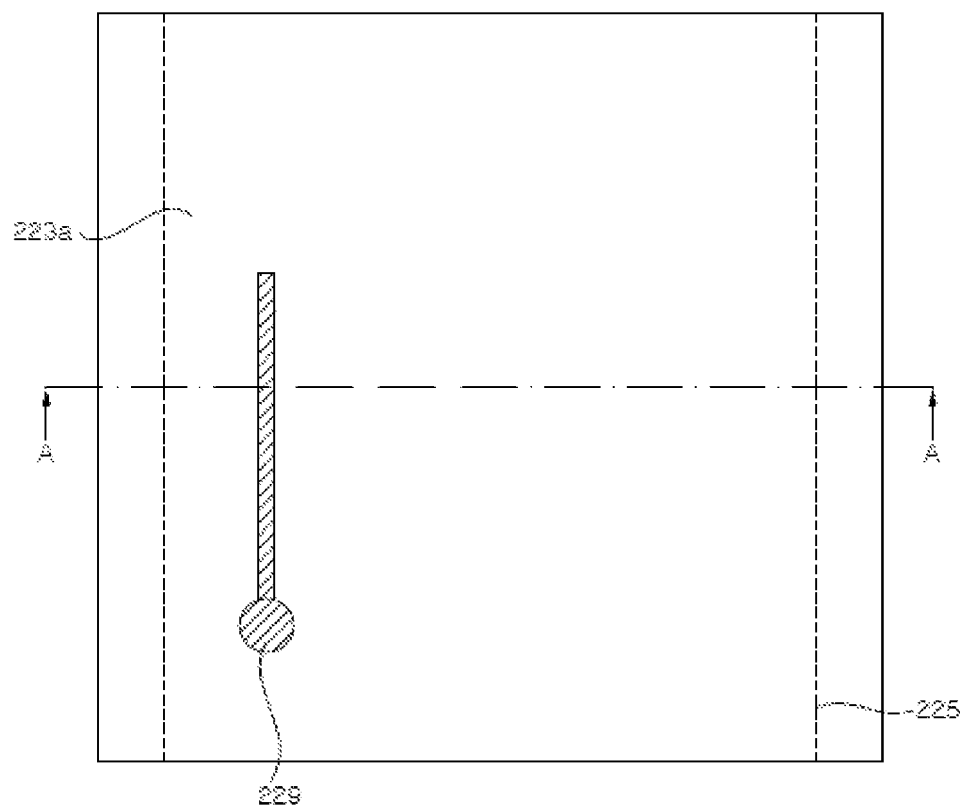
Figure 42B:
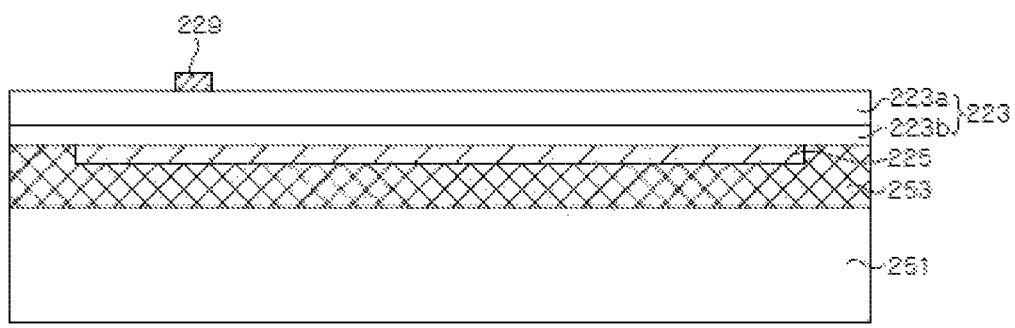

Referring to FIG. 42A and FIG. 42B, the first LED stack 223 of FIG. 41A is coupled to an upper side of a support substrate 251 via a first bonding layer 253. The reflective electrode 225 may be disposed to face the support substrate 251 and may be bonded to the first bonding layer 253. The first substrate 221 is removed from the first LED stack 223 by chemical etching or the like. As such, an upper surface of the first conductivity type semiconductor layer 223a of the first LED stack 223 is exposed. A roughened surface may be formed on the exposed surface of the first conductivity type semiconductor layer 223a by surface texturing, for example.

Then, a first-1 ohmic electrode 229 is formed on the exposed surface of the first LED stack 223. The ohmic electrode 229 may be formed of, for example, an Au—Te alloy or an Au—Ge alloy. The ohmic electrode 229 may be formed in each pixel region. The ohmic electrode 229 may be disposed towards one side in each pixel region. The ohmic electrode 229 may include a pad region and an extended portion, as shown in FIG. 42A. Here, the extended portion may extend substantially in the longitudinal direction of the reflective electrode 225.

Figure 43A:
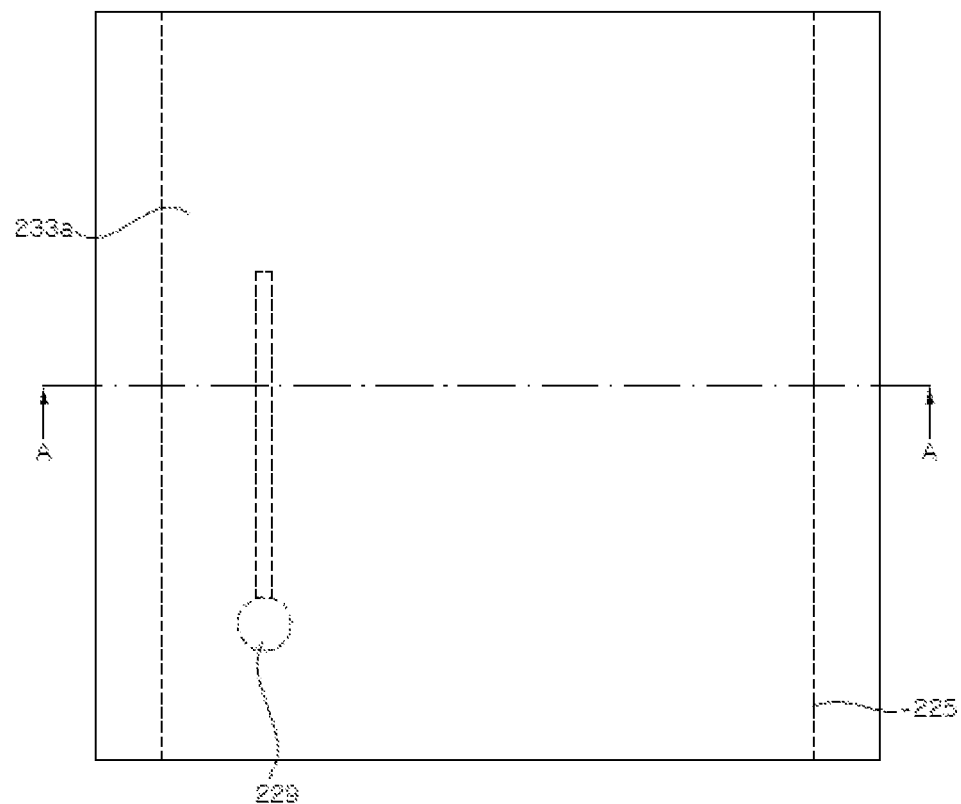
Figure 43B:
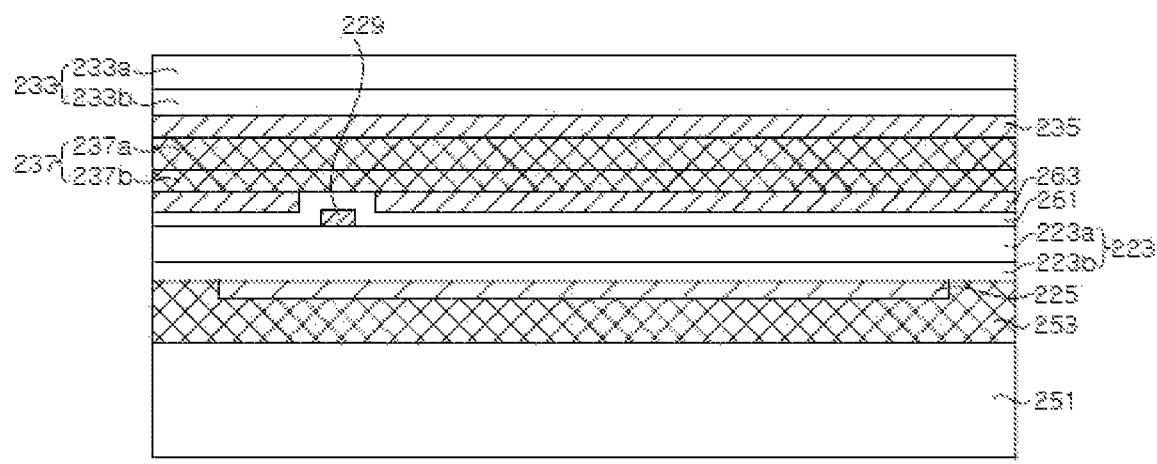

Referring to FIG. 43A and FIG. 43B, a first transparent insulation layer 261 is formed on the first LED stack 223, and a first reflection layer 263 is then formed thereon. As shown in the drawings, the first transparent insulation layer 261 may be formed to cover the first-1 ohmic electrode 229, and the first reflection layer 263 may not cover the first-1 ohmic electrode 229. However, the inventive concepts are not limited thereto. For example, the first reflection layer 263 may cover the first-1 ohmic electrode 229.

A bonding material layer 237b is formed on the first reflection layer 263, and the second LED stack 233 of FIG. 41B is coupled to an upper side of the bonding material layer 237b. The bonding material layer 237a is disposed to face the support substrate 251 and is bonded to the bonding material layer 237a to form a second bonding layer 237, by which the first LED stack 223 is coupled to the second LED stack 233.

The second substrate 231 is removed from the second LED stack 233 by laser lift-off or chemical lift-off. As such, an upper surface of the first conductivity type semiconductor layer 233a of the second LED stack 233 is exposed. A roughened surface may be formed on the exposed surface of the first conductivity type semiconductor layer 233a by surface texturing or the like.

Figure 44A:
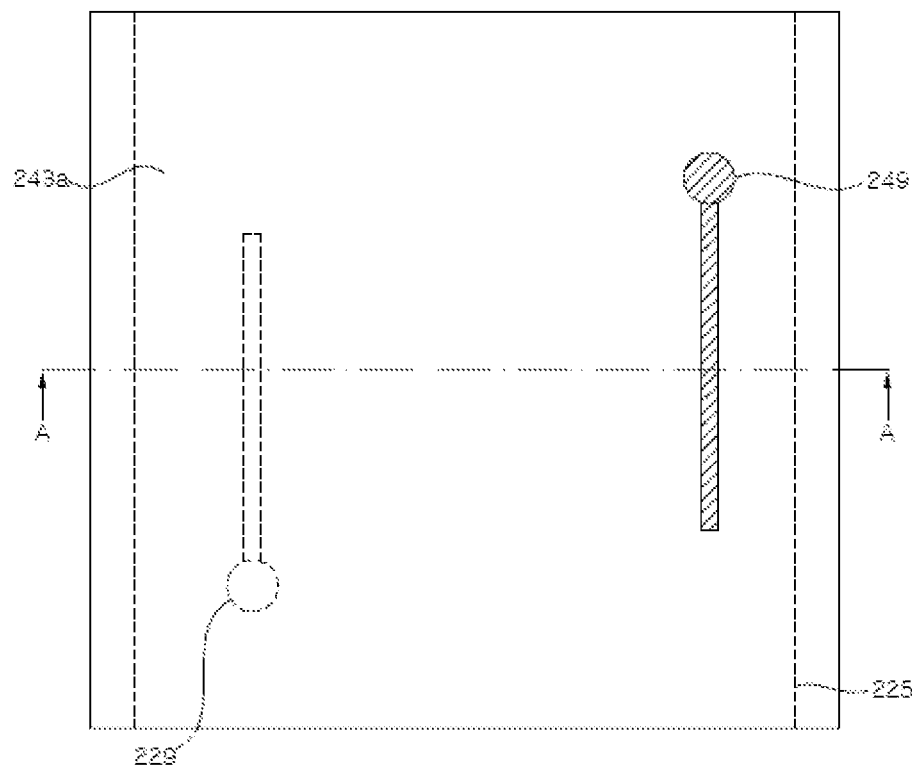
Figure 44B:
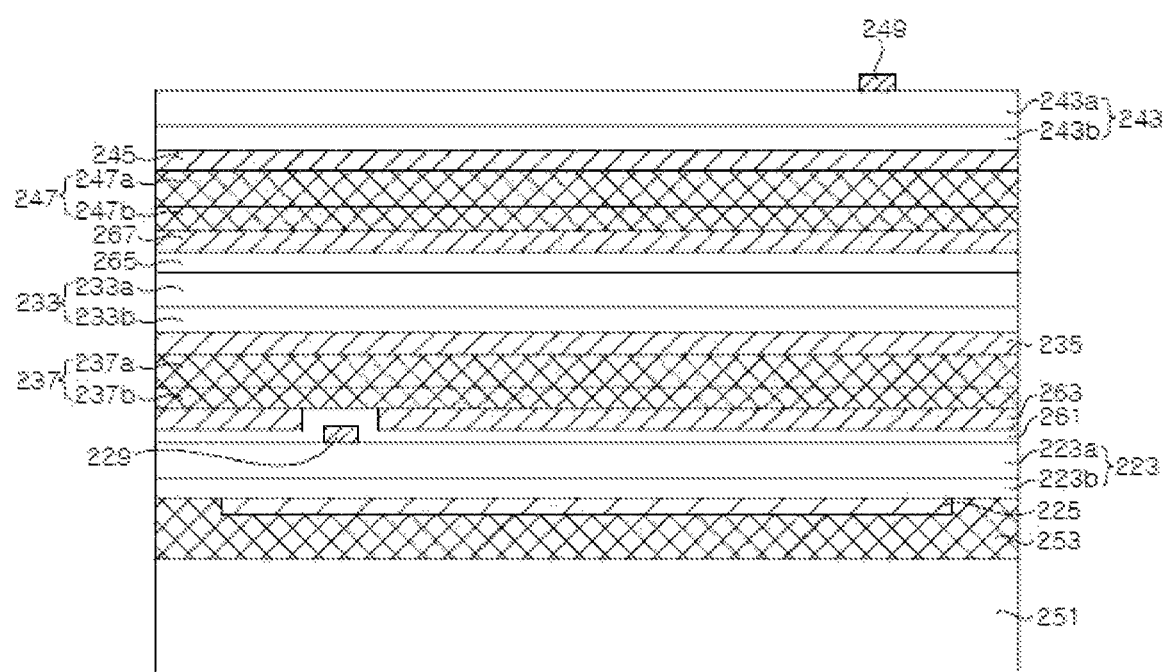

Referring to FIG. 44A and FIG. 44B, first, a second transparent insulation layer 265 is formed on the second LED stack 233, and a second reflection layer 267 is then formed thereon. Thereafter, a bonding material layer 247b is formed on the second reflection layer 267, and the second LED stack 233 of FIG. 42B is coupled to an upper side of the bonding material layer 247b. The bonding material layer 247a is disposed to face the support substrate 251 and is bonded to the bonding material layer 247a to form a third bonding layer 247, by which the second LED stack 233 is coupled to the third LED stack 243.

The third substrate 41 may be removed from the third LED stack 243 by laser lift-off or chemical lift-off. As such, an upper surface of the first conductivity type semiconductor layer 243a of the third LED stack 243 is exposed. A roughened surface may be formed on the exposed surface of the first conductivity type semiconductor layer 243a by surface texturing or the like.

Next, a third-1 ohmic electrode 249 is formed on the first conductivity type semiconductor layer 243a. The third-1 ohmic electrode 249 may be formed towards the other side of the pixel to oppose the first-1 ohmic electrode 229. The third-1 ohmic electrode 249 may include a pad region and an extended portion. The extended portion may extend substantially in the longitudinal direction of the reflective electrode 225.

Figure 45A:
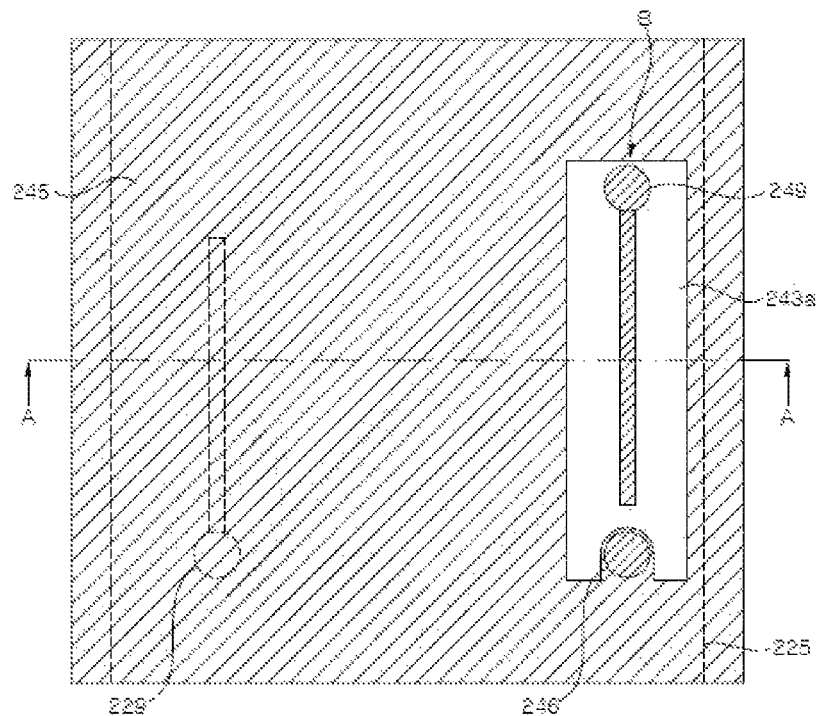
Figure 45B:
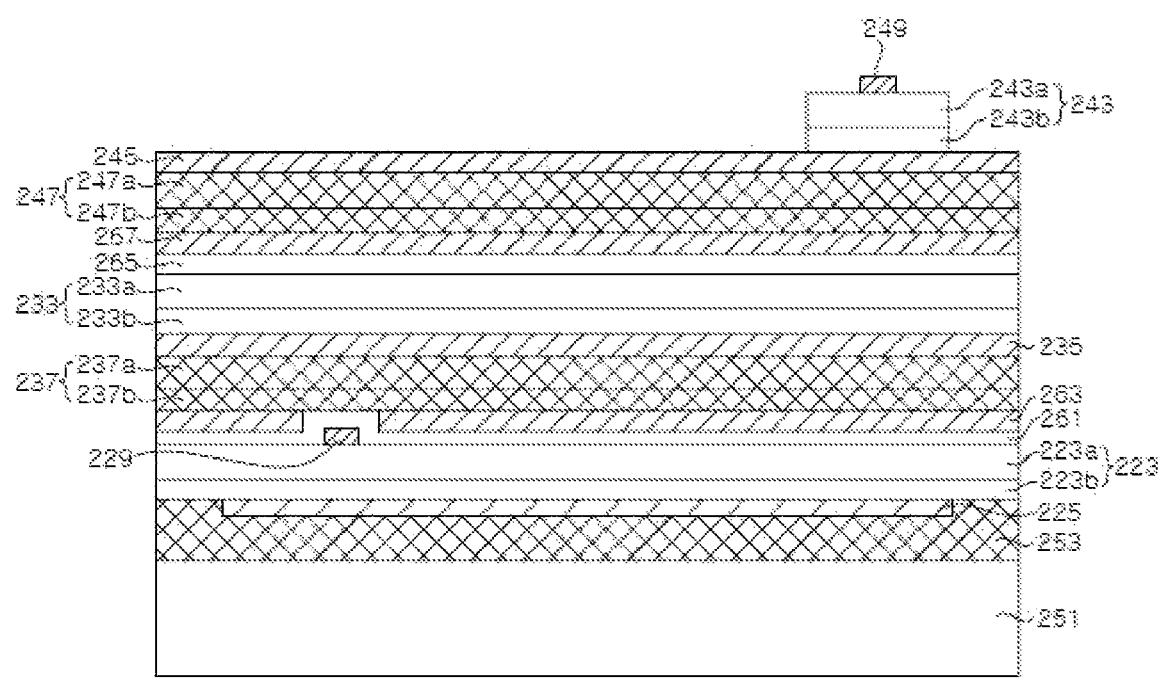

Referring to FIG. 45A and FIG. 45B, in each pixel region, the third LED stack 243 is removed except for a region of a third subpixel B by patterning the third LED stack 243. As such, the third-2 ohmic electrode 245 is exposed, as shown in the drawings. In addition, an indentation may be formed on the third LED stack 243 in the region for the third subpixel B.

An electrode pad 246 may be formed on the third-2 ohmic electrode 245 exposed to the indentation. Although the third-2 ohmic electrode 245 and the electrode pad 246 are described as being formed by separate processes, in some exemplary embodiments, the third-2 ohmic electrode 245 and the electrode pad 246 may be formed together by the same process. For example, after the third-2 ohmic electrode 245 is exposed, the third-1 ohmic electrode 249 and the electrode pad 246 may be formed together by a lift-off process, for example.

Figure 46A:
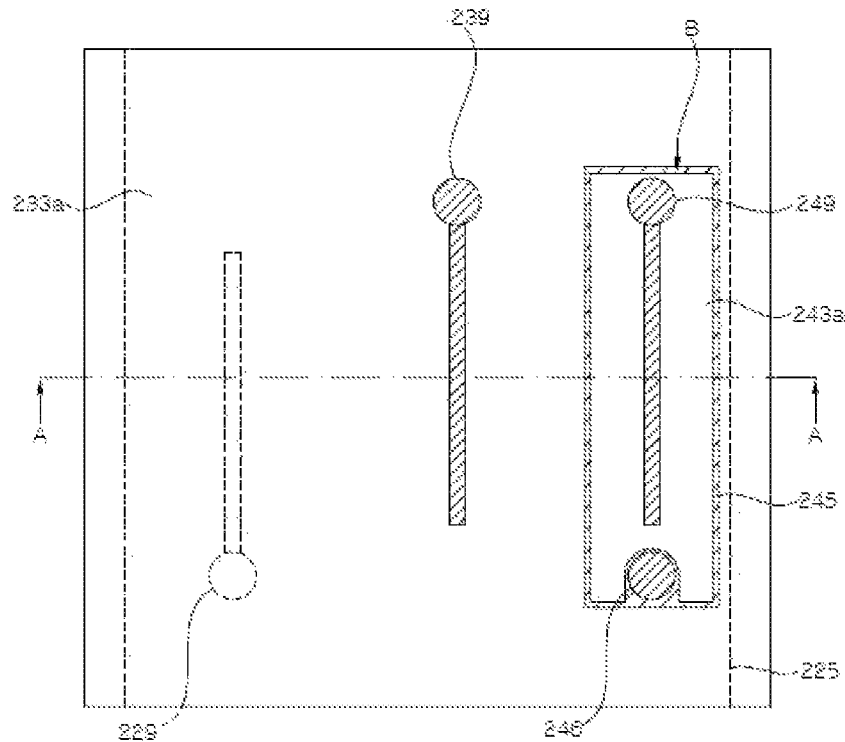
Figure 46B:
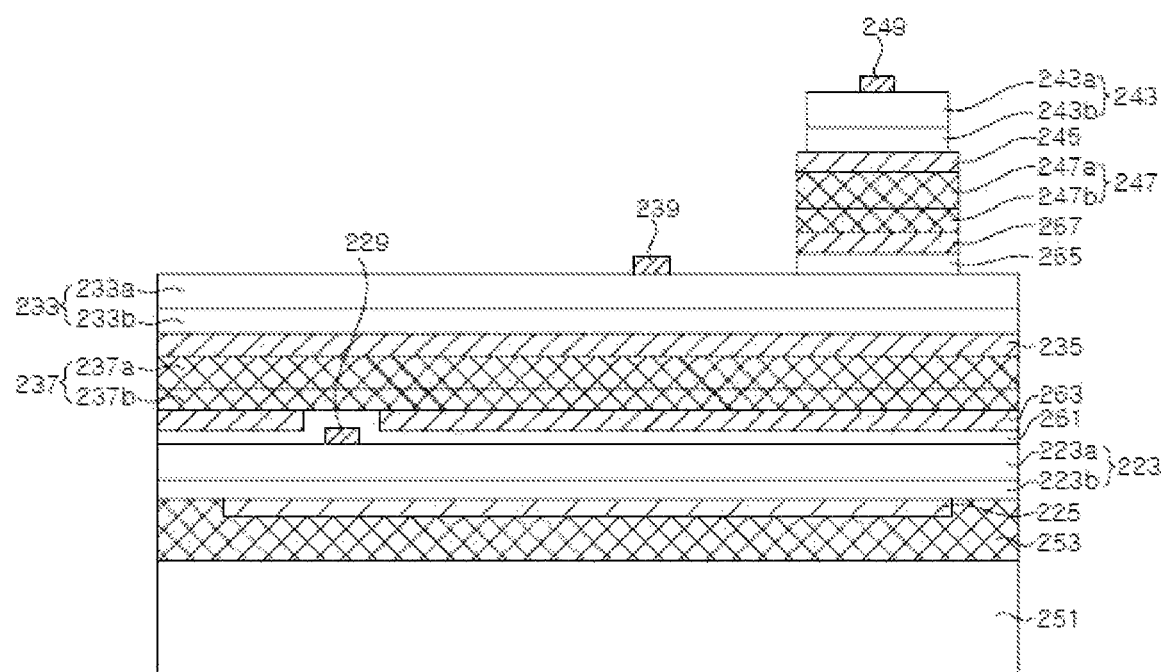

Referring to FIG. 46A and FIG. 46B, in each pixel region, the third-2 ohmic electrode 245, the third bonding layer 247, the second reflection layer 267 and the second transparent insulation layer 265 are sequentially subjected to patterning to expose the second LED stack 233. The third-2 ohmic electrode 245 is restrictively disposed near the region for the third subpixel B.

In each pixel region, a second-1 ohmic electrode 239 is formed on the second LED stack 233. As shown in FIG. 46A, the second-1 ohmic electrode 239 may include a pad region and an extended portion. The extended portion may extend substantially in the longitudinal direction of the reflective electrode 225. The second-1 ohmic electrode 239 forms ohmic contact with the first conductivity type semiconductor layer 233a. As shown in the drawings, the second-1 ohmic electrode 239 may be disposed between the first-1 ohmic electrode 229 and the third-1 ohmic electrode 249, without being limited thereto.

Figure 47A:
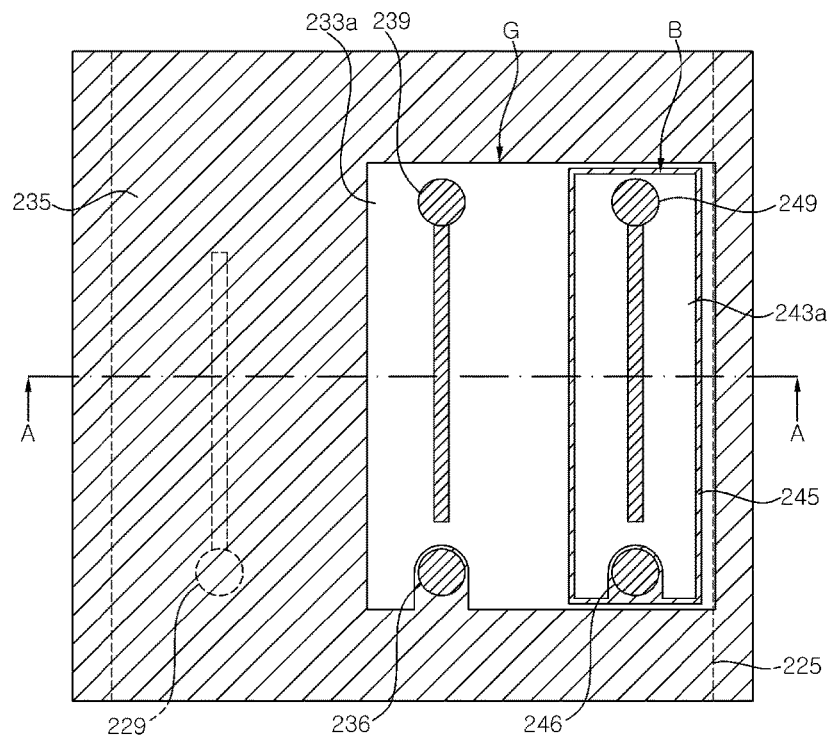
Figure 47B:
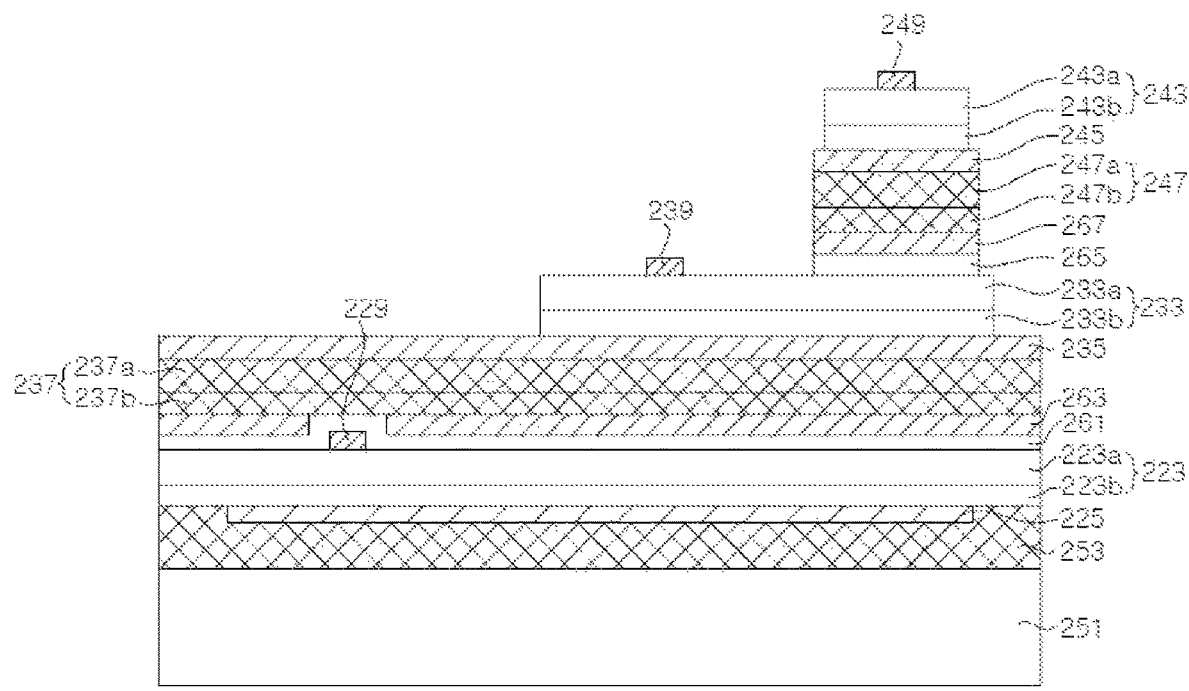

Referring to FIG. 47A and FIG. 47B, the second LED stack 233 is removed except for a region of a second subpixel Gin each pixel by patterning the second LED stack 233. In the region for the second subpixel G, the second LED stack 233 may overlap the third LED stack 243.

As the second LED stack 233 is subjected to patterning, the second-2 ohmic electrode 235 is exposed. The second LED stack 233 may include an indentation, such that the electrode pad 236 can be formed on the second-2 ohmic electrode 235 in the indentation.

Although the second-1 ohmic electrode 239 and the electrode pad 236 are described as being formed by separate processes, in some exemplary embodiments, the second-1 ohmic electrode 239 and the electrode pad 236 may be formed together by the same process. For example, after the second-2 ohmic electrode 235 is exposed, the second-1 ohmic electrode 239 and the electrode pad 236 may be formed together by a lift-off process or the like.

Figure 48A:
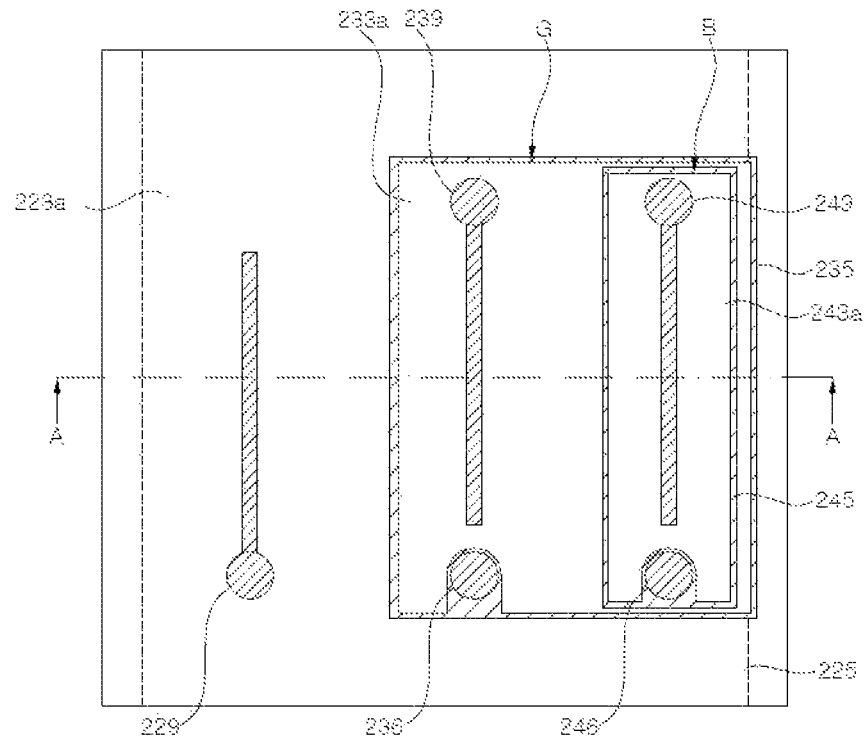
Figure 48B:
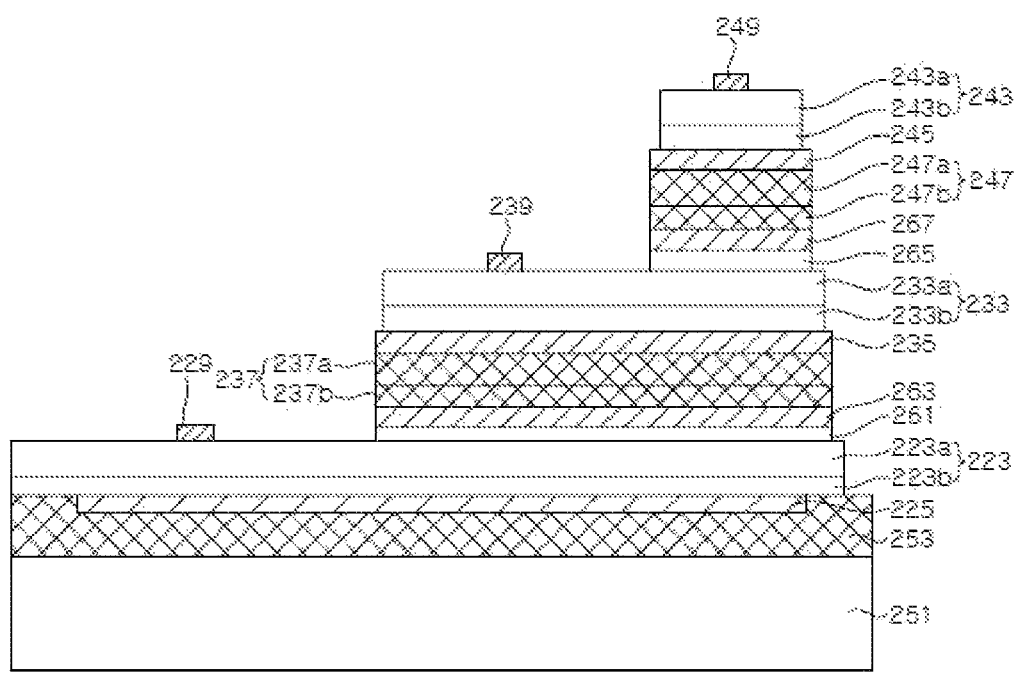

Referring to FIG. 48A and FIG. 48B, the second-2 ohmic electrode 235, the second bonding layer 237, the first reflection layer 263, and the first transparent insulation layer 261 are sequentially subjected to patterning to expose the first LED stack 223. The second-2 ohmic electrode 235 is restrictively disposed near the region for the second subpixel G.

In each pixel region, the first-1 ohmic electrode 229 formed on the first LED stack 223 is exposed. As shown in FIG. 48B, the first-1 ohmic electrode 229 may include a pad region and an extended portion. The extended portion may extend substantially in the longitudinal direction of the reflective electrode 225.

Figure 49A:
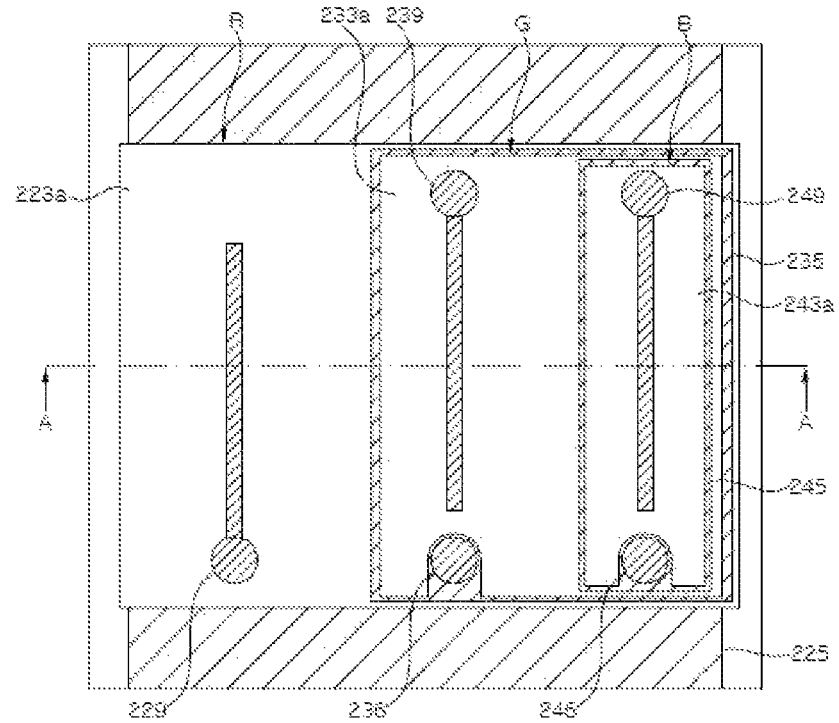
Figure 49B:
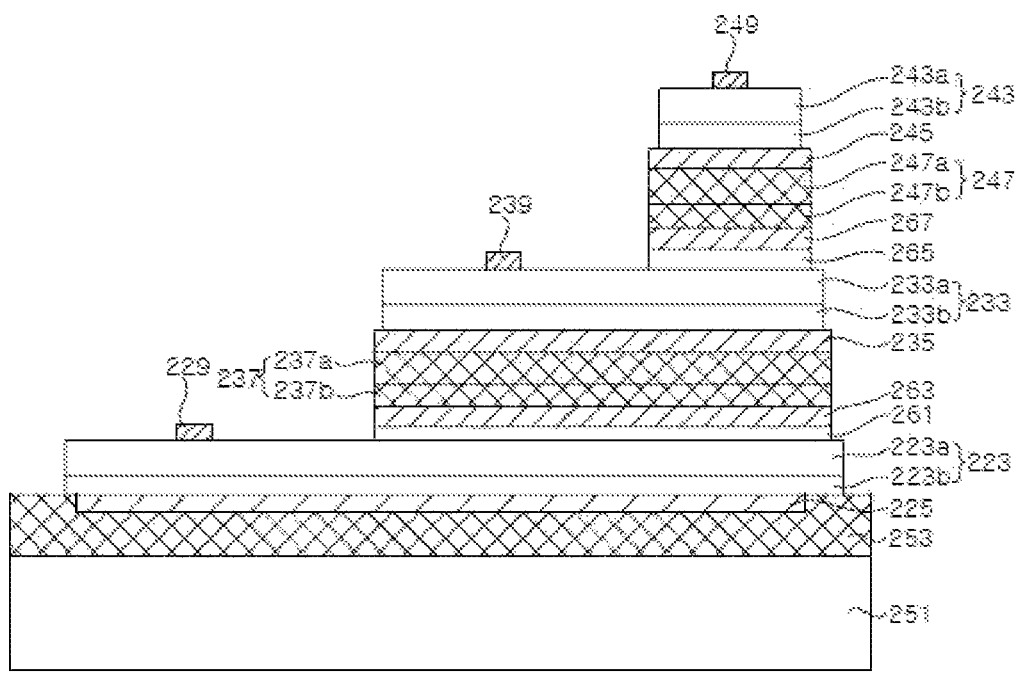

Referring to FIG. 49A and FIG. 49B, the first LED stack 223 is removed except for a region of a first subpixel R in each pixel by patterning the first LED stack 223. The first-1 ohmic electrode 229 may remain in the region for the first subpixel R. The first LED stack 223 overlaps the second LED stack 233 and the third LED stack 243. In particular, the second LED stack 233 and the third LED stack 243 are restrictively disposed in an upper region of the first LED stack 223.

As the first LED stack 223 is subjected to patterning, the reflective electrode 225 is exposed and the surface of the first bonding layer 253 may be partially exposed. In other exemplary embodiments, an insulation layer may be disposed on the first bonding layer 253. In this case, the insulation layer is exposed and the surface of the first bonding layer 253 may not be exposed.

Figure 50A:
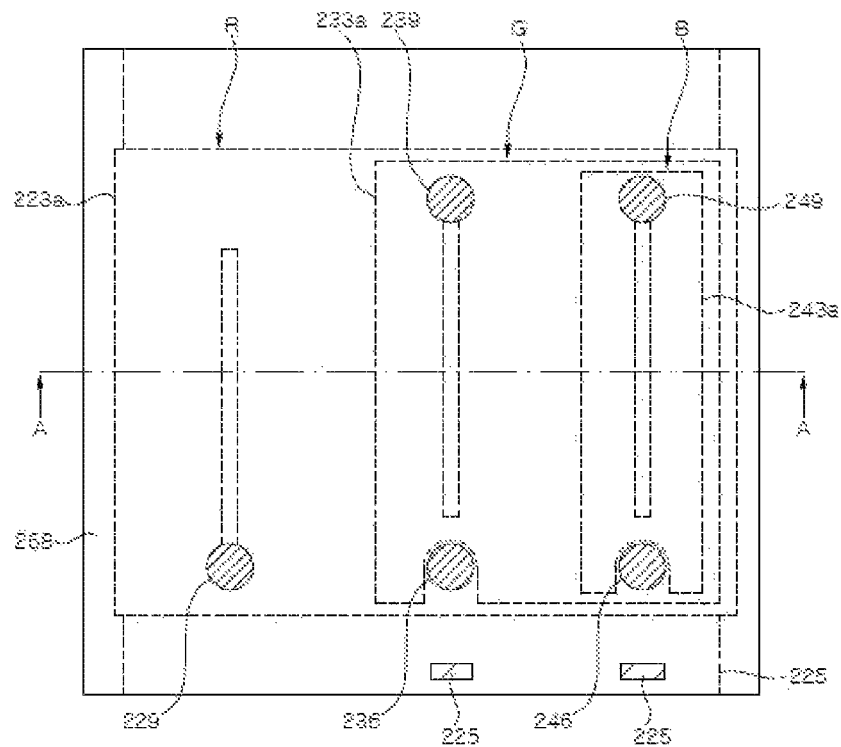
Figure 50B:
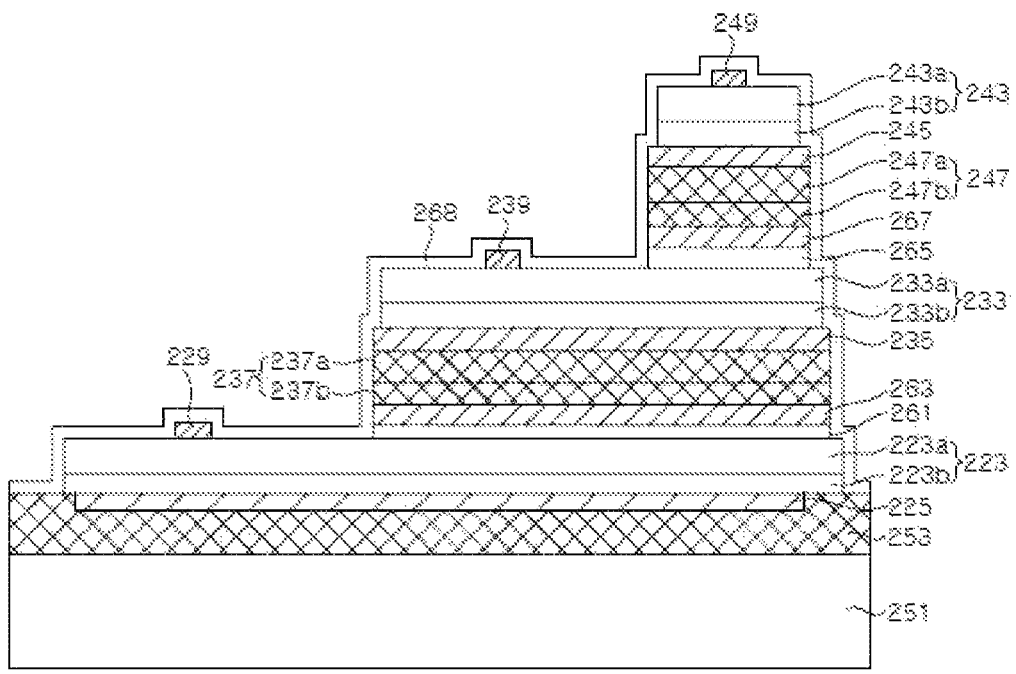

Referring to FIG. 50A and FIG. 50B, a lower insulation layer 268 is formed. The lower insulation layer 268 may cover the first to third LED stacks 223, 233, 243, the reflective electrode 225, and the first bonding layer 253. The lower insulation layer 268 may be subjected to patterning to form openings that expose the first-1 ohmic electrode 229, the second-1 ohmic electrode 239, the third-1 ohmic electrode 249, the electrode pads 236, 246, and the reflective electrode 225.

Figure 51:
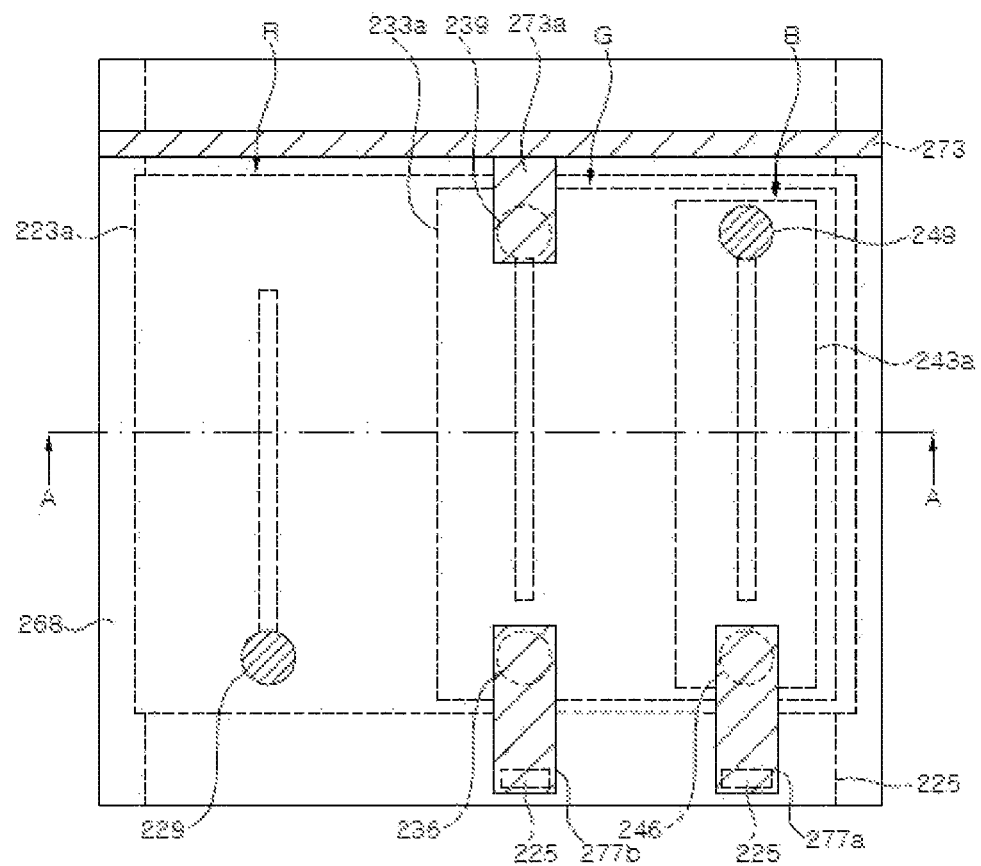

Referring to FIG. 51, an interconnection line 273 and connecting portions 273a, 277a, 277b are formed on the lower insulation layer 268. The connecting portion 273a connects the second-1 ohmic electrode 239 to the interconnection line 273, the connecting portion 277a connects the electrode pad 246 to the reflective electrode 225, and the connecting portion 277b connects the electrode pad 236 to the reflective electrode 225. A cross-sectional view taken along line A-A of FIG. 51 is the same as FIG. 50B, and thus, will be omitted to avoid redundancy.

Figure 52A:
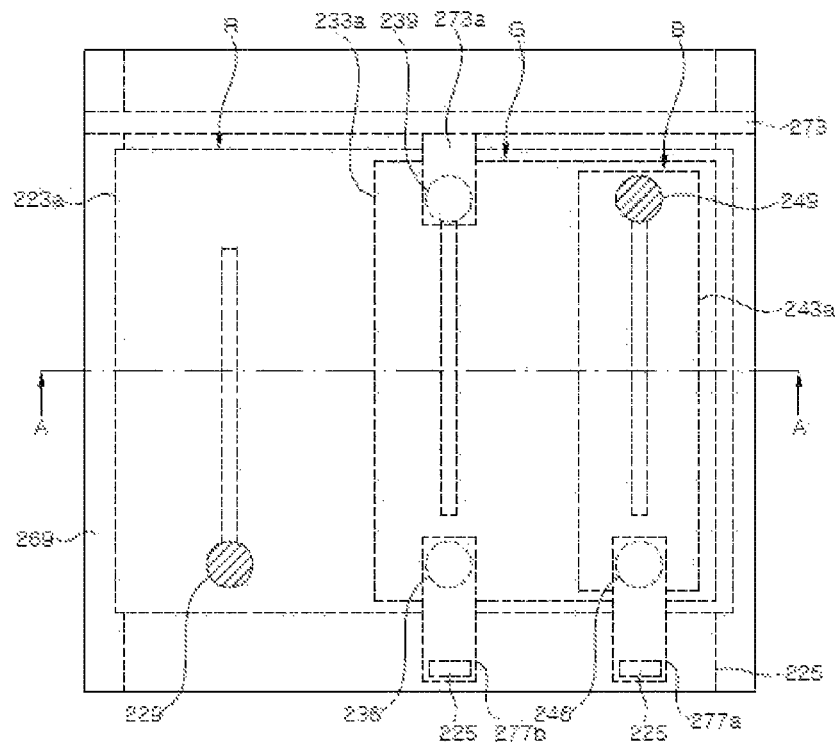
Figure 52B:
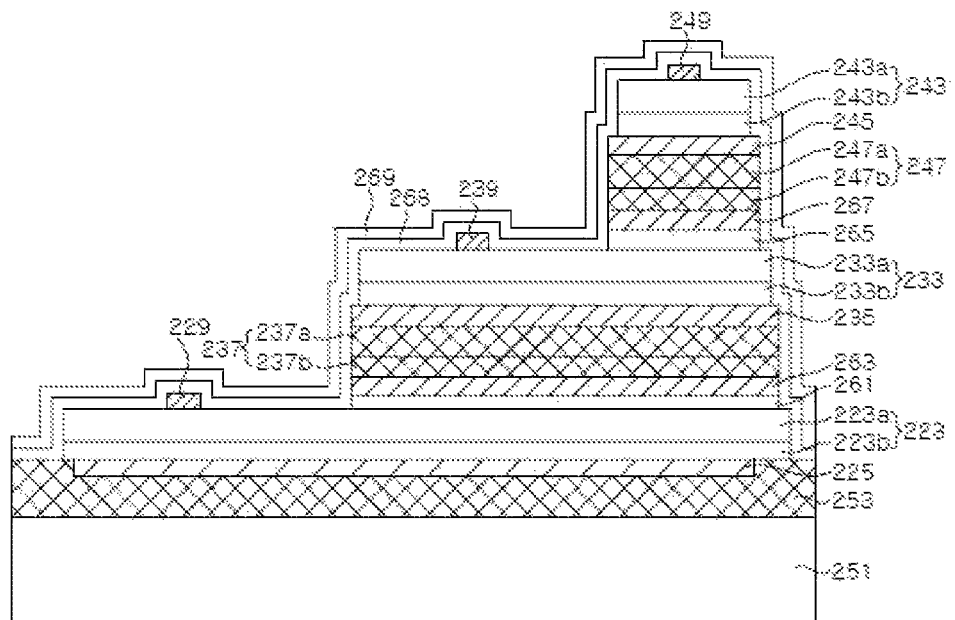

Referring to FIG. 52A and FIG. 52B, an upper insulation layer 269 is formed. The upper insulation layer 269 covers the interconnection line 273 and the connecting portions 273a, 277a, 277b. The upper insulation layer 269 may be subjected to patterning to expose the pad regions of the first-1 ohmic electrode 229 and the third-1 ohmic electrode 249.

Figure 53:
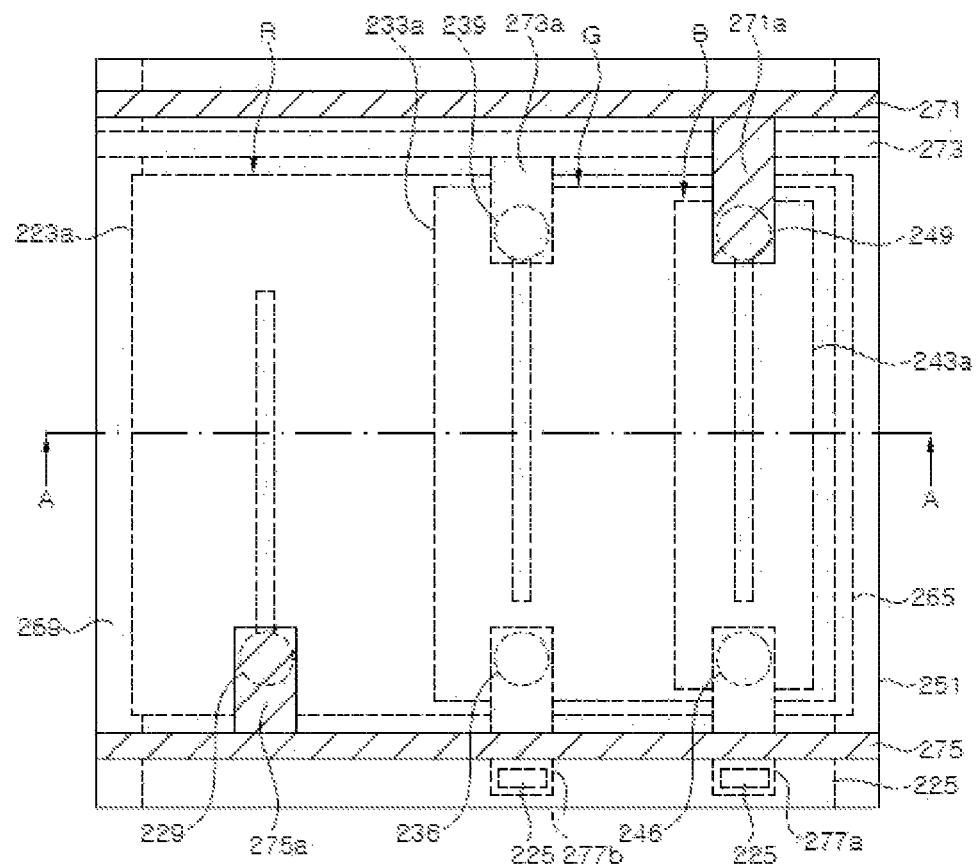

Referring to FIG. 53, interconnection lines 271, 275 and connecting portions 271a, 275a are formed on the upper insulation layer 269. The connecting portion 271a connects the interconnection line 271 to the third-1 ohmic electrode 249, and the connecting portion 275a connects the interconnection line 275 to the first-1 ohmic electrode 229.

In this manner, the display apparatus 2000A described with reference to FIG. 38 and FIG. 39 may be provided. A cross-sectional view taken along line A-A of FIG. 53 is the same as FIG. 52B, and thus will be omitted to avoid redundancy.

Although the pixels are described as being driven in a passive matrix manner in the illustrated exemplary embodiment, the inventive concepts are not limited thereto, and the pixels may be driven in an active matrix manner in some exemplary embodiments.

Figure 54:
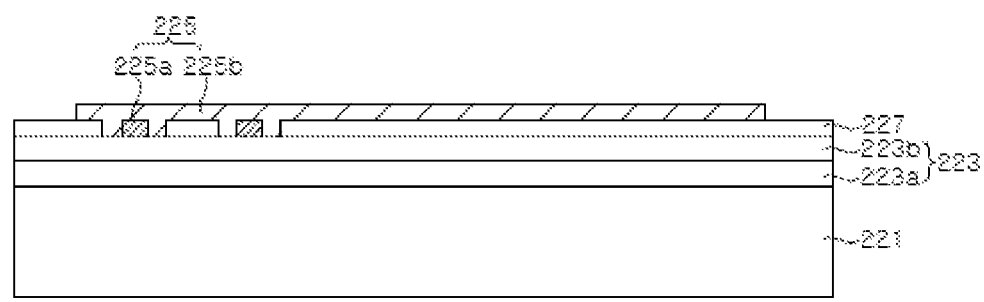
FIG. 54 is a schematic cross-sectional view of a display apparatus according to another exemplary embodiment.

FIG. 54 is a schematic cross-sectional view of a display apparatus according to another exemplary embodiment. Although the reflective electrode 225 may be directly formed on the second conductivity type semiconductor layer 223b as shown in FIG. 41A, the inventive concepts are not limited thereto.

In particular, referring to FIG. 54, the reflective electrode 225 may include an ohmic contact layer 225a and a reflection layer 225b. The ohmic contact layer 225a may be formed of, for example, Au—Zn alloys or Au—Be alloys, and the reflection layer 225b may be formed of Al, Ag or Au. When the reflection layer 225b is formed of Au, the reflection layer 225b may exhibit relatively high reflectance with respect to light generated from the first LED stack 223, for example, red light, and may exhibit relatively low reflectance with respect to light generated from the second LED stack 233 and the third LED stack 243, for example, green light or blue light.

An insulation layer 227 may be disposed between the reflection layer 225b and the second conductivity type semiconductor layer 223b. The insulation layer 227 may have openings that expose the second conductivity type semiconductor layer 223b, and the ohmic contact layer 225a may be formed in the openings of the insulation layer 227.

As the reflection layer 225b covers the insulation layer 227, an omnidirectional reflector (ODR) may be formed by a stacked structure of the first LED stack 223 having a high index of refraction, the insulation layer 227 having a low index of refraction, and the reflection layer 225b.

The reflective electrode 225 may be formed by the following process. First, the first LED stack 223 is grown on the substrate 221 and the insulation layer 227 is formed on the first LED stack 223. Then, opening(s) are formed by patterning the insulation layer 227. For example, SiO₂ is formed on the first LED stack 223 and a photoresist is deposited thereon, followed by forming a photoresist pattern through photolithography and development. Thereafter, the SiO₂ layer is subjected to patterning using the photoresist pattern as an etching mask, thereby forming the insulation layer 227 having the opening formed therein.

Thereafter, the ohmic contact layer 225a is formed in the opening(s) of the insulation layer 227. The ohmic contact layer 225a may be formed by a lift-off process, for example. After formation of the ohmic contact layer 225a, the reflection layer 225b is formed to cover the ohmic contact layer 225a and the insulation layer 227. The reflection layer 225b may be formed by a lift-off process, for example. The reflection layer 225b may partially or completely cover the ohmic contact layer 225a, as shown in the drawings. The reflective electrode 225 is formed by the ohmic contact layer 225a and the reflection layer 225b. The shape of the reflective electrode 225 is substantially the same as that of the reflective electrode described above, and thus, detailed descriptions thereof will be omitted to avoid redundancy.

Although the first LED stack 223 is described as being formed of AlGaInP-based semiconductor layers to emit red light, however, the inventive concepts are not limited thereto. For example, the first LED stack 223 may emit green light or blue light. In this case, the first LED stack 223 may be formed of AlGaInN-based semiconductor layers. In addition, the second LED stack 233 or the third LED stack 243 may be formed of AlGaInP-based semiconductor layers.

According to the exemplary embodiments, a plurality of pixels may be formed at the wafer level by wafer bonding, thereby eliminating a need for individual mounting of light emitting diodes.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a substrate;
   a light emitting stacked structure disposed on the substrate and including a plurality of epitaxial sub-units disposed one over another;
   a first adhesive layer bonding the epitaxial sub-units to the substrate; and
   a line part disposed on the substrate and configured to apply a light emitting signal to each of the epitaxial sub-units,
   wherein:
   the light emitting stacked structure is configured to provide light having various colors by a combination of light emitted from each of the epitaxial sub-units;
   the first adhesive layer includes a conductive and non-transparent material;
   the substrate includes a non-transparent material; and
   the first adhesive layer covers a side surface of the line part.

2. The display device of claim 1, wherein the first adhesive layer includes a light absorbing material.

3. The display device of claim 2, wherein the first adhesive layer is disposed between the substrate and the light emitting stacked structure.

4. The display device of claim 1, further comprising a contact electrode disposed between the line part and the light emitting stacked structure and electrically connected to the line part and the light emitting stacked structure,
   wherein the first adhesive layer has a width greater than that of the contact electrode.

5. The display device of claim 4, further comprising an insulation layer disposed between the line part and the epitaxial sub-units,
   wherein the insulation layer and the contact electrode are substantially coplanar with each other.

6. The display device of claim 1, wherein the first adhesive layer has a varying thickness along a longitudinal direction of the substrate.

7. The display device of claim 1, wherein a portion of the first adhesive layer not overlapping the light emitting stacked structure has a different thickness from a portion of the first adhesive layer overlapping the light emitting stacked structure.

8. The display device of claim 1, wherein the first adhesive layer overlaps a side surface of each of the epitaxial sub-units when viewed in plan.

9. The display device of claim 1, wherein the epitaxial sub-units comprise:
   a first epitaxial stack configured to emit a first color light;
   a second epitaxial stack disposed on the first epitaxial stack and configured to emit a second color light having a wavelength band different from the first color light; and a third epitaxial stack disposed on the second epitaxial stack and configured to emit a third color light having a wavelength band different from the first and second color lights.

10. A display device comprising:
a substrate;
a plurality of epitaxial sub-units disposed on the substrate;
a first adhesive layer bonding the epitaxial sub-units to the substrate; and
a line part disposed on the substrate and configured to apply a light emitting signal to the epitaxial sub-units, wherein:
each of the epitaxial sub-units has a surface area less than 10,000 square μm;
the first adhesive layer includes a conductive and non-transparent material;
the substrate includes a non-transparent material; and
the first adhesive layer covers a side surface of the line part.

11. The display device of claim 10, wherein the epitaxial sub-units comprise:
a first epitaxial stack configured to emit a first color light;
a second epitaxial stack disposed on the first epitaxial stack and configured to emit a second color light having a wavelength band different from the first color light; and
a third epitaxial stack disposed on the second epitaxial stack and configured to emit a third color light having a wavelength band different from the first and second color lights.

12. The display device of claim 10, wherein:
the line part includes a plurality of signal lines respectively connected to the epitaxial sub-units; and
at least one of the epitaxial sub-units is interposed between two outermost signal lines when viewed in plan.

13. The display device of claim 10, wherein the first adhesive layer has a varying thickness along a longitudinal direction of the substrate.

14. A display device comprising:
a substrate;
a plurality of epitaxial sub-units disposed on the substrate;
a first adhesive layer bonding the epitaxial sub-units to the substrate; and
a line part disposed on the substrate and configured to apply a light emitting signal to the epitaxial sub-units, wherein:
each of the epitaxial sub-units is configured to emit light having different colors with different intensities;
the first adhesive layer includes a conductive and non-transparent material;
the substrate includes a non-transparent material; and
the first adhesive layer covers a side surface of the line part.

15. The display device of claim 14, wherein the epitaxial sub-units are configured to emit red, green, and blue light, respectively.

16. The display device of claim 14, wherein:
the line part includes a plurality of signal lines respectively connected to the epitaxial sub-units; and
at least one of the epitaxial sub-units is interposed between two outermost signal lines when viewed in plan.

17. The display device of claim 14, wherein the first adhesive layer has a varying thickness along a longitudinal direction of the substrate.

* * * * *